US012228629B2

(12) United States Patent
Dey et al.

(10) Patent No.: US 12,228,629 B2
(45) Date of Patent: Feb. 18, 2025

(54) DEEP LEARNING METHODS FOR NOISE SUPPRESSION IN MEDICAL IMAGING

(71) Applicant: Hyperfine Operations, Inc., Guilford, CT (US)

(72) Inventors: Neel Dey, Brooklyn, NY (US); Jo Schlemper, Long Island City, NY (US); Seyed Sadegh Moshen Salehi, Bloomfield, NJ (US); Michal Sofka, Princeton, NJ (US); Prantik Kundu, Branford, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 424 days.

(21) Appl. No.: 17/496,104

(22) Filed: Oct. 7, 2021

(65) Prior Publication Data

US 2022/0107378 A1   Apr. 7, 2022

Related U.S. Application Data

(60) Provisional application No. 63/155,696, filed on Mar. 2, 2021, provisional application No. 63/088,672, filed on Oct. 7, 2020.

(51) Int. Cl.
*G01R 33/56* (2006.01)
*G06N 3/045* (2023.01)
(Continued)

(52) U.S. Cl.
CPC ............. *G01R 33/56* (2013.01); *G06N 3/045* (2023.01); *G06N 3/08* (2013.01); *G06T 5/70* (2024.01);
(Continued)

(58) Field of Classification Search
None
See application file for complete search history.

(56) References Cited

U.S. PATENT DOCUMENTS 9,625,543 B2   4/2017   Rearick et al.
10,222,434 B2   3/2019   Poole et al.
(Continued)

FOREIGN PATENT DOCUMENTS

WO   WO 2018/210978 A1   11/2018

OTHER PUBLICATIONS

Invitation to Pay Additional Fees for International Application No. PCT/US2021/053918 dated Dec. 17, 2021.
(Continued)

*Primary Examiner* — Leon Viet Q Nguyen
(74) *Attorney, Agent, or Firm* — Foley & Lardner LLP

(57) ABSTRACT

Techniques for denoising a magnetic resonance (MR) image are provided, including: obtaining a noisy MR image; denoising the noisy MR image of the subject using a denoising neural network model, and outputting a denoised MR image. The denoising neural network model is trained by: generating first training data for training a first neural network model to denoise MR images by generating a first plurality of noisy MR images using clean MR data associated with a source domain and first MR noise data associated with the target domain; training the first neural network model using the first training data; generating training data for training the denoising neural network model by applying the first neural network model to a second plurality of noisy MR images and generating a plurality of denoised MR images; and training the denoising neural network model using the training data for training the denoising neural network model.

17 Claims, 33 Drawing Sheets

(51) Int. Cl.
   *G06N 3/08* (2023.01)
   *G06T 5/70* (2024.01)
(52) U.S. Cl.
   CPC .............. *G06T 2207/10088* (2013.01); *G06T 2207/20081* (2013.01); *G06T 2207/20084* (2013.01)

(56) References Cited

U.S. PATENT DOCUMENTS

| | | | | |
|---|---|---|---|---|
| 10,635,943 | B1* | 4/2020 | Lebel | G06V 10/764 |
| 10,726,334 | B1* | 7/2020 | Elnahrawy | G06N 3/088 |
| 2005/0248347 | A1 | 11/2005 | Damadian | |
| 2015/0005618 | A1 | 1/2015 | Dumoulin | |
| 2015/0226817 | A1 | 8/2015 | Pourrahimi | |
| 2017/0213321 | A1 | 7/2017 | Matviychuk et al. | |
| 2019/0156524 | A1* | 5/2019 | Park | G06T 11/003 |
| 2020/0034998 | A1 | 1/2020 | Schlemper et al. | |
| 2020/0058106 | A1 | 2/2020 | Lazarus et al. | |
| 2020/0065940 | A1* | 2/2020 | Tang | G06T 3/40 |
| 2020/0289019 | A1 | 9/2020 | Schlemper et al. | |
| 2020/0294282 | A1 | 9/2020 | Schlemper et al. | |
| 2020/0311878 | A1* | 10/2020 | Matsuura | G06V 10/82 |
| 2020/0355761 | A1 | 11/2020 | McNulty et al. | |
| 2022/0188602 | A1* | 6/2022 | Meyer | G06N 3/088 |
| 2022/0354378 | A1 | 11/2022 | Nacev et al. | |
| 2024/0168105 | A1 | 5/2024 | Inglis et al. | |

OTHER PUBLICATIONS

International Search Report and Written Opinion for International Application No. PCT/US2021/053918 dated Feb. 8, 2022.
Batson et al., Noise2Self: Blind Denoising by Self-Supervision. arXiv preprint arXiv:1901.11365. Jun. 2019. 16 pages.
Dabov et al., Image denoising by sparse 3D transform-domain collaborative filtering. IEEE Transaction on Image Processing. Aug. 2007. 16(8). 16 pages.
Fish et al., Blind deconvolution by means of the Richardson-Lucy algorithm. Josa A. Jan. 1, 1995;12(1):58-65.
Gidel et al., Negative Momentum for Improved Game Dynamics. arXiv preprint arXiv:1807.04740. Aug. 2020. 26 pages.
Gisbert et al., Self-supervised Denoising via Diffeomorphic Template Estimation: Application to Optical Coherence Tomography. arXiv preprint arXiv:2008.08024. Aug. 18, 2020. 11 pages.
Glasser et al., The minimal preprocessing pipelines for the Human Connectome Project. Neuroimage. Oct. 15, 2013;80:105-24.
Goodfellow et al., Generative adversarial nets. Advances in neural information processing systems. 2014. 9 pages.
Gulrajani et al., Improved Training of Wasserstein GANs. arXiv preprint arXiv:1704.00028. Dec. 25, 2017. 20 pages.
Hendriksen et al., Noise2Inverse: Self-supervised deep convolutional denoising for tomography. arXiv preprint arXiv:2001.11801. Sep. 15, 2020. 16 pages.
Henry et al., Field-frequency locked in vivo proton MRS on a whole-body spectrometer. Magnetic Resonance in Medicine: An Official Journal of the International Society for Magnetic Resonance in Medicine. Oct. 1999;42(4):636-42.
Kingma et al., Adam: A method for stochastic optimization. arXiv preprint arXiv:1412.6980. Jan. 30, 2017. 15 pages.
Krizhevsky et al., Learning multiple layers of features from tiny images. MIT. 2009. 60 pages.
Krull et al., Noise2void-learning denoising from single noisy images. Proceedings of the IEEE/CVF Conference on Computer Vision and Pattern Recognition 2019:2129-37.
Laine et al., High-Quality Self-Supervised Deep Image Denoising. arXiv preprint arXiv:1901.10277. Oct. 28, 2019. 16 pages.
LeCun et al., Gradient-based learning applied to document recognition. Proceedings of the IEEE. Nov. 1998;86(11):2278-324.
Lehtinen et al., Noise2Noise: Learning image restoration without clean data. arXiv preprint arXiv:1803.04189. Oct. 29, 2018. 12 pages.
Lustig et al., Compressed Sensing MRI. IEEE Signal Processing Magazine. Mar. 2008;72-82.
Mao et al., Least squares generative adversarial networks. Proceedings of the IEEE international conference on computer vision 2017;2794-2802.
McVeigh et al., Noise and filtration in magnetic resonance imaging. Medical physics. Sep. 1985;12(5):586-91.
Miyato et al., Spectral normalization for generative adversarial networks. arXiv preprint arXiv:1802.05957. Feb. 16, 2018. 26 pages.
Mohan et al., Robust and interpretable blind image denoising via bias-free convolutional neural networks. arXiv preprint arXiv:1906.05478. Feb. 2020. 22 pages.
Moran et al., Noisier2noise: Learning to denoise from unpaired noisy data. Proceedings of the IEEE/CVF Conference on Computer Vision and Pattern Recognition 2020;12064-72.
Pruessmann et al., Advances in sensitivity encoding with arbitrary k-space trajectories. Magnetic Resonance in Medicine: An Official Journal of the International Society for Magnetic Resonance in Medicine. Oct. 2001;46(4):638-51.
Schaefer et al., Diffusion-weighted MR imaging of the brain. Radiology. Nov. 2000;217(2):331-45.
Schlemper et al., A deep cascade of convolutional neural networks for dynamic MR image reconstruction. IEEE transactions on Medical Imaging. Oct. 13, 2017;37(2):491-503.
Schlemper et al., Nonuniform variational network: deep learning for accelerated nonuniform MR image reconstruction. International Conference on Medical Image Computing and Computer-Assisted Intervention Oct. 13, 2019;57-64.
Schonfeld et al., A u-net based discriminator for generative adversarial networks. Proceedings of the IEEE/CVF Conference on Computer Vision and Pattern Recognition 2020;8204-13.
Walsh et al., Adaptive reconstruction of phased array MR imagery. Magnetic Resonance in Medicine: An Official Journal of the International Society for Magnetic Resonance in Medicine. May 2000;43(5):682-90.
Wang et al., Image quality assessment: from error visibility to structural similarity. IEEE transactions on image processing. Apr. 13, 2004;13(4):600-12.
Wu et al., Group normalization. Proceedings of the European conference on computer vision (ECCV) 2018. 17 pages.
Zhang et al., Harmonic unpaired image-to-image translation. arXiv preprint arXiv:1902.09727. Feb. 26, 2019. 19 pages.
Zhang et al., Beyond a gaussian denoiser: Residual learning of deep cnn for image denoising. IEEE transactions on image processing. Feb. 1, 2017;26(7):3142-55.
Zhu et al., Image reconstruction by domain-transform manifold learning. Nature. Mar. 2018;555(7697):487-92.
Zwart et al., Efficient sample density estimation by combining gridding and an optimized kernel. Magnetic resonance in medicine. Mar. 2012;67(3):701-10.
European extended Search Report on EP 21878515.2 DTD Oct. 10, 2024.
Manimala M. V. R. et al.: Sparse MR Image Reconstruction Considering Rician Noise Models : A Cnn Approach 11, Wireless Personal Communications., vol. 116, No. 1, Aug. 11, 2020 (Aug. 11, 2020), pp. 491-511.

* cited by examiner

DEEP LEARNING METHODS FOR NOISE SUPPRESSION IN MEDICAL IMAGING

CROSS-REFERENCE TO RELATED APPLICATIONS

This application claims priority under 35 U.S.C. § 119 to U.S. Provisional Application Ser. No. 63/088,672, filed Oct. 7, 2020, titled "DEEP LEARNING METHODS FOR NOISE SUPPRESSION IN MEDICAL IMAGING," and U.S. Provisional Application Ser. No. 63/155,696, filed Mar. 2, 2021, titled "REALISTIC MRI NOISE REMOVAL WITHOUT GROUND TRUTH USING TWO-STEP SUPERVISED AND UNSUPERVISED LEARNING," each of which is incorporated by reference herein in its entirety.

FIELD

The present disclosure relates generally to machine learning techniques for removing noise from medical images obtained from data collected using an imaging device, for example, a medical imaging device.

BACKGROUND

Images often include noise artefacts due to underlying physical limitations of the imaging device used to obtain the images. Examples of such noise artefacts include noise generated by the imaging hardware (e.g., thermal noise), which may reduce the quality, and therefore the usefulness, of the obtained images. Suppressing such noise artefacts in the images (e.g., denoising the images) may be desirable in various applications, such as medical imaging, for example.

SUMMARY

Some embodiments provide for a method of denoising magnetic resonance (MR) images. The method comprises using at least one computer hardware processor to perform: obtaining a noisy MR image of a subject, the noisy MR image associated with a target domain, denoising the noisy MR image of the subject using a denoising neural network model to obtain a denoised MR image, and outputting the denoised MR image. The denoising neural network model is trained by: generating first training data for training a first neural network model to denoise MR images at least in part by generating a first plurality of noisy MR images using: (1) clean MR data associated with a source domain; and (2) first MR noise data associated with the target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

Some embodiments provide for a magnetic resonance imaging (MRI) system. The MRI system comprises: a magnetics system having a plurality of magnetics components to produce magnetic fields for performing MRI and at least one processor. The at least one processor is configured to perform: obtaining a noisy MR image of a subject, the noisy MR image associated with a target domain, denoising the noisy MR image of the subject using a denoising neural network model to obtain a denoised MR image, and outputting the denoised MR image. The denoising neural network model is trained by: generating first training data for training a first neural network model to denoise MR images at least in part by generating a first plurality of noisy MR images using: (1) clean MR data associated with a source domain; and (2) first MR noise data associated with the target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

Some embodiments provide for at least one non-transitory computer readable storage medium storing processor-executable instructions that, when executed by at least one processor, cause the at least one processor to perform a method of denoising magnetic resonance (MR) images. The method comprises: obtaining a noisy MR image of a subject, the noisy MR image associated with a target domain, denoising the noisy MR image of the subject using a denoising neural network model to obtain a denoised MR image, and outputting the denoised MR image. The denoising neural network model is trained by: generating first training data for training a first neural network model to denoise MR images at least in part by generating a first plurality of noisy MR images using: (1) clean MR data associated with a source domain; and (2) first MR noise data associated with the target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

Some embodiments provide for a method of training a denoising neural network model to denoise an MR image of a subject. The method comprises using at least one computer hardware processor to perform: generating first training data for training a first neural network model to denoise MR images at least in part by generating a first plurality of noisy MR images using: (1) clean MR data associated with a source domain; and (2) first MR noise data associated with a target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

Some embodiments provide for an MRI system, comprising: a magnetics system having a plurality of magnetics components to produce magnetic fields for performing MRI; and at least one processor. The at least one processor is configured to perform: generating first training data for training a first neural network model to denoise MR images at least in part by generating a first plurality of noisy MR images using: (1) clean MR data associated with a source domain; and (2) first MR noise data associated with a target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

Some embodiments provide for at least one non-transitory computer readable storage medium storing processor-executable instructions that, when executed by at least one processor, cause the at least one processor to perform a method of training a denoising neural network model to denoise an MR image of a subject. The method comprises using at least one computer hardware processor to perform: generating first training data for training a first neural network model to denoise MR images at least in part by generating a first plurality of noisy MR images using: (1) clean MR data associated with a source domain; and (2) first MR noise data associated with a target domain; training the first neural network model using the first training data; generating training data for training the denoising neural network model at least in part by applying the first neural network model to a second plurality of noisy MR images and generating a corresponding plurality of denoised MR images; and training the denoising neural network model using the training data for training the denoising neural network model.

In some embodiments, the first training data comprises the first plurality of noisy MR images and a corresponding plurality of clean MR images. Generating the first training data comprises: generating first noisy MR data using the clean MR data associated with the source domain and the first MR noise data associated with the target domain; generating the first plurality of noisy MR images by applying a reconstruction procedure to the first noisy MR data; and generating the plurality of clean MR images by applying the reconstruction procedure to the clean MR data associated with the source domain.

In some embodiments, applying the reconstruction procedure to the first noisy MR data comprises using a machine learning model to generate MR images from the first noisy MR data. In some embodiments, applying the reconstruction procedure to the first noisy MR data comprises using compressed sensing to generate MR images from the first noisy MR data. In some embodiments, applying the reconstruction procedure to the first noisy MR data comprises using at least one linear transformation to generate MR images from the first noisy MR data. The at least one linear transformation comprises: a coil de-correlation transformation; a gridding transformation; and a coil combination transformation.

In some embodiments, the method further comprises generating second training data for training a second neural network model to denoise MR images at least in part by generating a plurality of doubly noisy MR images using: (1) second noisy MR data associated with the target domain; and (2) second MR noise data associated with the target domain; and training the second neural network model using the second training data.

In some embodiments, the second training data comprises the plurality of doubly noisy MR images and the second plurality of noisy MR images. Generating the second training data comprises: generating doubly noisy MR data using the second noisy MR data associated with the target domain and the second MR noise data associated with the target domain; generating the plurality of doubly noisy MR images by applying a reconstruction procedure to the doubly noisy MR data; and generating the second plurality of noisy MR images by applying the reconstruction procedure to the second noisy MR data associated with the target domain.

In some embodiments, generating the training data for training the denoising neural network model further comprises applying the second neural network model to the second plurality of noisy MR images.

In some embodiments, generating the training data for training the denoising neural network model further comprises generating a plurality of augmented denoised MR images by: applying one or more transformations to images of the plurality of denoised MR images to generate a plurality of transformed MR images; and combining the plurality of transformed MR images with the plurality of denoised MR images to generate the plurality of augmented denoised MR images; and generating clean MR data associated with the target domain by applying a nonuniform transformation to images of the plurality of augmented denoised MR images.

In some embodiments, the training data for training the denoising neural network model comprises a plurality of noisy MR training images and a plurality of clean MR training images. Generating the training data for training the denoising neural network model further comprises: generating clean MR training data by combining the clean MR data associated with the source domain with the clean MR data associated with the target domain; generating noisy MR training data using the clean MR training data and third MR noise data associated with the target domain; generating the plurality of noisy MR training images by applying a reconstruction procedure to the noisy MR training data; and generating the plurality of clean MR training images by applying the reconstruction procedure to the clean MR training data associated with the target domain.

In some embodiments, the denoising neural network model comprises a plurality of convolutional layers. In some embodiments, the plurality of convolutional layers comprises two-dimensional convolutional layers. In some embodiments, the plurality of convolutional layers comprises three-dimensional convolutional layers.

In some embodiments, the first MR noise data is generated prior to obtaining the first noisy MR image. In some embodiments, the first MR noise data is generated at least in part by performing empirical measurements of noise in the target domain. In some embodiments, the first MR noise data is generated at least in part by simulating the first MR noise data using at least one noise model associated with the target domain. Simulating the first MR noise data is performed using one or more of a Gaussian distribution, a Poisson distribution, and/or a Student's t-distribution.

In some embodiments, obtaining the noisy MR image of the subject comprises accessing the noisy MR image. In some embodiments, obtaining the noisy MR image of the subject comprises: collecting first noisy MR data by using an MRI system to image the subject; and generating the noisy MR image of the subject using the collected first noisy MR data. In some embodiments, the first noisy MR data was previously collected using the MRI system, and obtaining the noisy MR image of the subject comprises: accessing the first noisy MR data; and generating the noisy MR image using the accessed first noisy MR data.

In some embodiments, the first noisy MR data is collected by the MRI system using a diffusion weighted imaging (DWI) pulse sequence. In some embodiments, the first MR noise data is generated by performing an empirical measurement of noise within the MRI system while the MRI system is operated using the DWI pulse sequence.

In some embodiments, the clean MR data associated with the source domain comprises MR data that is collected using a magnetic resonance imaging (MRI) system having a main magnetic field strength of 0.5 T or greater, the second plurality of noisy MR images is generated using second noisy MR data associated with the target domain, and the second noisy MR data associated with the target domain comprises MR data that is collected using an MRI system having a main magnetic field strength greater than or equal to 20 mT and less than or equal to 0.2 T.

In some embodiments, the clean MR data associated with the source domain comprises MR data that is collected by imaging a first portion of anatomy of the subject, the second plurality of noisy MR images is generated using second noisy MR data associated with the target domain, and the second noisy MR data associated with the target domain comprises MR data that is collected by imaging a second portion of anatomy different than the first portion of anatomy of the subject.

In some embodiments, the clean MR data associated with the source domain comprises MR data that is collected using a first pulse sequence, the second plurality of noisy MR images is generated using second noisy MR data associated with the target domain, and the second noisy MR data associated with the target domain comprises MR data that is collected using a second pulse sequence different than the first pulse sequence.

In some embodiments, the method further comprises training the denoising neural network model by: generating the first training data for training a first neural network model to denoise MR images at least in part by generating the first plurality of noisy MR images using: (1) the clean MR data associated with a source domain; and (2) the first MR noise data associated with a target domain; training the first neural network model using the first training data; generating the training data for training the denoising neural network model at least in part by applying the first neural network model to the second plurality of noisy MR images and generating the corresponding plurality of denoised MR images; and training the denoising neural network model using the training data for training the denoising neural network model.

Some embodiments provide for a method for denoising a medical image of a subject, the medical image generated using data collected by a medical imaging device. The method comprises using at least one computer hardware processor to perform: obtaining the medical image of the subject; combining the medical image of the subject and a noise image to obtain a noise-corrupted medical image of the subject; generating, using the noise-corrupted medical image of the subject and a trained neural network, a denoised medical image corresponding to the noise-corrupted medical image of the subject; and outputting the denoised medical image.

Some embodiments provide for at least one non-transitory computer readable storage medium storing processor-executable instructions that, when executed by at least one processor, cause the at least one processor to perform a method for denoising an image of a subject, the image generated using data collected by the MRI system. The method comprises obtaining the image of the subject; combining the image of the subject and a noise image to obtain a noise-corrupted image of the subject; generating, using the noise-corrupted image of the subject and a trained neural network, a denoised image corresponding to the noise-corrupted image; and outputting the denoised image.

Some embodiments provide for a magnetic resonance imaging (MRI) system. The MRI system comprises a magnetics system having a plurality of magnetics components to produce magnetic fields for performing MRI; and at least one processor configured to perform a method for denoising an image of a subject, the image generated using data collected by the MRI system. The method comprises obtaining the image of the subject; combining the image of the subject and a noise image to obtain a noise-corrupted image of the subject; generating, using the noise-corrupted image of the subject and a trained neural network, a denoised image corresponding to the noise-corrupted image; and outputting the denoised image.

In some embodiments, the trained neural network is trained using training data comprising pairs of images, a first pair of the pairs of images comprising a first image generated using data collected by the medical imaging device and a second image generated by combining the first image and a noise image.

In some embodiments, obtaining the noise image comprises selecting the noise image from a plurality of noise images. In some embodiments, selecting the noise image from the plurality of noise image comprises selecting the noise image at random from the plurality of noise images. In some embodiments, the plurality of noise images is generated prior to obtaining the medical image of the subject.

In some embodiments, the method further comprises generating the noise image at least in part by performing one or more empirical measurements of noise using the medical imaging device and/or at least one medical imaging device of a same type as the medical imaging device. In some embodiments, generating the noise image comprises scaling at least some of the one or more empirical measurements of noise relative to a maximum intensity value of the medical image of the subject. In some embodiments, scaling at least some of the one or more empirical measurements of noise relative to a maximum intensity of the image of the subject comprises scaling the selected one to within a range from 2% to 30% of the maximum intensity value of the medical image of the subject. In some embodiments, scaling at least some of the one or more empirical measurements of noise relative to a maximum intensity of the image of the subject comprises scaling the selected one to 5%, 10%, or 20% of the maximum intensity value of the medical image of the subject.

In some embodiments, the method further comprises generating the noise image by simulating the noise image using at least one noise model associated with the medical imaging device. In some embodiments, simulating the noise image is performed using one or more of a Gaussian distribution, a Poisson distribution, and/or a Student's t-distribution.

In some embodiments, the medical imaging device is one of an ultrasound imaging device, an elastography imaging device, an X-ray imaging device, a functional near-infrared spectroscopy imaging device, an endoscopic imaging device, a positron emission tomography (PET) imaging device, a computed tomography (CT) imaging device, or a single-photon emission computed tomography (SPECT) imaging device.

In some embodiments, the medical imaging device is an MRI system. In some embodiments, the method further comprises generating the noise image using an image reconstruction technique used by the MRI system to generate magnetic resonance (MR) images from MR data acquired by the MRI system in the spatial frequency domain.

In some embodiments, obtaining the medical image of the subject comprises: collecting the data by using the medical imaging device to image the subject; and generating the medical image using the collected data. In some embodiments, the data was previously collected using the medical imaging device, and wherein obtaining the medical image of the subject comprises: accessing the data; and generating the medical image using the accessed data. In some embodiments, obtaining the medical image of the subject comprises accessing the medical image.

In some embodiments, the data is collected by the MRI system using a diffusion weighted imaging (DWI) pulse sequence. In some embodiments, the noise image is generated by performing an empirical measurement of noise within the MRI system using the DWI pulse sequence.

In some embodiments, the trained neural network comprises a plurality of convolutional layers. In some embodiments, the plurality of convolutional layers have a U-net structure.

Some embodiments provide for a method for denoising a medical image of a subject, the medical image generated using data collected by a medical imaging device. The method comprises using at least one computer hardware processor to perform: obtaining the medical image of the subject; generating, using the medical image of the subject and a trained neural network, a denoised medical image corresponding to the medical image of the subject; and outputting the denoised medical image. The trained neural network is trained using training data comprising pairs of images, a first pair of the pairs of images comprising a first image generated using data collected by the medical imaging device and a second image generated by combining the first image and a noise image In some embodiments, obtaining the noise image comprises selecting the noise image from a plurality of noise images. In some embodiments, the method further comprises generating the noise images at least in part by performing one or more empirical measurements of noise using the medical imaging device and/or at least one medical imaging device of a same type as the medical imaging device. In some embodiments, the method further comprises generating the noise images by simulating the noise image using at least one noise model associated with the medical imaging device.

Some embodiments provide for a method for denoising a medical image of a subject, the medical image generated using data collected by a medical imaging device. The method comprises using at least one computer hardware processor to perform: obtaining the medical image of the subject; generating, using the medical image of the subject and a generator neural network, a denoised medical image corresponding to the medical image of the subject, wherein the generator neural network was trained using a discriminator neural network trained to discriminate among images of noise obtained using output of the generator neural network and noise images; and outputting the denoised medical image.

Some embodiments provide for at least one non-transitory computer readable storage medium storing processor-executable instructions that, when executed by at least one processor, cause the at least one processor to perform a method for denoising an image of a subject, the image generated using data collected by a medical imaging device. The method comprises obtaining the image of the subject; generating, using the image of the subject and a generator neural network, a denoised image corresponding to the image of the subject, wherein the generator neural network was trained using a discriminator neural network trained to discriminate among images of noise obtained using output of the generator neural network and noise images; and outputting the denoised image.

Some embodiments provide for an MRI system comprising a magnetics system having a plurality of magnetics components to produce magnetic fields for performing MRI; and at least one processor configured to perform a method for denoising an image of a subject, the image generated using data collected by the MRI system. The method comprises obtaining the image of the subject; generating, using the image of the subject and a generator neural network, a denoised image corresponding to the image of the subject, wherein the generator neural network was trained using a discriminator neural network trained to discriminate among images of noise obtained using output of the generator neural network and noise images; and outputting the denoised image.

In some embodiments, an image of the first noise images is obtained using output of the generator neural network by subtracting a denoised medical image from a corresponding medical image of the subject.

In some embodiments, generating the denoised medical image comprises subtracting a residual image output by the generator neural network from the medical image of the subject.

In some embodiments, the second noise images are generated prior to obtaining the medical image of the subject. In some embodiments, the second noise images are generated without using the generator neural network. In some embodiments, the method further comprises generating the second noise images at least in part by performing one or more empirical measurements of noise using the medical imaging device and/or at least one medical imaging device of a same type as the medical imaging device.

In some embodiments, the method further comprises generating the second noise images by simulating the second noise images using at least one noise model associated with the medical imaging device. In some embodiments, simulating the second noise images is performed using one or more of a Gaussian distribution, a Poisson distribution, and/or a Student's t-distribution.

In some embodiments, the medical imaging device is one of an ultrasound imaging device, an elastography imaging device, an X-ray imaging device, a functional near-infrared spectroscopy imaging device, an endoscopic imaging device, a positron emission tomography (PET) imaging device, a computed tomography (CT) imaging device, or a single-photon emission computed tomography (SPECT) imaging device.

In some embodiments, the medical imaging device is an MRI system.

In some embodiments, generating the second noise images further comprises using an image reconstruction technique used by the MRI system to generate magnetic resonance (MR) images from MR data acquired by the MRI system in the spatial frequency domain.

In some embodiments, the data is collected by the MRI system using a diffusion weighted imaging (DWI) pulse sequence.

In some embodiments, the second noise images are generated by performing an empirical measurement of noise within the MRI system using the DWI pulse sequence.

In some embodiments, obtaining the medical image of the subject comprises: collecting the data by using the medical imaging device to image the subject; and generating the medical image using the collected data.

In some embodiments, the data was previously collected using the medical imaging device, and obtaining the medical image of the subject comprises: accessing the data; and generating the medical image using the accessed data.

In some embodiments, obtaining the medical image of the subject comprises accessing the medical image.

In some embodiments, the generator neural network comprises a plurality of convolutional layers. In some embodiments, the plurality of convolutional layers have a U-net structure.

The foregoing is a non-limiting summary, which is defined by the attached claims.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
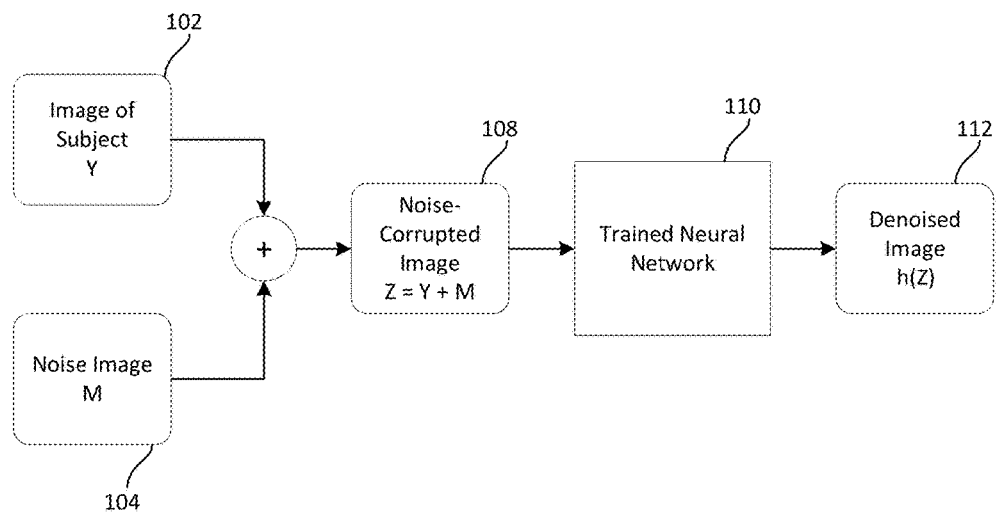
FIG. 1A is a diagram illustrating processing performed by a trained neural network model to denoise a medical image of a subject, in accordance with some embodiments of the technology described herein.

The hardware of a medical imaging device can introduce unwanted noise into the data acquired when capturing a medical image. For example, heat dissipation within the hardware electronics can introduce thermal noise into the data acquired by the medical imaging device. After the data is acquired by the medical imaging device, software generates a medical image using the acquired data. The software may include several processes to render the image (e.g., dewarping, bias correction, etc.) that, though functioning based on an assumption of idealized data (e.g., noiseless data), cause the introduced noise to become correlated noise in the resulting output medical image.

Accordingly, medical images generated from the acquired data can include unwanted correlated noise artefacts. Such introduced noise can reduce the usefulness of the images generated by the medical imaging device (e.g., by obscuring image features, by reducing image sharpness, etc.). In particular, for medical imaging devices such noise may reduce the clinical usefulness of the generated images. For example, in the case of magnetic resonance imaging (MRI) systems, such introduced noise may reduce the signal-to-noise ratio (SNR) of acquired magnetic resonance (MR) data, causing the MR images to be difficult to interpret (e.g., due to a reduced contrast or sharpness in the MR image) by a medical practitioner.

Machine learning has been recognized and developed as a tool for removing such correlated noise from noisy images and has shown improved performance over conventional denoising methods. However, the inventors have appreciated that for medical imaging applications, several limitations of such machine learning techniques exist. These limitations include, for example, a need to produce large sets of training data for supervised machine learning techniques, which is often impractical in the medical imaging context. Additionally, limitations of some conventional machine learning techniques include the introduction of image artefacts where the raw image data includes pixel-dependent noise.

To address shortcomings of conventional supervised machine learning denoising techniques, the inventors have developed multiple machine learning techniques for removing or suppressing noise from medical images. The machine learning techniques developed by the inventors provide an improvement to medical imaging technology because they more effectively remove or suppress noise from medical images. As a result, these techniques produce higher quality, more clinically relevant medical images (e.g., with better tissue contrast, sharper features, and/or limited noise artefacts).

One machine learning technique for denoising medical images developed by the inventors involves introducing additional noise into the medical image obtained from the medical imaging device and thereafter providing the noisy image to a trained neural network for denoising. In some embodiments, the method includes combining a noise image (e.g., a simulated or measured image of noise generated by a medical imaging device) with a medical image of a subject (e.g., a patient) to obtain a noise-corrupted medical image of the subject. The noise-corrupted medical image of the subject so obtained may be thought of as a "doubly noisy" image because it includes noise from the initial acquisition of the image data by the medical imaging device and the added noise from the noise image. Thereafter, a trained neural network may receive the noise-corrupted medical image of the subject as input and generate for output a denoised medical image of the subject corresponding to the noise-corrupted medical image of the subject.

In some embodiments, the trained neural network may be trained using a supervised training method and a training data set including pairs of images. The pairs of images may include a first image generated using data collected by a medical imaging device and a second image generated by combining the first image with a noise image (e.g., a noise-corrupted image). The noise image may be selected (e.g., at random or in any other suitable way) from a set of noise images generated prior to obtaining the medical image of the subject using the medical imaging device. In this way, the trained neural network may be trained to denoise medical images of a subject. In some embodiments, the trained neural network may be a convolutional network and may include a plurality of convolutional layers. In some embodiments, for example, the plurality of convolutional layers may have a U-net structure.

Another machine learning technique developed by the inventors for denoising medical images involves using neural networks trained using an adversarial approach. For example, a generative adversarial network framework may be used to train a neural network for denoising medical images. In some embodiments, a generator neural network may be trained, by using a discriminator neural network, to denoise a noisy medical image of a subject to obtain a denoised medical image corresponding to the medical image of the subject. In some embodiments, the discriminator neural network may be trained to distinguish noise residuals produced by the generator neural network and synthesized or empirically measured noise.

In some embodiments, the generator neural network may be a convolutional neural network including a plurality of convolutional layers. For example, the plurality of convolutional layers may have a U-net structure in some embodiments. In some embodiments, the generator neural network may be trained using a discriminator neural network. The discriminator neural network may be trained to discriminate among images of noise obtained using output of the generator neural network and noise images generated prior to obtaining the medical image of the subject. In some embodiments, the images of noise obtained using output of the generator neural network may be generated by subtracting the denoised medical image from the medical image of the subject (e.g., to create a "noise map"). Alternatively, the images of noise may be directly output by the generator neural network.

In some embodiments, training the neural network (e.g., the trained neural network or the generator neural network) may comprise modifying parameters associated with the layers of the neural network. For example, in some embodiments, training the neural network may include modifying the values of approximately one million parameters associated with the layers of the neural network. In some embodiments, training the neural network may include modifying the values of at least 10,000 parameters, at least 50,000 parameters, at least 100,000 parameters, at least 250,000 parameters, at least 500,000 parameters, at least 1,000,000 parameters, at least 2,000,000 parameters, between 100,000 and 1,000,000 parameters, between 50,000 and 2,000,000 parameters, between 500,000 and 5,000,000 parameters, or any suitable range within these ranges.

In some embodiments, the noise image may be generated by performing one or more empirical measurements of noise using the medical imaging device and/or a medical imaging device of the same type as the medical imaging device used to image the subject. For example, in the case of an MRI system, the noise image may be generated by acquiring MR data using an MRI system of the type used to image the subject and with the same imaging procedure (e.g., using the same pulse sequence as would be used to image the subject, such as a diffusion weighted imaging (DWI) pulse sequence in some embodiments).

Alternatively or additionally, in some embodiments, the noise image may be generated by simulating the noise image. Simulating the noise image may include using at least one noise model associated with the medical imaging device. For example, in the case of an MRI system, simulating the noise image may include using an image reconstruction technique used by the MRI system to generate magnetic resonance (MR) images in the image domain from MR data acquired by the MRI system in the spatial frequency domain. In some embodiments, simulating the noise image may be performed using one or more of a Gaussian distribution, a Poisson distribution, and/or a student-t distribution.

In some embodiments, a plurality of noise images may be generated prior to imaging the subject and generating the noise image may include selecting one of the noise images of the plurality of noise images. The selected noise image may additionally, in some embodiments, be scaled relative to a maximum intensity value of the obtained medical image of the subject prior to being combined with the medical image of the subject or provided to the discriminator neural network. In some embodiments, the selected noise image may be scaled to within a range from 2% to 30% of the maximum intensity value of the medical image of the subject, or to 5%, 10%, or 20%, or any value between these values, of the maximum intensity of the image of the subject.

In some embodiments, obtaining the medical image of the subject includes collecting data by using the medical imaging device to image the subject and generating the medical image using the collected data. In some embodiments, obtaining the medical image of the subject includes accessing data previously collected by using the medical imaging device and generating the medical image using the accessed data. In some embodiments, obtaining the medical image of the subject comprises accessing the medical image.

In some embodiments, the medical image may be a two-dimensional image or a three-dimensional image volume. Alternatively or additionally, the medical image may be a video sequence of two- or three-dimensional images. The machine learning techniques described herein may be configured to denoise individual images of a video sequence or to denoise the video sequence as a whole, in some embodiments.

It should be appreciated that the methods developed by the inventors and described herein may be implemented across a variety of medical imaging devices. For example, in some embodiments, the medical imaging device may be one of an ultrasound imaging device, an elastography imaging device, an X-ray imaging device, a functional near-infrared spectroscopy imaging device, an endoscopic imaging device, a positron emission tomography (PET) imaging device, a computed tomography (CT) imaging device, or a single-photon emission computed tomography (SPECT) imaging device.

In some embodiments, the medical imaging device may be a magnetic resonance imaging (MRI) system. For example, the MRI system may be a low-field MRI system. As used herein, "high-field" refers to MRI systems presently in use in a clinical setting and, more particularly, to MRI systems operating with a main magnetic field (i.e., a B0 field) at or above 0.5 T. As used herein, "mid-field" refers to MRI systems operating with a main magnetic field having a strength between 0.2 T and 0.5 T. By contrast, as used herein "low-field" refers generally to MRI systems operating with a $B_0$ field of less than or equal to 0.2 T. For example, low-field MRI systems as described herein may be operated with a $B_0$ field of less than or equal to 0.2 T and greater than or equal to 20 mT, with a $B_0$ field of less than or equal to 0.2 T and greater than or equal to 50 mT, and/or with a $B_0$ field of less than or equal to 0.1 T and greater than or equal to 50 mT. Within the low-field regime, low-field MRI systems operating with a $B_0$ field of less than 10 mT are referred to herein as "ultra-low field."

In some embodiments, the techniques described herein for denoising MR images may be adapted for application to spatial frequency data collected using a low-field MRI system, including, by way of example and not limitation, any of the low-field MR systems described herein and/or any low-field MR systems described in U.S. Pat. No. 10,222,434, filed on Jan. 24, 2018, titled "Portable Magnetic Resonance Imaging Methods and Apparatus," which is incorporated by reference in its entirety herein.

Following below are more detailed descriptions of various concepts related to, and embodiments of, methods and apparatus for denoising medical images. It should be appreciated that although the techniques described herein may be described in connection with denoising medical images obtained using medical devices, the techniques developed by the inventors and described herein are not so limited and may be applied to other types of images acquired using non-medical imaging devices. It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations explicitly described herein.

Example Denoising: Doubly Noisy Images FIG. 1A is a diagram illustrating processing performed by a trained neural network to denoise a medical image of a subject, in accordance with some embodiments of the technology described herein. As shown in FIG. 1A, trained neural network 110 may be configured to accept as input a noise-corrupted image 108 and to denoise the noise-corrupted image 108. The trained neural network 110 may output a denoised image 112 corresponding to the medical image of the subject 102. Alternatively, in some embodiments, the neural network 110 may output information that may be used to generate denoised image 112 (e.g., the denoised image may be obtained by double the output of the neural network 110 and subtracting the noisy image 108, as described below). In some embodiments, the trained neural network 110 may be trained according to the illustrative process described in connection with FIG. 1B.

In some embodiments, the noise-corrupted image 108 may be generated by combining a medical image of the subject 102 with a noise image 104. The medical image of the subject 102 may be obtained from data collected by a medical imaging device (e.g., an MRI system or any other suitable type of medical imaging device examples of which are described herein). For example, the medical image of the subject 102 may be obtained by collecting data using the medical imaging device (e.g., by imaging a patient) and then generating the medical image of the subject 102 based on the collected data. As another example, obtaining the medical image of the subject 102 may include accessing, from storage, data previously collected by the medical imaging device and generating the medical image of the subject 102 using the accessed data. As yet another example, the medical image of the subject 102 may be generated prior to the processing illustrated in FIG. 1A and accessed from storage for denoising.

In some embodiments, the noise image 104 may be selected from among multiple noise images. The noise image 104 may be selected from among the multiple images at random (e.g., with respect to any suitable distribution) or using any other suitable method, as aspects of the technology described herein are not limited in this respect. In some embodiments, the noise images may be generated prior to obtaining the medical image of the subject 102 using the medical imaging device.

In some embodiments, the noise image 104 may be obtained using empirical measurements of noise within the medical imaging device. For example, the medical imaging device may be used to obtain noise measurements (e.g., without a subject present). Alternatively, a medical imaging device of the same type as the medical imaging device used to acquire image data of the subject may be used to obtain noise measurements (e.g., prior to acquiring the image data of the subject). In some embodiments, the noise measurements may be obtained using the same medical imaging procedure and/or setting(s) of the medical imaging device as used to obtain the medical image of the subject 102. For example, in the context of MRI, if the subject is to be imaged using a diffusion weighted imaging (DWI) pulse sequence, the noise measurements may be obtained using the same DWI pulse sequence. It should be appreciated that another pulse sequence including, but not limited to, a spin echo pulse sequence, a fast spin echo pulse sequence, or a steady-state free precession (SSFP) pulse sequences may be substituted for a DWI pulse sequence to generate the medical image of the subject 102 and/or the noise image 104.

In some embodiments, generating the noise image 104 may include scaling the noise image 104 relative to a maximum intensity value of the medical image of the subject 102. For example, the intensity of the noise image 104 may be scaled relative to the maximum intensity value of the medical image of the subject 102. Such scaling may determine the amount of noise added to the medical image of the subject 102 to form noise-corrupted image 108. For example, the noise image 104 may be scaled to within a range from 2% to 30% of the maximum intensity value of the medical image of the subject 102. In some embodiments, the noise image 104 may be scaled to one of 5%, 10%, 20%, or any value within the above-stated range of the maximum intensity value of the medical image of the subject 102. In some embodiments, the noise image 104 may be scaled to a lesser value for generating a noise-corrupted image for testing than for generating a noise-corrupted image for training. For example, the noise image 104 may be scaled to 5% for testing and 10% for training, in some embodiments.

Additionally or alternatively, in some embodiments, the noise image 104 may be obtained by simulating noise rather than obtaining empirical measurements of noise. For example, the noise image 104 may be simulated using a noise model associated with the medical imaging device. In some embodiments, the noise image 104 may be simulated using a Gaussian distribution, a Poisson distribution, and/or a Student's t-distribution.

In some embodiments, the medical image of the subject 102 may not be combined with a noise image 104 during use of the trained neural network 110 to denoise the medical image of the subject 102. Rather, the medical image of the subject 102 may be provided directly as input to the trained neural network 110 for denoising. In such embodiments, trained neural network 110 may be trained in the same manner as described in connection with the example of FIG. 1B. For example, in such embodiments a method may be provided for denoising a medical image of a subject, the medical image generated using data collected by a medical imaging device. The method may comprise using at least one computer hardware processor to perform obtaining the medical image of the subject; generating, using the medical image of the subject and a trained neural network, a denoised medical image corresponding to the medical image of the subject, and outputting the denoised medical image. In such embodiments, the trained neural network may be trained using training data comprising pairs of images, a first pair of the pairs of images comprising a first image generated using data collected by the medical imaging device and a second image generated by combining the first image and a noise image.

In some embodiments, trained neural network 110 may be implemented as a deep neural network. For example, trained neural network 110 may comprise a plurality of layers. In some embodiments, the layers may include one or more convolutional layers, one or more pooling layers (e.g., average pooling, max pooling), one or more upsampling layers, one or more downsampling layers, one or more fully connected layers, and/or any other suitable types of layers. In some embodiments, the plurality of layers may be arranged in one of a U-net structure or a Res-net structure.

For example, the trained neural network 110 may comprise the following layers arranged in a U-net structure:

1. Input, n features
2. Encoding Convolution, kernel size = 3 × 3, 48 features, ReLU
3. Encoding Convolution, kernel size = 3 × 3, 48 features, ReLU
4. Pooling 1, kernel size = 2 × 2, 48 features, ReLU
5. Encoding Convolution, kernel size = 3 × 3, 48 features, ReLU
6. Pooling 2, kernel size = 2 × 2, 48 features, ReLU
7. Encoding Convolution, kernel size = 3 × 3, 48 features, ReLU
8. Pooling 3, kernel size = 2 × 2, 48 features, ReLU
9. Encoding Convolution, kernel size = 3 × 3, 48 features, ReLU
10. Pooling 4, kernel size = 2 × 2, 48 features, ReLU
11. Encoding Convolution, kernel size = 3 × 3, 48 features, ReLU
12. Pooling 5, kernel size = 2 × 2, 48 features, ReLU
13. Encoding Convolution, kernel size = 3 × 3, 48 features, ReLU
14. Upsampling, kernel size = 2 × 2, 48 features, ReLU
15. Concatenation (of output of Pooling 4), 96 features, ReLU
16. Decoding Convolution, kernel size = 3 × 3, 96 features, ReLU
17. Decoding Convolution, kernel size = 3 × 3, 96 features, ReLU
18. Upsampling, kernel size = 2 × 2, 96 features, ReLU
19. Concatenation (of output of Pooling 3), 96 features, ReLU
20. Decoding Convolution, kernel size = 3 × 3, 96 features, ReLU
21. Decoding Convolution, kernel size = 3 × 3, 96 features, ReLU
22. Upsampling, kernel size = 2 × 2, 96 features, ReLU
23. Concatenation (of output of Pooling 2), 144 features, ReLU
24. Decoding Convolution, kernel size = 3 × 3, 96 features, ReLU
25. Decoding Convolution, kernel size = 3 × 3, 96 features, ReLU
26. Upsampling, kernel size = 2 × 2, 96 features, ReLU
27. Concatenation (of output of Pooling 1), 144 features, ReLU
28. Decoding Convolution, kernel size = 3 × 3, 96 features, ReLU
29. Decoding Convolution, kernel size = 3 × 3, 96 features, ReLU
30. Upsampling, kernel size = 2 × 2, 96 features, ReLU
31. Concatenation (of input), 96 +n features, ReLU
32. Decoding Convolution, kernel size = 3 × 3, 64 features, ReLU
33. Decoding Convolution, kernel size = 3 × 3, 32 features, ReLU
34. Decoding Convolution, kernel size = 3 × 3, m features, Linear Activation In some embodiments, the convolutional layers may use a bias value of zero (e.g., the layers may be bias-free). Alternatively, in some embodiments the convolutional layers may include a non-zero bias. Additional details of the above-described U-net structure are described in "Robust and Interpretable Blind Image Denoising via Bias-Free Convolutional Neural Networks," published in connection with the International Conference on Learning Representations, April 2020, by S. Mohan, Z. Kadkhodaie, E. P. Simoncelli, and C. Fernandez-Granda.

In some embodiments, an additional deconvolution step may be applied to the output of the trained neural network 110. The deconvolution may reduce blurring introduced by the trained neural network 110 in the final denoised image. For example, in some embodiments, iterations of Richardson-Lucy deconvolution may be performed on the output of the trained neural network 110. In some embodiments the Richardson-Lucy deconvolution may have a 5×5 Gaussian kernel with $\sigma=0.5$.

Figure 1B:
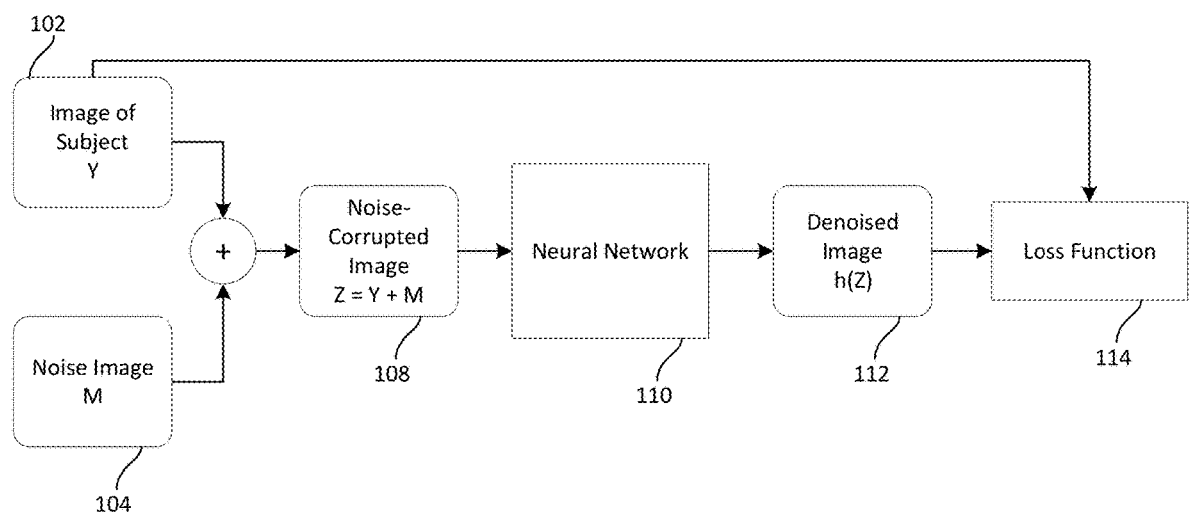
FIG. 1B is a diagram illustrating a process of training a neural network to perform denoising of a medical image of a subject, in accordance with some embodiments of the technology described herein.

In some embodiments, the trained neural network 110 may be trained according to the process illustrated by FIG. 1B. The example of FIG. 1B shows a process of training neural network 110 to perform denoising of a medical image of a subject. In some embodiments, the neural network 110 may be provided with one or more noise-corrupted images 108 generated by combining a medical image of the subject 102 with a noise image 104.

The inventors recognized that, given X as the denoised image 112 and Y=X+N as the medical image of the subject 102, the neural network 110 may be trained to perform denoising of the image Y by augmenting Y with additional noise M to generate a noise-corrupted image 108 as represented by Z=Y+M (where $P(M \leq u) = P(N \leq u)$ for all $0 \leq u \leq 1$).

The additional noise M may be obtained from empirical measurements or a noise simulator, as described herein.

In some embodiments, the neural network 110 may be trained such that: h: Z→Y in accordance with a loss function 114. The loss function 114 may be determined based on the denoised image 112 and the medical image of the subject 102. The loss function 114 may then be used to train the neural network 110 (e.g., to update the weights of the neural network 110). In some embodiments, the loss function 114 may be a mean-squared error (MSE) loss function calculated by taking the mean of squared differences between the denoised image 112 and the medical image of the subject 102. In some embodiments, other loss functions including, for example, binary cross entropy (BCE), categorical cross entropy (CC), or sparse categorical cross entropy (SCC) loss functions may be implemented.

Under an MSE approach, the neural network 110 may be configured to minimize an empirical approximation of the expectation value $\mathbb{E}[Y/Z]$, where $\mathbb{E}[Y/Z]$ is given by:

$$\mathbb{E}[Y/Z] = \mathbb{E}[X/Z] + \mathbb{E}[N/Z]$$

This expression may be rearranged such that:

$$2\mathbb{E}[Y/Z] = 2(\mathbb{E}[X/Z] + \mathbb{E}[N/Z])$$

$$2\mathbb{E}[Y/Z] = \mathbb{E}[X/Z] + (\mathbb{E}[X/Z] + 2\mathbb{E}[N/Z])$$

$$2\mathbb{E}[Y/Z] = \mathbb{E}[X/Z] + (\mathbb{E}[X/Z] + \mathbb{E}[N/Z] + \mathbb{E}[M/Z])$$

$$2\mathbb{E}[Y/Z] = \mathbb{E}[X/Z] + \mathbb{E}[(X+M+N)/Z]$$

$$2\mathbb{E}[Y/Z] = \mathbb{E}[X/Z] + \mathbb{E}[Z/Z]$$

$$2\mathbb{E}[Y/Z] = \mathbb{E}[X/Z] + Z$$

$$\mathbb{E}[X/Z] = 2\mathbb{E}[Y/Z] - Z$$

That is, the minimizer of $\mathbb{E}[X/Z]$ (e.g., the denoised image 112 given the noise-corrupted image 108) is equal to the minimizer of $2\mathbb{E}[Y/Z]-Z$. Thus, the denoised image 112 may be estimated by doubling the output (h(z)) of the neural network 110 and subtracting the noise-corrupted image 108.

In some embodiments, the neural network 110 may be trained (e.g., as shown in FIG. 1B) and tested (e.g., as shown in FIG. 1A) using noise-corrupted images 108 for both processes. The inventors have recognized that the noise-corrupted images 108 used for testing may be provided with a lower variance (e.g., lower noise intensity) than those used for training to improve the denoising performance of the trained neural network 110. For an arbitrary noise simulator, corrections to the neural network 110 may be of the form:

$$ph(z)-qz \text{ where } z \sim Z; p > 2q; p,q \in \mathbb{R}^+$$

where p and q are weights of the neural network 110. The above expression allows p and q to be tuned heuristically. If training data including noiseless medical images 102 is available, the values of p and q may be further improved.

The neural network 110 may be trained using any suitable training algorithm. For example, the neural network 110 may be trained using stochastic gradient descent and backpropagation. In some embodiments, the neural network 110 may be trained using an Adam optimizer. For example, the neural network 110 may be trained with a batch size of 32 using the Adam optimizer with a learning rate of 0.0003 and $\beta_1=0.9$ and $\beta_2=0.999$. In some embodiments, the neural network 110 may be trained for approximately 150,000 iterations. In some embodiments, training the neural network 110 may include training at least 10,000 parameters, at least 50,000 parameters, at least 100,000 parameters, at least 250,000 parameters, at least 500,000 parameters, at least 1,000,000 parameters, at least 2,000,000 parameters, between 100,000 and 1,000,000 parameters, between 50,000 and 2,000,000 parameters, between 500,000 and 5,000,000 parameters, or any suitable range within these ranges.

Figure 2:
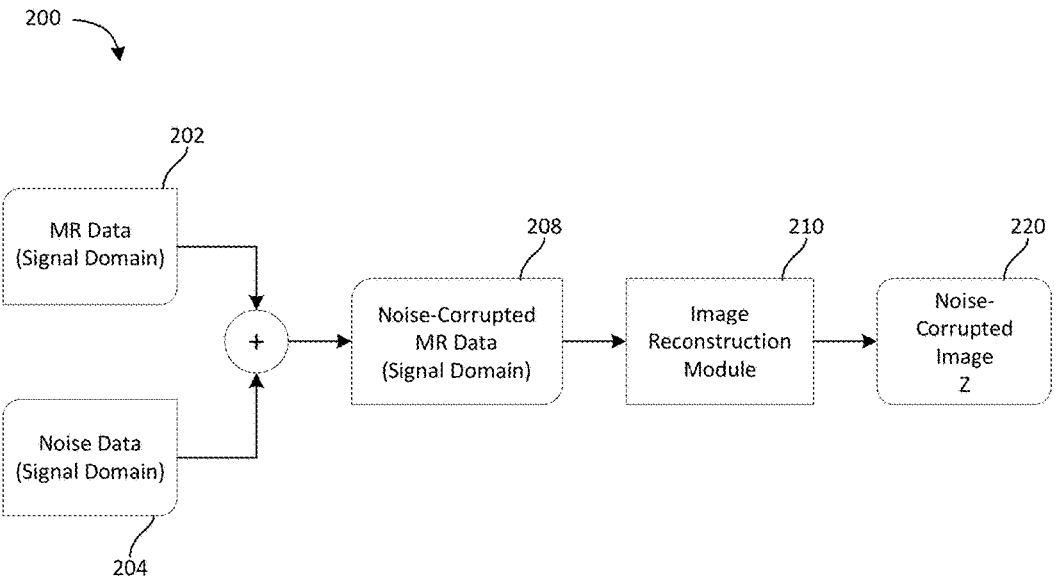
FIG. 2 is a diagram illustrating a process of generating a noise image using an image reconstruction module, in accordance with some embodiments of the technology described herein.

FIG. 2 is a diagram illustrating a process of generating a noise-corrupted image using an image reconstruction module associated with an MRI system, in accordance with some embodiments of the technology described herein. While the processes of exemplary FIGS. 1A and 1B describe generating the noise-corrupted image 108 directly in the image domain, the example of FIG. 2 illustrates a process of generating noise-corrupted image data in a domain (e.g., the signal domain, for the example of MRI) other than the image domain and thereafter reconstructing the noise-corrupted image 220. Such a process may be applied generally for medical imaging devices that capture data in a domain other than the image domain. The process described by the example of FIG. 2 may be used to generate images for training or testing the neural network 110.

In some embodiments, the MR data 202 may be generated empirically (e.g., using an MRI system to collect the MR data 202). For example, the MR data 202 may be obtained by an MRI system (e.g., the MRI system used to acquire the MR data of the subject or the same type of MRI system as the MRI system used to acquire the MR data of the subject). In such embodiments, the MR data 202 may be obtained using the same pulse sequence as is used to acquire the MR data of the subject. For example, if the subject is to be imaged using a DWI pulse sequence, the MR data 202 used to generate the noise-corrupted image 220 may also have been acquired using the same DWI pulse sequence. It may be appreciated that another pulse sequence including but not limited to a spin echo pulse sequence, a fast spin echo pulse sequence, and/or an SSFP pulse sequence may be substituted for a DWI pulse sequence to generate the noise-corrupted image 220.

In some embodiments, the MR data 202 may be generated by synthesizing MR data 202. For example, the MR data 202 may be synthesized based on one or more characteristics of the MRI system including the number of radio frequency (RF) coils of the MRI system, the geometry and sensitivity of the RF coils of the MRI system, the field strength of the MRI system, and RF interference that the MRI system might be expected to experience during operation, among other factors. Further description of synthesizing MR data for training machine learning models is provided in US Patent Publication no. 2020-0294282, filed Mar. 12, 2020, and titled "Deep Learning Techniques for Alignment of Magnetic Resonance Images," which is incorporated by reference herein in its entirety.

In some embodiments, the noise data 204 may be generated in a similar manner as noise image 104 of FIGS. 1A and 1B. For example, the noise data 204 may be generated based on empirical measurements (e.g., by using the MRI system to measure noise within the MRI system without a patient present). Alternatively or additionally, the noise data 204 may be generated by simulating noise, as described herein.

The MR data 202 and the noise data 204 may be combined to form noise-corrupted MR data 208, in some embodiments. Combining the MR data 202 and the noise data 204 may include adding the MR data 202 and the noise data 204 in the signal domain. Alternatively or additionally, combining the MR data 202 and the noise data 204 may comprise any suitable steps (e.g., multiplying, convolving, or otherwise transforming).

In some embodiments, the noise data 204 may be scaled to the MR data 202 prior to being combined. For example, the intensity of noise data 204 may be scaled relative to a maximum intensity value of the MR data 202. Such scaling may determine the amount of noise added to the MR data 202 and ultimately the amount of noise present in noise-corrupted image 220. For example, the noise data 204 may be scaled to be within a range from 2% to 30% of the maximum intensity value of the MR data 202. In some embodiments, the noise data 204 may be scaled to one of 5%, 10%, 20%, or any value within the above-stated range of the maximum intensity value of the MR data 202. In some embodiments, the noise data 204 may be scaled to a lesser value for generating a noise-corrupted image for testing than for generating a noise-corrupted image for training. For example, the noise data 204 may be scaled to 5% for testing and 10% for training, in some embodiments.

In some embodiments, the noise-corrupted MR data 208 may then be provided to an image reconstruction module 210. The image reconstruction module 210, described in more detail in connection with FIG. 3 below, may be configured to reconstruct the noise-corrupted MR data 208 into a noise-corrupted image 220. That is, the image reconstruction module 210 may be configured to transform the noise-corrupted MR data 208 in the signal domain into the noise-corrupted image 220 into the image domain. The noise-corrupted image 220 may then be provided to, for example, neural network 110 for denoising.

Figure 3:
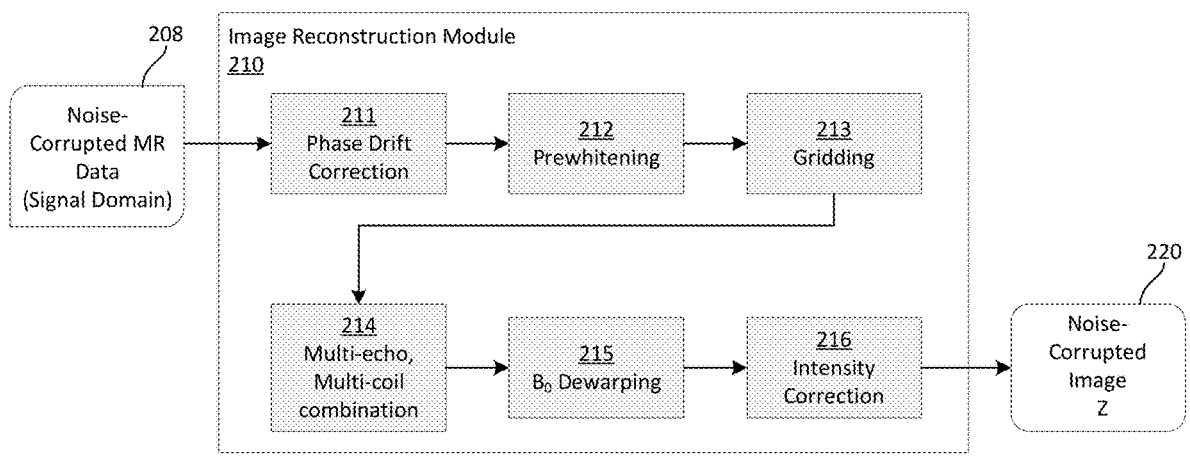
FIG. 3 is a diagram of an illustrative pipeline of an example image reconstruction module, in accordance with some embodiments of the technology described herein.

In some embodiments, the image reconstruction module 210 may be a pipeline comprising multiple processing steps, the pipeline configured to transform, correct, and/or reconstruct input MR data from the signal domain to the image domain. FIG. 3 shows a block diagram of an illustrative image reconstruction module 210 including such a pipeline, in accordance with some embodiments of the technology described herein.

In some embodiments, the image reconstruction module 210 may include a number of modules, one or more of these modules comprising a neural network configured to perform a specific task in the image reconstruction pipeline. For example, the modules may include, but are not limited to, a phase drift correction module 211, a prewhitening module 212, a gridding module 213, a multi-echo, multi-coil combination module 214, a $B_0$ dewarping module 215, and/or an intensity correction module 216. Additional description of image reconstruction module 210 is provided in US Patent Publication no. 2020-0294282, filed Mar. 12, 2020, and titled "Deep Learning Techniques for Alignment of Magnetic Resonance Images," which is incorporated by reference herein in its entirety.

In some embodiments, the phase drift correction module 211 and the prewhitening module 212 may perform processing prior to reconstructing the MR image. For example, the phase drift correction module 211 and the prewhitening module 212 may be configured to process the MR data in the signal domain. The phase drift correction module 211 may be configured to perform correction of phase drift due to thermal drifts over time (e.g., causing a shifting of the $B_0$ field), and the prewhitening module 212 may be configured to correct for differences in noise levels between individual RF coils of the MRI system. In some embodiments, the phase drift correction module 211 and the prewhitening module 212 may each comprise trained neural networks that were jointly trained.

In some embodiments, the gridding module 213 may be configured to perform the reconstruction of the MR images using a linear method of gridding. It may be appreciated that other methods of image reconstruction may be implemented instead of or in addition to gridding module 213. For example, principle component analysis (PCA), sensitivity encoding (SENSE), generalized autocalibrating partial parallel acquisition (GRAPPA), or compressed sensing (CS) may be implemented instead of or in addition to gridding module 213. Alternatively or additionally, deep learning methods may be implemented to perform image reconstruction.

In some embodiments, additional processing may be performed after image reconstruction. Such post-reconstruction processing may include the multi-echo, multi-coil combination module 214, the $B_0$ dewarping module 215, and/or the intensity correction module 216. In some embodiments, the multi-echo, multi-coil combination module 214 may be configured to combine multiple MR images generated based on data acquired from multiple RF coils of the MRI system or to combine multiple MR images generated based on multiple acquisitions of MR data acquired by the same RF coil. Additionally, in some embodiments, the $B_0$ dewarping module 215 may be configured to remove warping artefacts (e.g., as resulting from DWI pulse sequences). In some embodiments, the intensity correction module 216 may be configured to perform intensity correction between MR images generated by the gridding module 213. In some embodiments, the post-reconstruction modules may include one or more neural networks configured to perform post-reconstruction processing of the MR images.

Figures 4A, 4B:
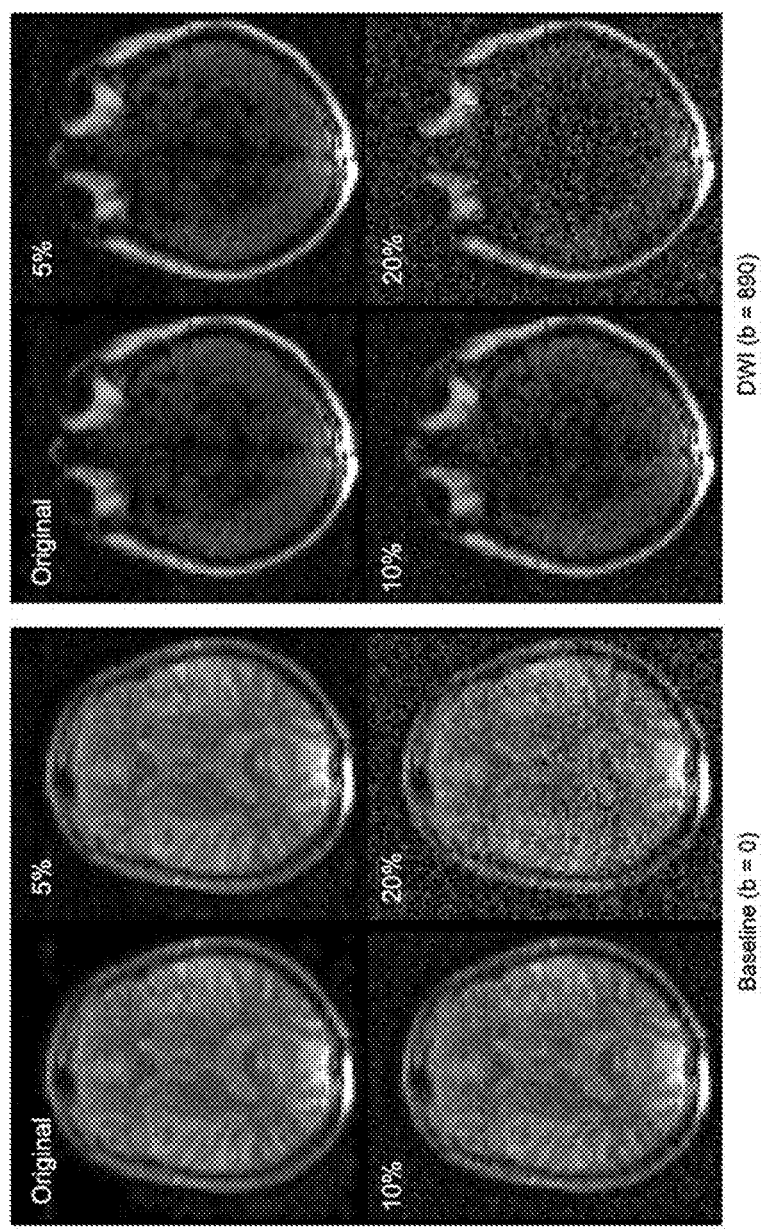
FIGS. 4A and 4B show examples of magnetic resonance (MR) images of a subject's brain obtained using a diffusion-weighted imaging (DWI) pulse sequence and including different levels of generated noise, in accordance with some embodiments of the technology described herein.

FIGS. 4A and 4B show examples of MR images of a subject's brain obtained using a DWI pulse sequence and including different levels of noise-corruption, in accordance with some embodiments of the technology described herein. The MR images of FIG. 4A were acquired using a DWI pulse sequence with no diffusion weighting (e.g., b=0), and the MR images of FIG. 4B were acquired using a DWI pulse sequence having a diffusion weighting value of b=890. The levels of noise-corruption were scaled to 5%, 10%, and 20% of the maximum value of intensity of the original MR images, respectively.

Figure 5:
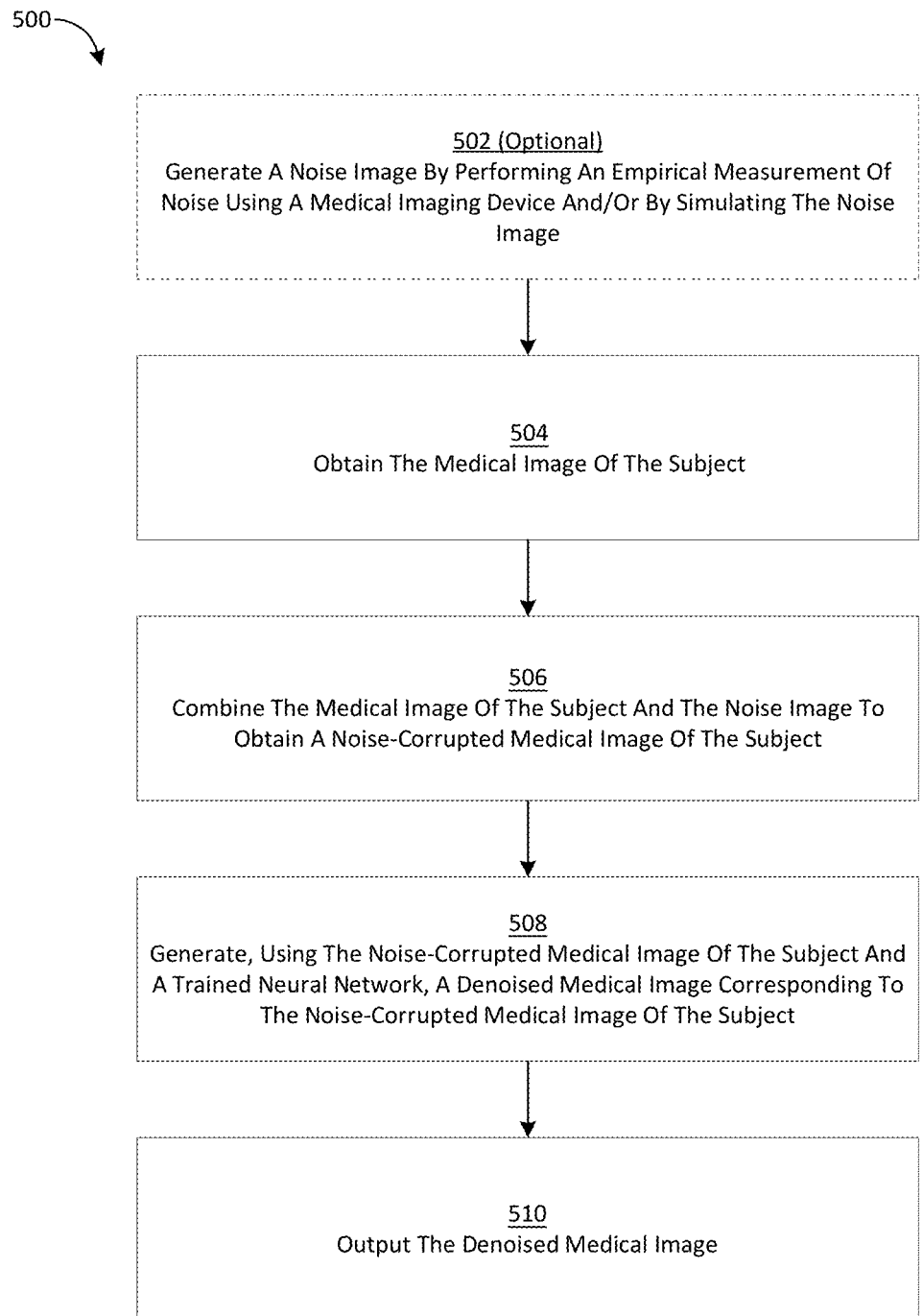
FIG. 5 is a flowchart of an illustrative process 500 for generating a denoised medical image of a subject using a trained neural network, in accordance with some embodiments of the technology described herein.

Turning to FIG. 5, additional aspects of denoising a medical image using a trained neural network are described. An illustrative process 500 for generating a denoised medical image of a subject using a trained neural network, in accordance with some embodiments of the technology described herein is described in connection with FIG. 5.

Process 500 may be executed using any suitable computing device. For example, in some embodiments, the process 500 may be performed by a computing device co-located (e.g., in the same room) as the medical imaging device. As another example, in some embodiments, the process 500 may be performed by one or more processors located remotely from the medical imaging device (e.g., as part of a cloud computing environment).

Process 500 may begin optionally at act 502, where a noise image may be generated by performing an empirical measurement of noise using a medical imaging device and/or by simulating the noise image as described in connection with noise image 104 of FIG. 1A. In some embodiments, the noise image may be obtained (e.g., by measurement or simulation) prior to obtaining the medical image of the subject using the medical imaging device, and the noise image may thereafter be accessed (e.g., from computer storage) prior to denoising the medical image of the subject.

After act 502, process 500 may proceed to act 504, where a medical image of the subject may be obtained. The medical image of the subject may be obtained from a medical imaging device (e.g., any medical imaging device as described herein). For example, the medical image of the subject may be obtained by collecting data using the medical imaging device (e.g., by imaging a patient) and then generating the medical image of the subject based on the collected data. Alternatively, obtaining the medical image of the subject may include accessing from computer storage data collected by the medical imaging device and generating the medical image of the subject using the accessed data, or the medical image of the subject may be generated prior to the start of process 500 and accessed from computer storage.

After act 504, process 500 may proceed to act 506, where the medical image of the subject and the noise image may be combined to obtain a noise-corrupted medical image of the subject, in some embodiments. For example, the noise image may be added to the medical image of the subject to obtain the noise-corrupted medical image of the subject. Alternatively or additionally, the noise image may be combined in any other suitable manner (e.g., via multiplication, convolution, or another transformation) with the medical image of the subject to obtain the noise-corrupted medical image of the subject.

After act 506, process 500 may proceed to act 508, where a denoised medical image corresponding to the noise-corrupted medical image of the subject may be generated using the noise-corrupted medical image of the subject and a trained neural network. The trained neural network may comprise a plurality of layers (e.g., convolutional layers, in some embodiments). In some embodiments, the plurality of layers may have a U-net structure. The trained neural network may be trained, for example, as described in connection with FIG. 1B herein.

In some embodiments, generating the denoised medical image using the trained neural network may comprise the trained neural network generating the denoised medical image directly. Alternatively, in some embodiments, the trained neural network may generate denoising information that may be used to generate the denoised medical image. For example, the denoising information may indicate which noise is to be removed from the noise-corrupted medical image such that generating the denoised medical image may be performed by subtracting the denoising information from the noise-corrupted medical image.

After act 508, process 500 may proceed to act 510, where the denoised medical image may be output. The denoised medical image may be output using any suitable method. For example, the denoised medical image may be output by being saved for subsequent access, transmitted to a recipient over a network, and/or displayed to a user of the medical imaging device.

Figure 6:
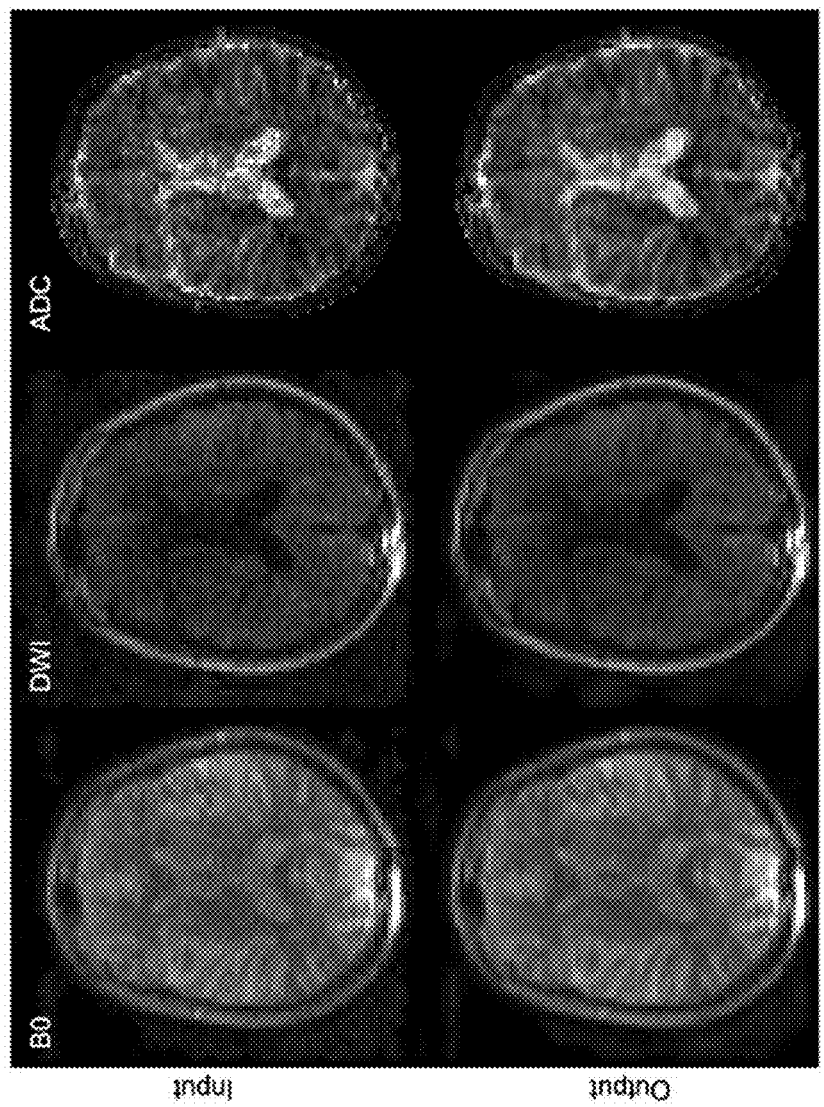
FIG. 6 shows example MR images of a subject's brain before and after being denoised by a trained neural network, in accordance with some embodiments of the technology described herein.

FIG. 6 shows examples of MR images of a subject's brain before (top) and after (bottom) being denoised by a trained neural network, in accordance with some embodiments of the technology described herein. The MR images were acquired, from left to right, using a a DWI pulse sequence with no diffusion weighting (e.g., b=0), a DWI pulse sequence with a diffusion weighting value of b=890, and by generating an apparent diffusion coefficients (ADC) map, as described in the article "Diffusion-weighted MR imaging of the brain," Radiology 2000; 217:331-345 by Schaefer P W, Grant P E, and Gonzalez R G, which is incorporated by reference herein in its entirety.

Figure 7A:
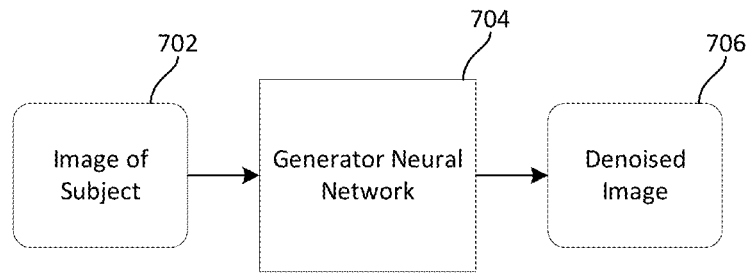
FIG. 7A is a diagram illustrating processing performed by a generator neural network model to denoise a medical image of a subject, in accordance with some embodiments of the technology described herein.

Turning to FIG. 7A, another machine learning technique developed by the inventors for denoising medical images involves using an adversarial approach. FIG. 7A shows a diagram illustrating processing performed by a generator neural network 704 to denoise a medical image of a subject 702, in accordance with some embodiments of the technology described herein.

In some embodiments, the medical image of the subject 702 may be provided to the generator neural network 704 configured to denoise the medical image of the subject 702. The medical image of the subject 702 may be obtained from a medical imaging device (e.g., any medical imaging device as described herein). For example, the medical image of the subject 702 may be obtained by collecting data using the medical imaging device (e.g., by imaging a patient) and then generating the medical image of the subject 702 based on the collected data. Alternatively, obtaining the medical image of the subject 702 may include accessing from storage data collected by the medical imaging device and generating the medical image of the subject 702 using the accessed data, or the medical image of the subject 702 may be generated prior to the processing illustrated in FIG. 7A and accessed from storage for denoising.

In some embodiments, the generator neural network 704 may be implemented as a deep neural network. For example, generator neural network 704 may comprise a plurality of layers. In some embodiments, the generator neural network 704 may be a convolutional neural network and the plurality of layers may comprise convolutional layers. The plurality of layers may be arranged in one of a U-net structure or a Res-net structure. In some embodiments, the generator neural network 704 may have the same architecture as trained neural network 110 described in connection with FIGS. 1A and 1B herein.

In some embodiments, the denoised medical image 706 may be generated based on output of the generator neural network 704. The denoised medical image 706 may be generated directly by the generator neural network 704 (e.g., the generator neural network 704 outputs the denoised medical image 706, or the generator neural network 704 may be configured to output denoising information that may be used to generate the denoised medical image 706. For example, the denoising information may be subtracted from the medical image of the subject 702 to generate the denoised medical image 706.

Figure 7B:
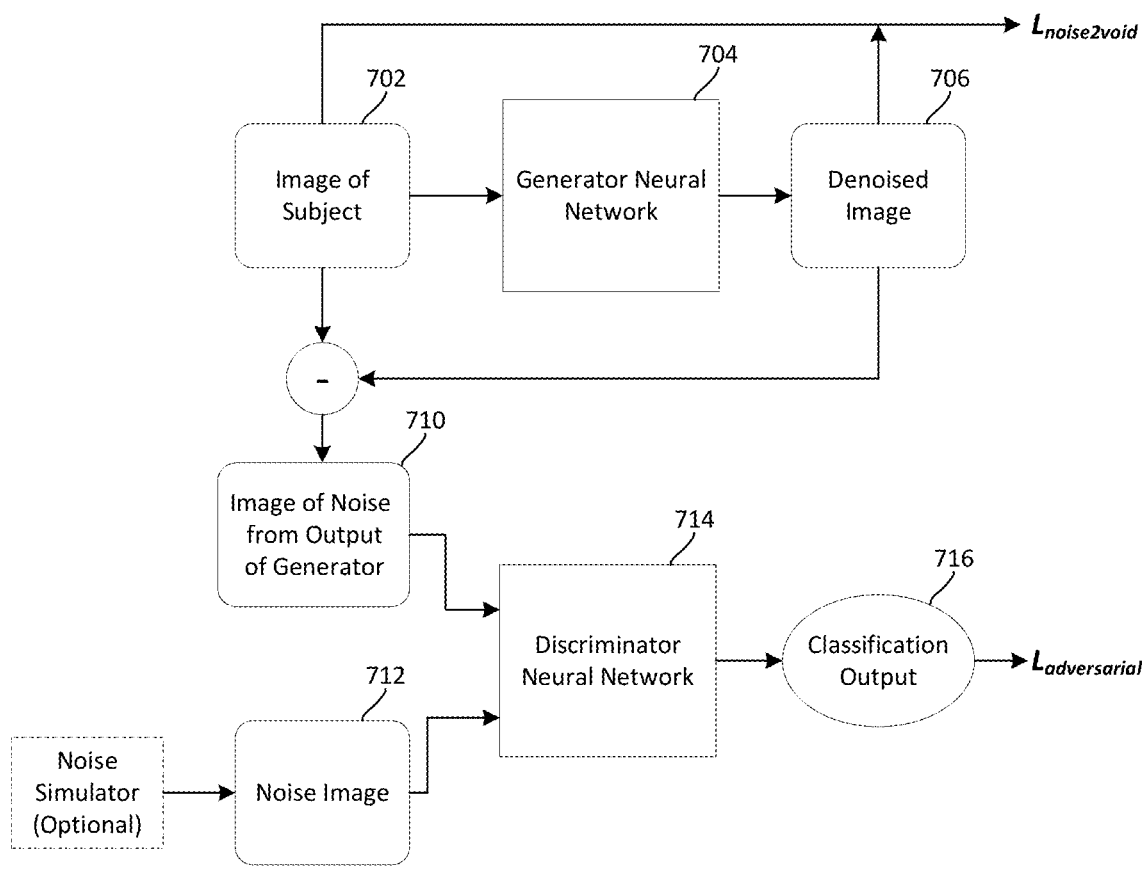
FIG. 7B is a diagram illustrating a process of training a generator neural network to perform denoising of a medical image of a subject using a discriminator neural network, in accordance with some embodiments of the technology described herein.

In some embodiments, the generator neural network 704 may be trained using a discriminator neural network 714, as shown in FIG. 7B and in accordance with some embodiments of the technology described herein. The discriminator neural network 714 may be trained to discriminate among images of noise 710 obtained using output of the generator neural network 704 and noise images 712 generated prior to obtaining the medical image of the subject 702. The images of noise 710 may be obtained, for example, by subtracting the denoised medical image 706 generated from output of the generator neural network 704 from the medical image of the subject 702. Alternatively, the generator neural network 704 may output the images of noise 710 directly.

In some embodiments, the discriminator neural network 714 may compare an image of noise 710 that was generated from an output of the generator neural network 704 with a noise image 712. The noise image 712 may be generated in the same manner as noise image 104 as described in connection with FIGS. 1A and 1B. For example, noise image 712 may be generated based on empirical measurements of noise and/or simulations of noise.

The minmax objective function of the adversarial training approach including the generator neural network 704, G, and the discriminator neural network 714, D, may be written as $$\min_G \max_D = \mathbb{E}_{\hat{x} \sim P_{real\ residuals}}[\log(D(\hat{x}))] + \mathbb{E}_{z \sim P_{noisy\ images}}[\log(1 - D(\overline{G(z)}))] +$$
$$\lambda \mathbb{E}_{z \sim P_{noisy\ images}}[\|\mathcal{W}_\mathcal{J} * (z - G(\mathcal{W}_\mathcal{J} * s(z) + \mathcal{W}_{\mathcal{J}c} * z))\|_2^2]$$

where $\hat{x}$ is a real residual sample, z is a real image of noise, G(z) is the denoised image, $\overline{G(z)}$=z–G(z) is a generated residual sample, $\mathcal{W}_\mathcal{J}$ is the $\mathcal{J}$-invariant mask, $\mathcal{W}_{\mathcal{J}c}$=1–$\mathcal{W}_\mathcal{J}$ is the complement of the $\mathcal{J}$-invariant mask, * is element-wise multiplication, and s(z) replaces masked values in z with local averages. Accordingly, the generator neural network 704 and the discriminator network 714 compete by updating their weight matrices through stochastic gradient descent until they reach a Stackelberg equilibrium.

In some embodiments, the discriminator neural network 714 may be implemented as a deep learning model. The discriminator neural network 714 may comprise a plurality of layers; the layers may be convolutional layers, in some embodiments. The layers may be arranged according to a U-net structure. In some embodiments, the discriminator neural network 714 may comprise the following layers:

1. RGB image, $x \in \mathbb{R}^{256 \times 256 \times 3}$
2. ResBlock down, 8 → 16
3. ResBlock down, 16 → 32
4. Optional Non-Local Block(64×64)
5. ResBlock down, 32 → 64
6. ResBlock down, 64 → 64
7. ResBlock down, 64 → 128, ReLU, Global sum pooling, linear → 1

8. ResBlock up, 128 → 64
9. ResBlock up, 128 → 64
10. ResBlock up, 128 → 32
11. ResBlock up, 64 → 16
12. ResBlock up, 32 → 8
13. ResBlock up, 16 → 8
14. ResBlock up, 8 → 1
15. Sigmoid Additional details of the above-described discriminator neural network are described in "A U-Net Based Discriminator for Generative Adversarial Networks," published in connection with the Conference on Computer Vision and Pattern Recognition, June 2020, by E. Schönfeld, B. Schiele, and A. Khoreva.

In some embodiments, the discriminator neural network 714 may, based on the received image of noise 710 and the noise image 712, generate a classification output 716. The classification output 716 may describe a level of similarity between the image of noise 710 and the noise image 712, thereby reflecting whether the generator neural network 704 accurately denoised the medical image of the subject 702. The classification output 716 may be used to generate a loss function, $L_{adversarial}$. The loss function may be used to change parameters of the generator neural network 704 (e.g., weight values or other parameters). In some embodiments, the loss function $L_{adversarial}$ may comprise a Jensen-Shannon divergence (JSD) loss function, an MSE loss function, or any other suitable loss function. Additionally, in some embodiments a loss function $L_{noise2void}$ may be generated based on the denoised image 706 and the medical image of the subject 702 (e.g., similar to the loss function 114 described in connection with FIG. 1B). In this manner, the generator neural network 704 may be trained both using adversarial and self-feedback.

In some embodiments, the generator neural network 704 may be trained using the Adam optimizer. Both the generator neural network 704 and the discriminator neural network 714 may be use a two-time-scale update rule (TTUR) with a learning rate of the generator neural network 704 set to 0.0001 and a learning rate of the discriminator neural network 714 set to 0.0003. In some embodiments, no momentum terms may be used, and the values of $\beta_1$ and $\beta_2$ may be set to 0.0 and 0.9, respectively. In some embodiments, training the generator neural network 704 and/or the discriminator neural network 714 may include training at least 10,000 parameters, at least 50,000 parameters, at least 100,000 parameters, at least 250,000 parameters, at least 500,000 parameters, at least 1,000,000 parameters, at least 2,000,000 parameters, between 100,000 and 1,000,000 parameters, between 50,000 and 2,000,000 parameters, between 500,000 and 5,000,000 parameters, or any suitable range within these ranges.

Figure 8:
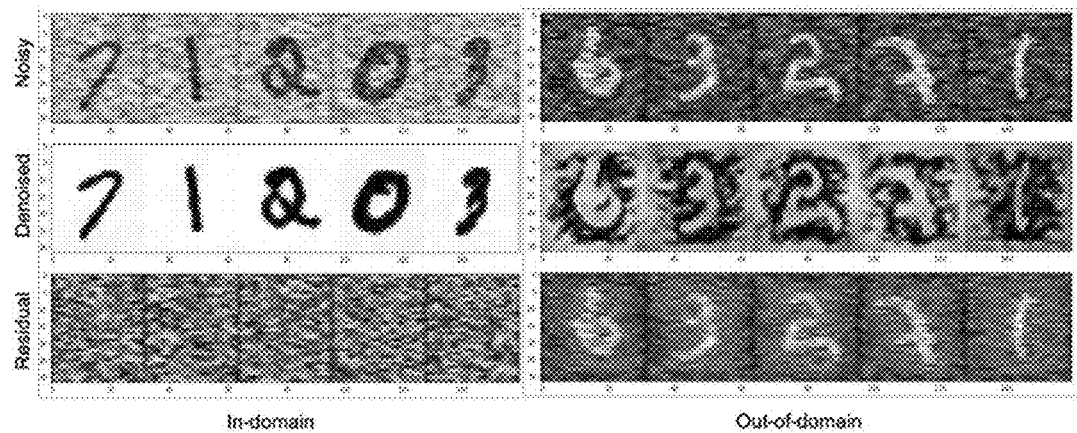
FIG. 8 shows example noisy images and corresponding denoised images of a conventional neural network.
Figure 9:
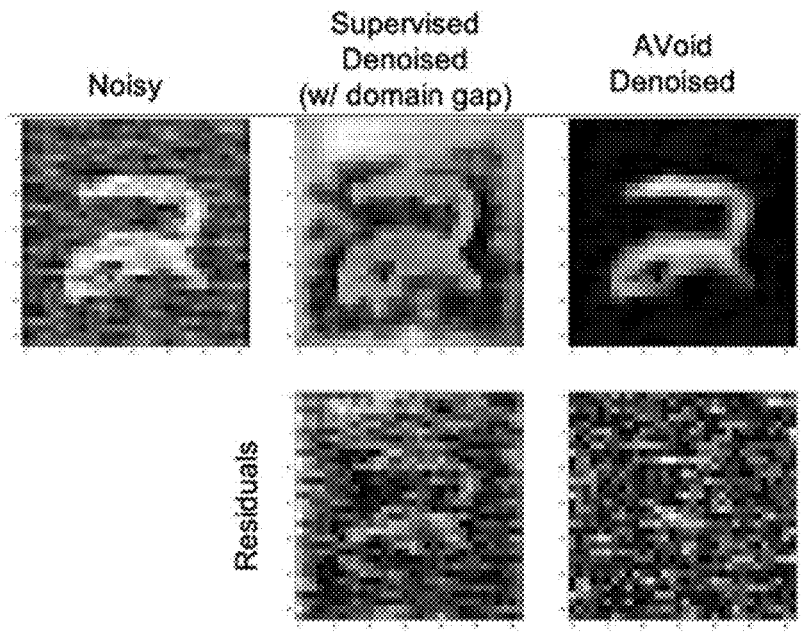
FIG. 9 shows a comparison of denoised images when denoised by a conventional neural network and a generator neural network trained using a discriminator neural network, in accordance with some embodiments described herein.

FIG. 8 shows examples of noisy images from MNIST (top) and corresponding denoised images (middle) generated by a conventional neural network. The conventional neural network was trained using the in-domain (left) images and shows poor performance on out-of-domain, intensity-inverted images (right). In contrast, FIG. 9 shows a comparison of denoising performance on a noise-corrupted image from MNIST (left) when denoised by a conventional neural network trained on out-of-domain images (middle) and a generator neural network (right; e.g., as described in connection with FIGS. 7A and 7B) trained using a discriminator neural network, in accordance with some embodiments described herein. The denoised image generated by the generator neural network shows comparatively superior performance to the conventional neural network.

Figure 10:
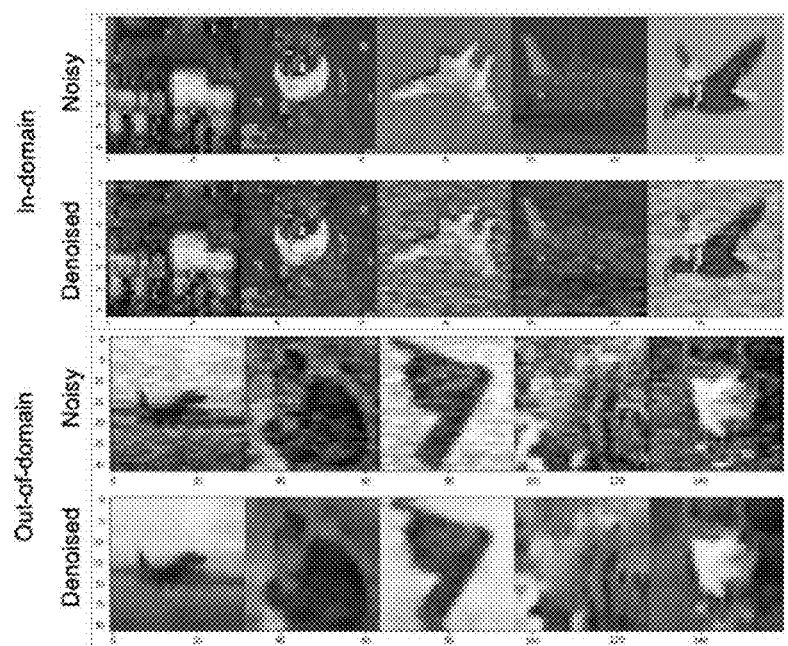
FIG. 10 shows examples of noisy in-domain and out-of-domain images before and after being denoised by a conventional neural network.
Figure 11:
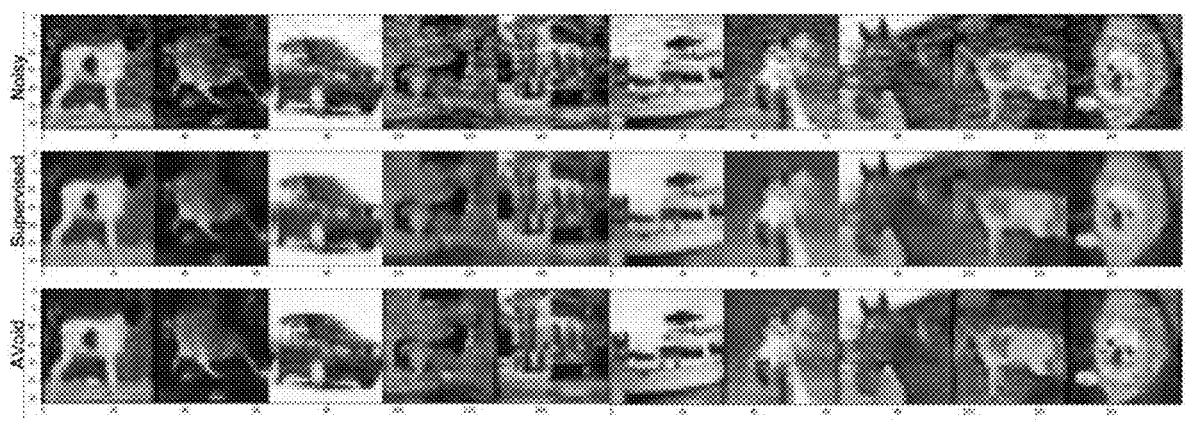
FIG. 11 shows examples of noisy images after being denoised by a conventional neural network and after being denoised by a generator neural network trained using a discriminator neural network, in accordance with some embodiments described herein.

FIG. 10 shows examples of noisy in-domain, hue, saturation, value (HSV) images (top) and out-of-domain, red, green, blue (RGB) images (bottom) from CIFAR-10 before and after being denoised by a conventional neural network. The out-of-domain images suffer from additional blurriness and contrast artefacts. In contrast, FIG. 11 shows examples of noisy images from CIFAR-10 (top) after being denoised by a conventional neural network (middle) and after being denoised by a generator neural network (bottom) trained using a discriminator neural network, in accordance with some embodiments described herein. The lower denoised images denoised using an adversarial approach exhibit sharper contrast and more natural colors than the denoised images denoised using a conventional neural network.

Figure 12:
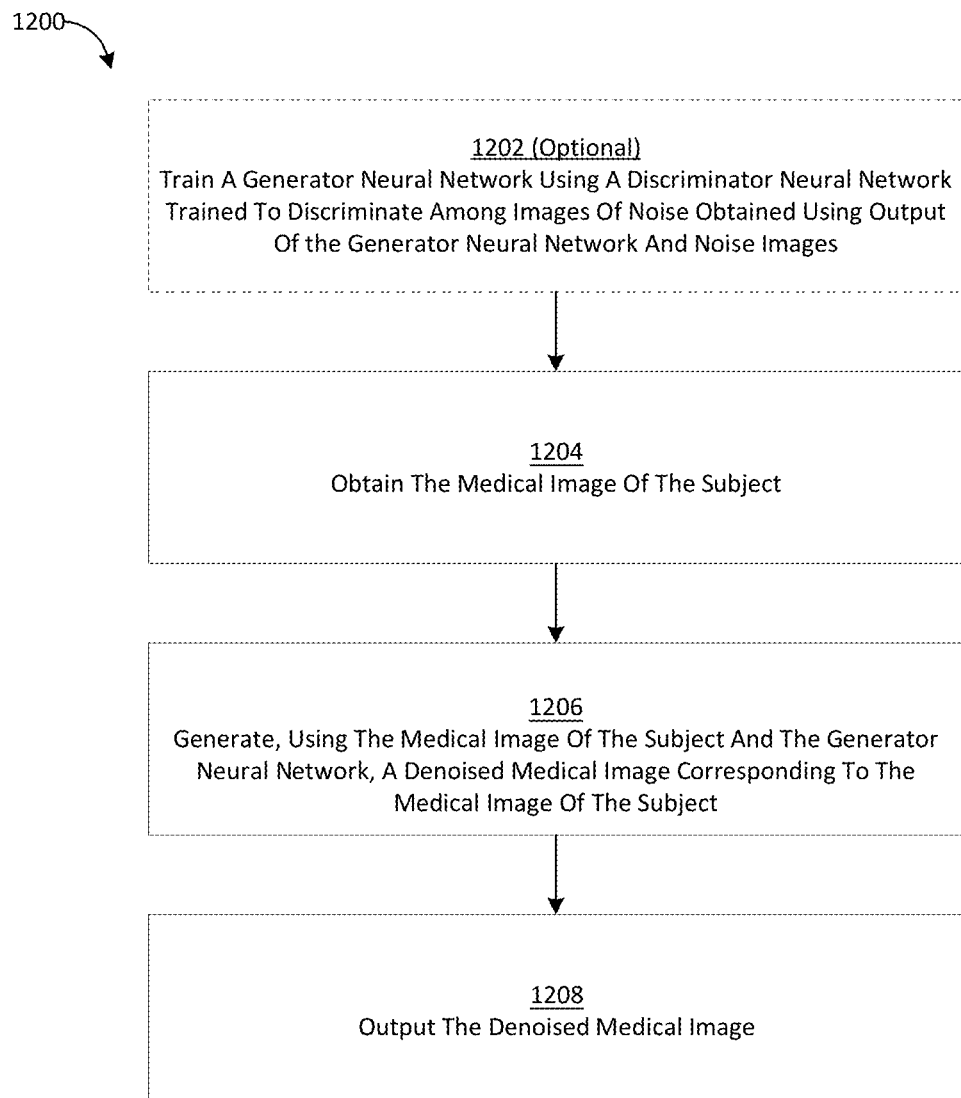
FIG. 12 is a flowchart of an illustrative process 1200 for generating a denoised medical image of a subject using a generator neural network, in accordance with some embodiments of the technology described herein.

FIG. 12 is a flowchart of an illustrative process 1200 for generating a denoised medical image of a subject using a generator neural network, in accordance with some embodiments of the technology described herein. Process 1200 may be executed using any suitable computing device. For example, in some embodiments, the process 1200 may be performed by a computing device co-located (e.g., in the same room) as the medical imaging device. As another example, in some embodiments, the process 1200 may be performed by one or more processors located remotely from the medical imaging device (e.g., as part of a cloud computing environment).

In some embodiments, process 1200 may begin optionally at act 1202, where a generator neural network may be trained using a discriminator neural network. A medical image of a subject may be provided to the generator neural network, and a denoised image and an image of noise may be generated based on output of the generator neural network. For example, the image of noise may be generated by subtracting the denoised image from the medical image of the subject, or the generator neural network may output the image of noise directly.

In some embodiments, the discriminator neural network may be trained to discriminate between the image of noise obtained based on output of the generator neural network and a noise image. The noise image may be generated in the same manner as noise image 104 as described in connection with FIGS. 1A and 1B. For example, the noise image may be generated based on empirical measurements of noise and/or simulations of noise.

In some embodiments, the discriminator neural network may compare the image of noise and the noise image and output classification information indicating a level of similarity between the two images. The classification information (e.g., a classification value) may be used to generate a loss function configured to be used to provide feedback to the generator neural network.

After act 1202, process 1200 may proceed to act 1204, where the medical image of the subject may be obtained. The medical image of the subject may be obtained from a medical imaging device (e.g., any medical imaging device as described herein). For example, the medical image of the subject may be obtained by collecting data using the medical imaging device (e.g., by imaging a patient) and then generating the medical image of the subject based on the collected data. Alternatively, obtaining the medical image of the subject may include accessing from computer storage data collected by the medical imaging device and generating the medical image of the subject using the accessed data, or the medical image of the subject may be generated prior to the start of process 1200 and accessed from computer storage.

After act 1204, process 1200 may proceed to act 1206, where, using the medical image of the subject and the generator neural network, a denoised medical image corresponding to the medical image of the subject may be generated. In some embodiments, generating the denoised medical image using the generator neural network may comprise the generator neural network generating the denoised medical image directly. Alternatively, in some embodiments, the generator neural network may generate denoising information that may be used to generate the denoised medical image. For example, the denoising information may indicate the noise that is to be removed from the noise-corrupted medical image such that generating the denoised medical image may be performed by subtracting the denoising information from the noise-corrupted medical image.

After act 1206, process 1200 may proceed to act 1208, where the denoised medical image may be output. The denoised medical image may be output using any suitable method. For example, the denoised medical image may be output by being saved for subsequent access, transmitted to a recipient over a network, and/or displayed to a user of the medical imaging device.

Figure 13:
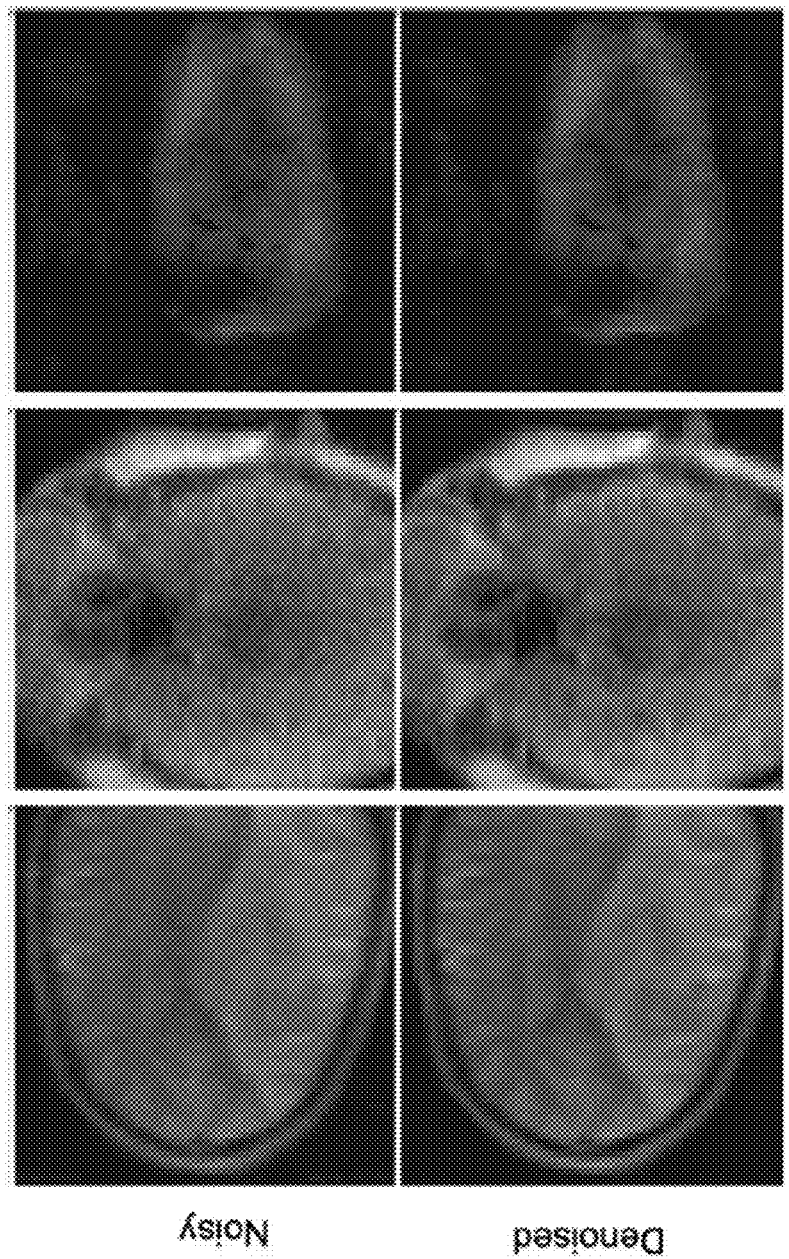
FIG. 13 shows examples of MR images of a subject's brain before and after being denoised by a generator neural network, in accordance with some embodiments of the technology described herein.

FIG. 13 shows examples of MR images of a subject's brain before (top) and after (bottom) being denoised by a generator neural network, in accordance with some embodiments of the technology described herein. The MR images were acquired using diffusion imaging MRI techniques, and the denoised images show clearly boundaries between tissue structures within the subject's brain.

Example MRI Systems

Some embodiments of the technology described herein may be implemented using portable low-field MRI systems, aspects of which are described below with reference to FIGS. 14, 15A-B, and 16A-B. Some aspects of such portable low-field MRI systems are further described in U.S. Pat. No. 10,222,434, filed on Jan. 24, 2018, titled "Portable Magnetic Resonance Imaging Methods and Apparatus," which is incorporated by reference in its entirety herein.

Figure 14:
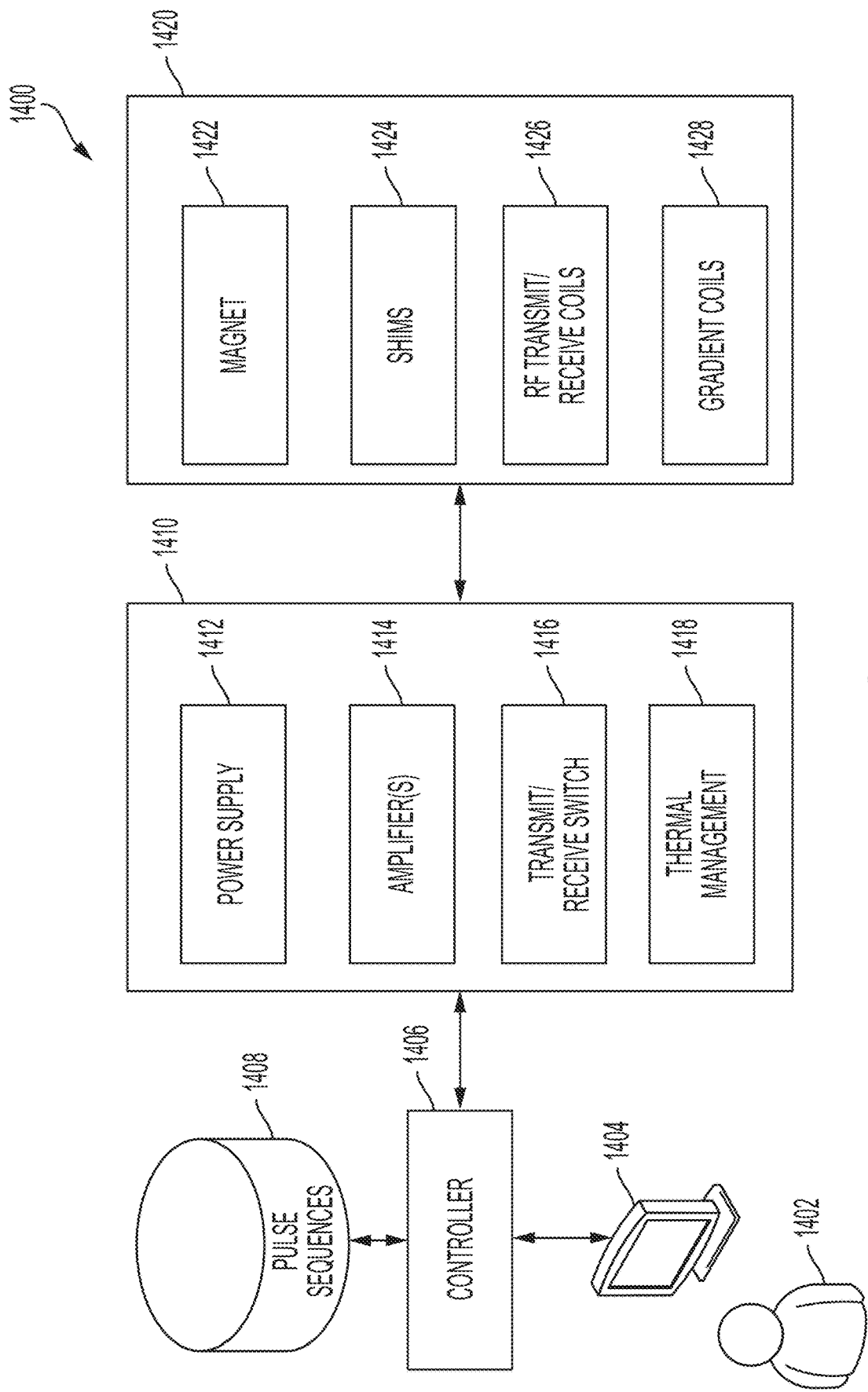
FIG. 14 is a schematic illustration of a low-field MRI system, in accordance with some embodiments of the technology described herein.

FIG. 14 is a block diagram of example components of an MRI system 1400. In the illustrative example of FIG. 14, MRI system 1400 comprises workstation 1404, controller 1406, pulse sequences store 1408, power management system 1410, and magnetic components 1420. It should be appreciated that system 1400 is illustrative and that an MRI system may have one or more other components of any suitable type in addition to or instead of the components illustrated in FIG. 14.

As illustrated in FIG. 14, magnetic components 1420 comprise $B_0$ magnet 1422, shims 1424, RF transmit and receive coils 1426, and gradient coils 1428. $B_0$ magnet 1422 may be used to generate, at least in part, the main magnetic field $B_0$. $B_0$ magnet 1422 may be any suitable type of magnet that can generate a main magnetic field, and may include one or more $B_0$ coils, correction coils, pole pieces, etc. In some embodiments, $B_0$ magnet 1422 may be a permanent magnet. For example, in some embodiments, $B_0$ magnet 1422 may comprise multiple permanent magnet pieces organized in a bi-planar arrangement of concentric permanent magnet rings as described herein including with reference to FIG. 23. In some embodiments, $B_0$ magnet 1422 may be an electromagnet. In some embodiments, $B_0$ magnet 1422 may be a hybrid magnet comprising one or more permanent magnets and one or more electromagnets.

In some embodiments, shims 1424 may be used to contribute magnetic field(s) to improve the homogeneity of the $B_0$ field generated by magnet 1422. In some embodiments, shims 1424 may be permanent magnet shims. In some embodiments, shims 1424 may be electromagnetic and may comprise one or more shim coils configured to generate a shimming magnetic field. In some embodiments, gradient coils 1428 may be arranged to provide gradient fields and, for example, may be arranged to generate gradients in the magnetic field in three substantially orthogonal directions (X, Y, Z) to localize where MR signals are induced. In some embodiments, one or more magnetics components 1420 (e.g., shims 1424 and/or gradient coils 1428) may be fabricated using the laminate techniques.

In some embodiments, RF transmit and receive coils 1426 may comprise one or multiple transmit coils that may be used to generate RF pulses to induce a magnetic field Bi. The transmit/receive coil(s) may be configured to generate any suitable type of RF pulses configured to excite an MR response in a subject and detect the resulting MR signals emitted. RF transmit and receive coils 1426 may include one or multiple transmit coils and one or multiple receive coils. The configuration of the transmit/receive coils varies with implementation and may include a single coil for both transmitting and receiving, separate coils for transmitting and receiving, multiple coils for transmitting and/or receiving, or any combination to achieve single channel or parallel MRI systems. In some embodiments, RF transmit and receive coils 1426 include multiple RF coils, which allow the MRI system 1400 to concurrently receive MR signals on multiple channels.

Power management system 1410 includes electronics to provide operating power to one or more components of the low-field MRI system 1400. For example, power management system 1410 may include one or more power supplies, gradient power amplifiers, transmit coil amplifiers, and/or any other suitable power electronics needed to provide suitable operating power to energize and operate components of the low-field MRI system 1400.

As illustrated in FIG. 14, power management system 1410 comprises power supply 1412, amplifier(s) 1414, transmit/receive switch 1416, and thermal management components 1418. Power supply 1412 includes electronics to provide operating power to magnetic components 1420 of the low-field MRI system 1400. For example, in some embodiments, power supply 1412 may include electronics to provide operating power to one or more $B_0$ coils (e.g., $B_0$ magnet 1422 when it is an electromagnet) to produce the main magnetic field for the low-field MRI system, one or more shims 1424, and/or one or more gradient coils 1628. In some embodiments, power supply 1412 may be a unipolar, continuous wave (CW) power supply. Transmit/receive switch 1416 may be used to select whether RF transmit coils or RF receive coils are being operated.

In some embodiments, amplifier(s) 1414 may include one or more RF receive (Rx) pre-amplifiers that amplify MR signals detected by RF receive coil(s) (e.g., coils 1424), RF transmit (Tx) amplifier(s) configured to provide power to RF transmit coil(s) (e.g., coils 1426), gradient power amplifier(s) configured to provide power to gradient coil(s) (e.g., gradient coils 1428), and/or shim amplifier(s) configured to provide power to shim coil(s) (e.g., shims 1424 in embodiments where shims 1424 include one or more shim coils).

In some embodiments, thermal management components 1418 provide cooling for components of low-field MRI system 1400 and may be configured to do so by facilitating the transfer of thermal energy generated by one or more components of the low-field MRI system 1400 away from those components. Thermal management components 1418 may include components to perform water-based or air-based cooling, which may be integrated with or arranged in close proximity to MRI components that generate heat including, but not limited to, $B_0$ coils, gradient coils, shim coils, and/or transmit/receive coils.

As illustrated in FIG. 14, low-field MRI system 1400 includes controller 1406 (also referred to as a console) having control electronics to send instructions to and receive information from power management system 1410. Controller 1406 may be configured to implement one or more pulse sequences, which are used to determine the instructions sent to power management system 1410 to operate the magnetic components 1420 according to a desired sequence. For example, controller 1406 may be configured to control the power management system 1410 to operate the magnetic components 1420 in accordance with a balanced steady-state free precession (bSSFP) pulse sequence, a low-field gradient echo pulse sequence, a low-field spin echo pulse sequence, a low-field inversion recovery pulse sequence, arterial spin labeling, diffusion weighted imaging (DWI), and/or any other suitable pulse sequence.

In some embodiments, controller 1406 may be configured to implement a pulse sequence by obtaining information about the pulse sequence from pulse sequences repository 1408, which stores information for each of one or more pulse sequences. Information stored by pulse sequences repository 1408 for a particular pulse sequence may be any suitable information that allows controller 1406 to implement the particular pulse sequence. For example, information stored in pulse sequences repository 1408 for a pulse sequence may include one or more parameters for operating magnetics components 1420 in accordance with the pulse sequence (e.g., parameters for operating the RF transmit and receive coils 1426, parameters for operating gradient coils 1428, etc.), one or more parameters for operating power management system 1410 in accordance with the pulse sequence, one or more programs comprising instructions that, when executed by controller 1406, cause controller 1406 to control system 1400 to operate in accordance with the pulse sequence, and/or any other suitable information. Information stored in pulse sequences repository 1408 may be stored on one or more non-transitory storage media.

As illustrated in FIG. 14, in some embodiments, controller 1406 may interact with computing device 1404 programmed to process received MR data (which, in some embodiments, may be spatial frequency domain MR data). For example, computing device 1404 may process received MR data to generate one or more MR images using any suitable image reconstruction process(es) including any of the techniques described herein. Additionally, computing device 1404 may process the one or more generated MR images to generate one or more denoised MR images. For example, computing device 1404 may perform any of the processes described herein with reference to FIGS. 1A-1B, 5, 7A-7B, and 12. Controller 1406 may provide information about one or more pulse sequences to computing device 1404 for the processing of data by the computing device. For example, controller 1406 may provide information about one or more pulse sequences to computing device 1404 and the computing device may perform denoising of MR images based, at least in part, on the provided information.

In some embodiments, computing device 1404 may be any electronic device(s) configured to process acquired MR data and generate image(s) of the subject being imaged. However, the inventors have appreciated that it would be advantageous for a portable MRI system to have sufficient onboard computing capability to perform neural network computations to generate MR images from input spatial frequency data because in many settings (e.g., hospitals), there is limited network bandwidth available for offloading spatial frequency MR data from the MRI machine for processing elsewhere (e.g., in the cloud). Accordingly, in some environments where the MRI system 1400 may be deployed, the inventors have recognized that it is advantageous for the MRI system to include hardware specialized for neural network calculations to perform some of the processes described herein.

Accordingly, in some embodiments, computing device 1404 may include one or multiple graphics processing units (GPU) configured to perform neural network calculations that are to be performed when the neural network models described herein (e.g., trained neural network 110, generator neural network 704, discriminator neural network 714, and/or any other neural networks). In some such embodiments, computing device 1404 may be onboard (e.g., within the housing of the low-field MRI system 1400). Accordingly, in some embodiments, MRI system 1400 may include one or more GPU(s) and the GPU(s) may be onboard, for example by being housed within the same housing as one or more components of the power components 1410. Additionally or alternatively, computing device 1404 may include one or more hardware processors, FPGAs, and/or ASICs configured to process acquire MR data and generate image(s) of the subject being imaged.

In some embodiments, a user 1402 may interact with computing device 1404 to control aspects of the low-field MR system 1400 (e.g., program the system 1400 to operate in accordance with a particular pulse sequence, adjust one or more parameters of the system 1400, etc.) and/or view images obtained by the low-field MR system 1400.

Figure 15B:
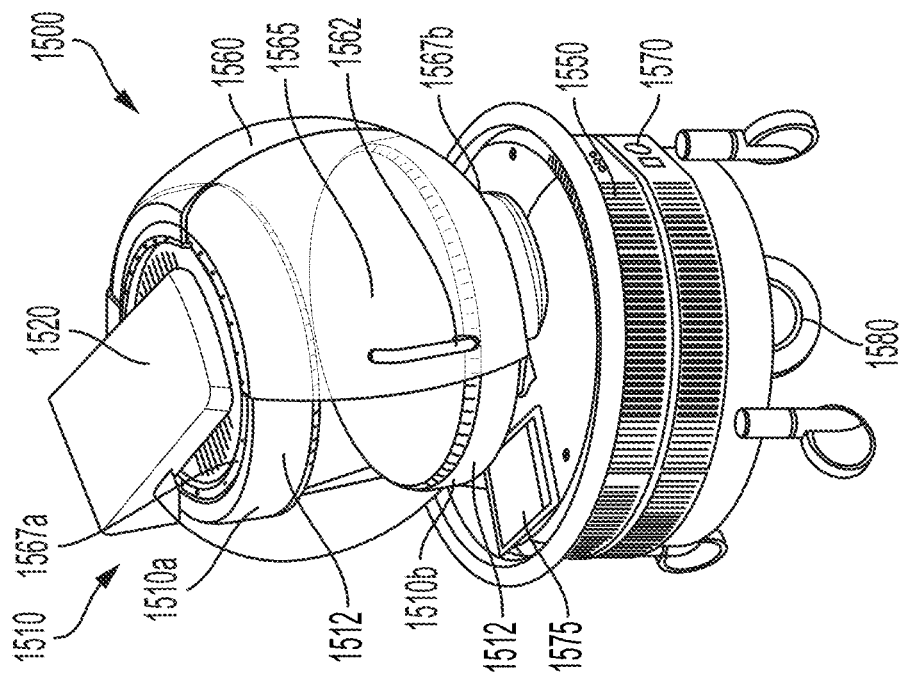
FIGS. 15A and 15B illustrate views of a portable MRI system, in accordance with some embodiments of the technology described herein.
Figure 15A:
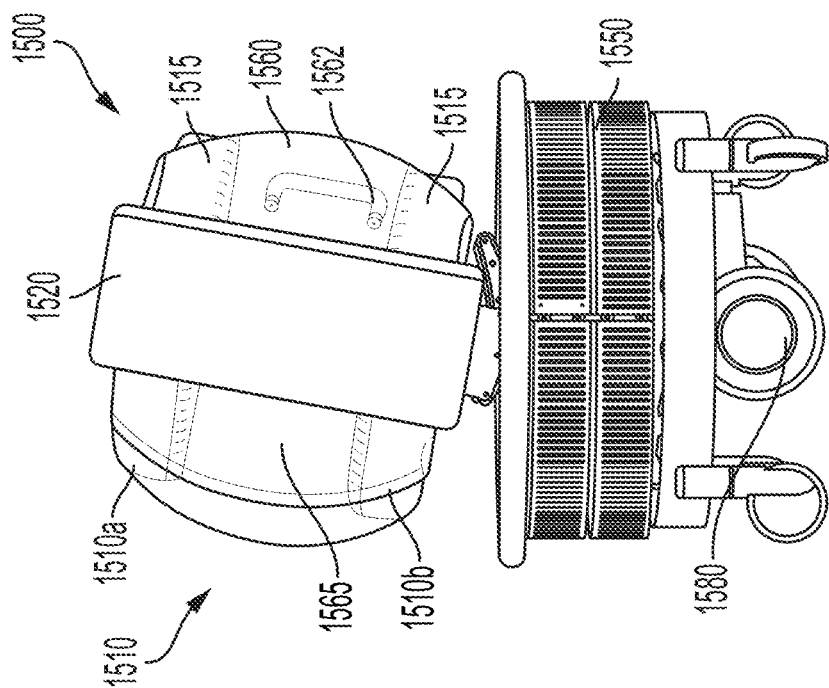

FIGS. 15A and 15B illustrate views of a portable MRI system 1500, in accordance with some embodiments of the technology described herein. Portable MRI system 1500 comprises a $B_0$ magnet 1510 formed in part by an upper magnet 1510a and a lower magnet 1510b having a yoke 1520 coupled thereto to increase the flux density within the imaging region. The $B_0$ magnet 1510 may be housed in magnet housing 1512 along with gradient coils 1515. The $B_0$ magnet 1510 may be a permanent magnet and/or any other suitable type of magnet.

Illustrative portable MRI system 1500 further comprises a base 1550 housing the electronics that operates the MRI system. For example, base 1550 may house electronics including, but not limited to, one or more gradient power amplifiers, an on-system computer (e.g., including one or more GPUs to perform neural network calculations in accordance with some embodiments of the technology described herein), a power distribution unit, one or more power supplies, and/or any other power components configured to operate the MRI system using mains electricity (e.g., via a connection to a standard wall outlet and/or a large appliance outlet). For example, base 1570 may house low power components, such as those described herein, enabling at least in part the portable MRI system to be powered from readily available wall outlets. Accordingly, portable MRI system 1500 can be brought to the patient and plugged into a wall outlet in his or her vicinity.

Portable MRI system 1500 further comprises moveable slides 1560 that can be opened and closed and positioned in a variety of configurations. Slides 1560 include electromagnetic shielding 1565, which can be made from any suitable conductive or magnetic material, to form a moveable shield to attenuate electromagnetic noise in the operating environment of the portable MRI system to shield the imaging region from at least some electromagnetic noise.

In portable MRI system 1500 illustrated in FIGS. 15A and 15B, the moveable shields are configurable to provide shielding in different arrangements, which can be adjusted as needed to accommodate a patient, provide access to a patient, and/or in accordance with a given imaging protocol. For example, for an imaging procedure such as a brain scan, once the patient has been positioned, slides 1560 can be closed, for example, using handle 1562 to provide electromagnetic shielding 1565 around the imaging region except for the opening that accommodates the patient's upper torso. As another example, for an imaging procedure such as a knee scan, slides 1560 may be arranged to have openings on both sides to accommodate the patient's leg or legs. Accordingly, moveable shields allow the shielding to be configured in arrangements suitable for the imaging procedure and to facilitate positioning the patient appropriately within the imaging region. Electrical gaskets may be arranged to provide continuous shielding along the periphery of the moveable shield. For example, as shown in FIG. 15B, electrical gaskets 1567a and 1567b may be provided at the interface between slides 1560 and magnet housing to maintain to provide continuous shielding along this interface. In some embodiments, the electrical gaskets are beryllium fingers or beryllium-copper fingers, or the like (e.g., aluminum gaskets), that maintain electrical connection between shields 1565 and ground during and after slides 1560 are moved to desired positions about the imaging region.

To facilitate transportation, a motorized component 1580 is provided to allow portable MRI system to be driven from location to location, for example, using a control such as a joystick or other control mechanism provided on or remote from the MRI system. In this manner, portable MRI system 1500 can be transported to the patient and maneuvered to the bedside to perform imaging.

Figure 16A:
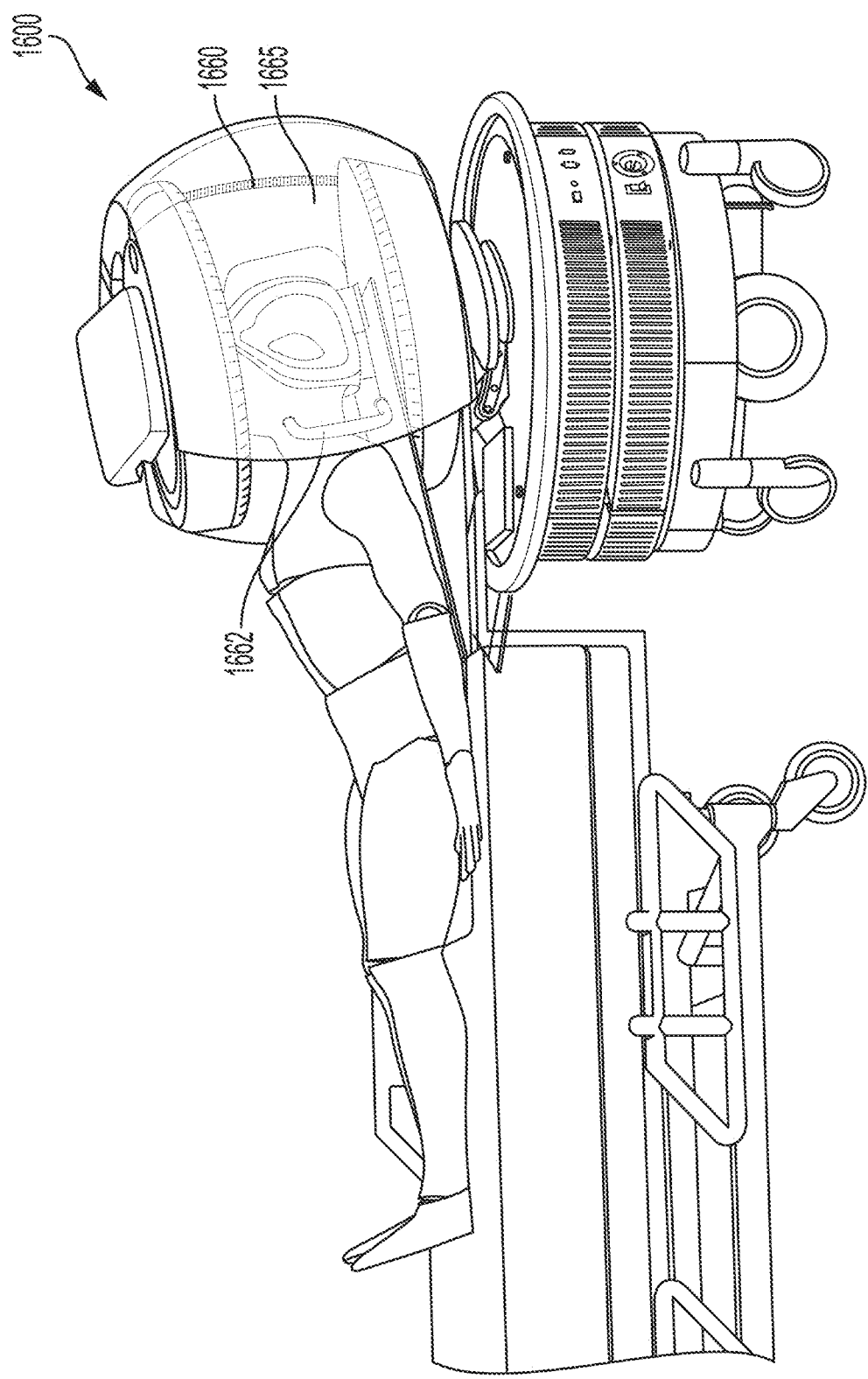
FIG. 16A illustrates a portable MRI system performing a scan of the head, in accordance with some embodiments of the technology described herein.
Figure 16B:
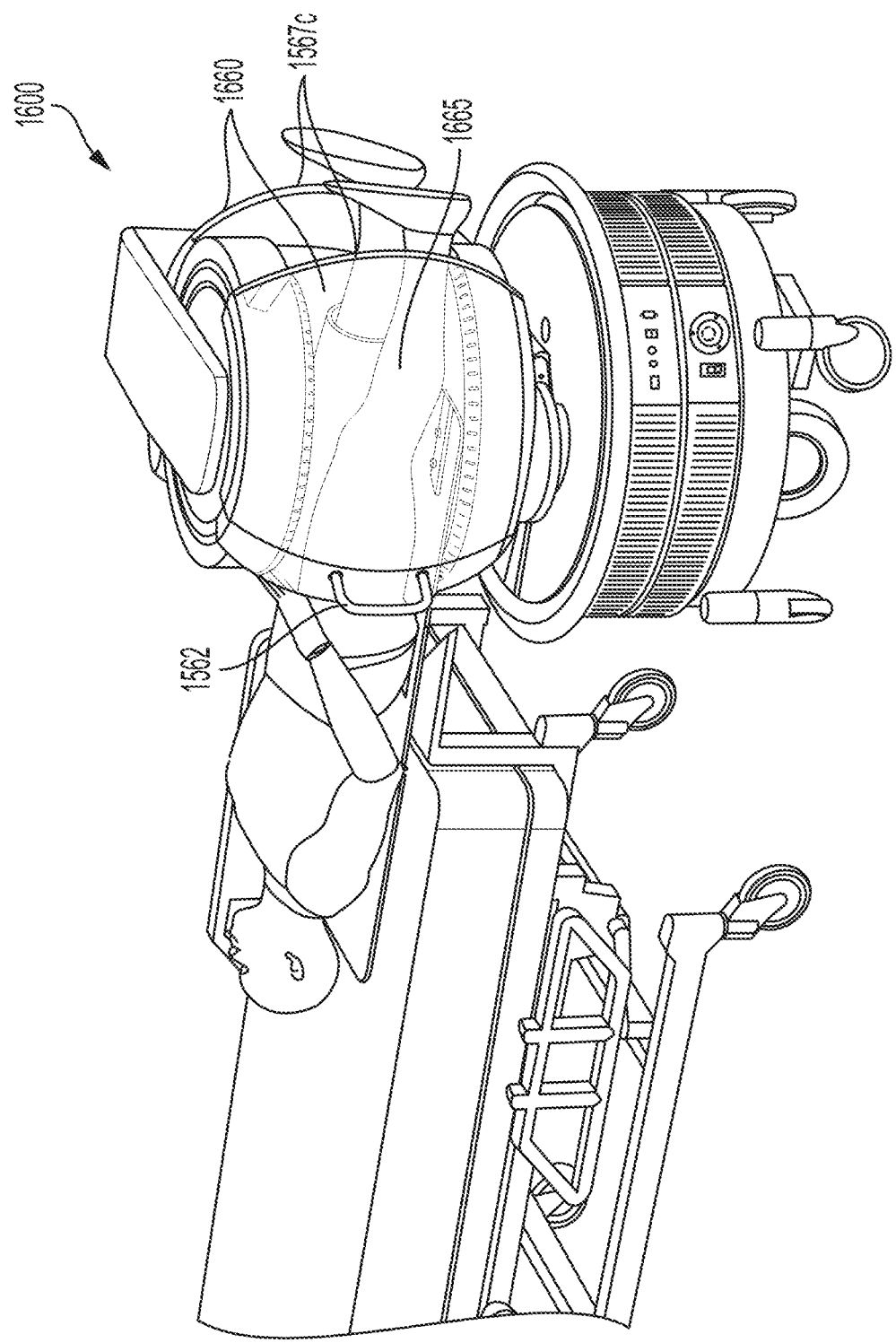
FIG. 16B illustrates a portable MRI system performing a scan of the knee, in accordance with some embodiments of the technology described herein.

FIG. 16A illustrates a portable MRI system 1600 that has been transported to a patient's bedside to perform a brain scan. FIG. 16B illustrates portable MRI system 1600 that has been transported to a patient's bedside to perform a scan of the patient's knee. As shown in FIG. 16B, shielding 1665 includes shields 1660 having electrical gaskets 1667c.

Figure 17:
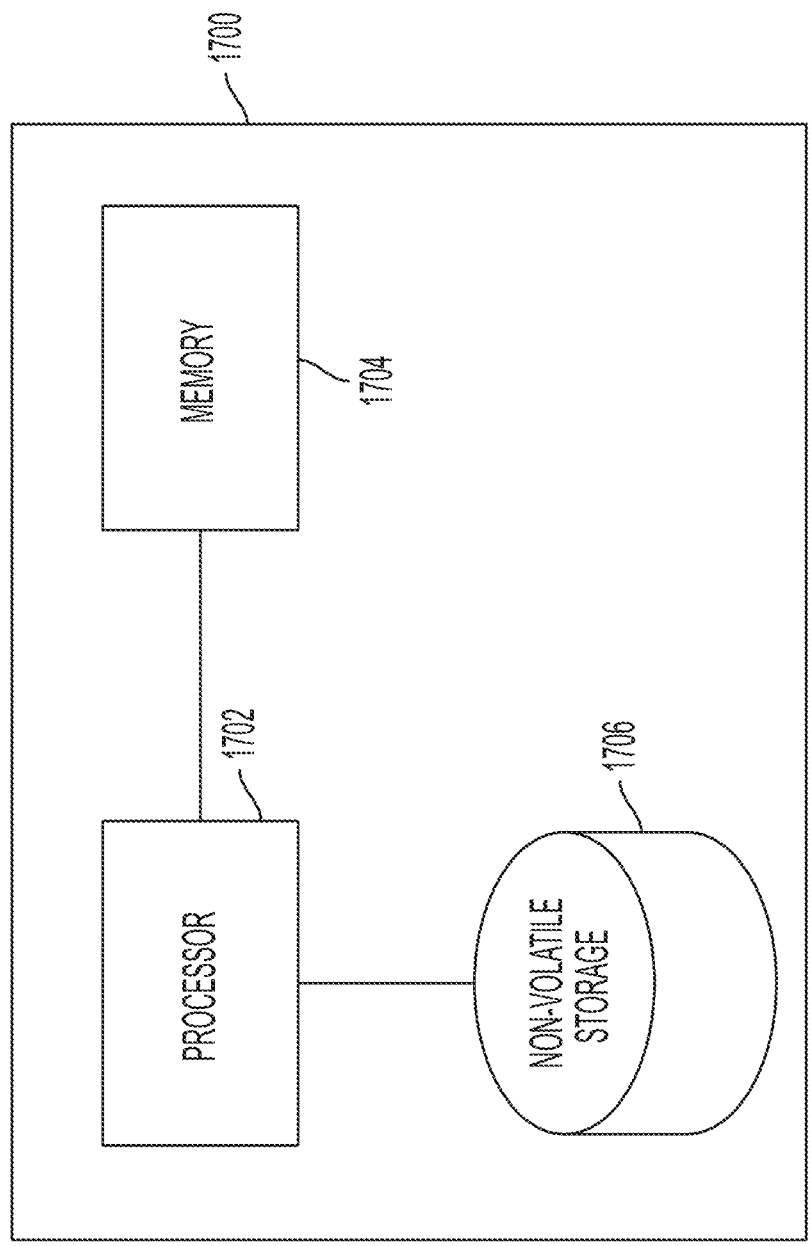
FIG. 17 is a diagram of an illustrative computer system on which embodiments described herein may be implemented.

FIG. 17 is a diagram of an illustrative computer system on which embodiments described herein may be implemented. An illustrative implementation of a computer system 1700 that may be used in connection with any of the embodiments of the disclosure provided herein is shown in FIG. 17. For example, the processes described with reference to FIGS. 1A-1B, 5, 7A-7B, and 12 may be implemented on and/or using computer system 1700. As another example, the computer system 1700 may be used to train and/or use any of the neural network statistical models described herein. The computer system 1700 may include one or more processors 1710 and one or more articles of manufacture that comprise non-transitory computer-readable storage media (e.g., memory 1720 and one or more non-volatile storage media 1730). The processor 1710 may control writing data to and reading data from the memory 1720 and the non-volatile storage device 1730 in any suitable manner, as the aspects of the disclosure provided herein are not limited in this respect. To perform any of the functionality described herein, the processor 1710 may execute one or more processor-executable instructions stored in one or more non-transitory computer-readable storage media (e.g., the memory 1720), which may serve as non-transitory computer-readable storage media storing processor-executable instructions for execution by the processor 1710.

Example Denoising without a Ground Truth: Two-Stage Learning

Machine learning models (e.g., neural network models) for denoising noise-corrupted images are conventionally trained using supervised learning techniques that rely on large datasets of paired clean and noisy images ("training data"). Such datasets may be difficult or impossible to acquire for medical imaging techniques used in clinical settings. For example, in the context of MR imaging, large clinical datasets are typically only available for certain portions of anatomy that are well-studied (e.g., the brain) and for certain types of MRI systems (e.g., high-field MRI systems). Accordingly, the inventors have appreciated that there may be little or even no training data available that has paired clean and noisy medical imagery for certain types of medical imaging devices (e.g., new medical imaging devices, low-field MRI systems, etc.).

As an alternative, unsupervised learning techniques have been used for training machine learning models for denoising noisy images. However, such techniques result in machine learning models that can denoise images that only have independent and identically distributed (i.i.d.) noise. In actual medical imaging, however, the noise distribution in the acquired medical images is rarely i.i.d. For example, in the context of MRI, spatial frequency data is reconstructed, using a reconstruction procedure, into the image domain to generate MR imagery. The reconstruction procedure can introduce correlated, nonlinear noise into the output MR image, which is inconsistent with the assumption of i.i.d. noise underlying conventional unsupervised training techniques.

The inventors have recognized that it is a challenge to obtain sufficient training data for certain medical imaging modalities. For example, obtaining sufficient training data acquired by low-field MRI systems, using unique or uncommon MRI system parameters, and/or for different portions of human anatomy may present a challenge to developing a machine learning model for denoising medical images. To address the above-described challenges of training machine learning models for denoising medical images, the inventors have recognized that approximate training data may be generated and substituted for clean training data in situations where clean training data is unavailable. In particular, the inventors have recognized and appreciated that approximate training data may be generated for a target domain based on data acquired from a source domain different than the target domain. In this manner, images from freely-available, large datasets may be used to generate approximate training data that can be used to train a denoising neural network model to denoise images generated using new or uncommon imaging modalities.

The inventors have accordingly developed a two-stage procedure to generate training data for training a machine learning model to perform denoising of noisy medical images. In a first stage of the procedure, approximate training data in a target domain is generated using training data obtained from a source domain and noise data associated with the target domain. In a second stage, the denoising neural network model is trained using the approximate training data. The machine learning techniques developed by the inventors provide an improvement to medical imaging technology because they more effectively remove or suppress noise from medical images acquired using medical imaging techniques or devices for which large training datasets are unavailable. As a result, these techniques produce higher quality, more clinically relevant medical images (e.g., with better tissue contrast, sharper features, and/or limited noise artefacts).

One machine learning technique for denoising medical images developed by the inventors involves training a denoising neural network model in a two-stage process. In a first stage, training data for training a first neural network model may be generated using (1) clean medical image data associated with a source domain (e.g., medical image data collected by a first type of medical imaging device, for example a high-field MRI device; medical image data acquired using a first set of parameters, for example using a particular MRI pulse sequence; medical image data of a particular type of patient anatomy, for example, of brains; etc.) and (2) first MR noise data associated with a target domain (e.g., MR noise data collected by second type of medical imaging device different from the first type, for example, a low-field MRI device; MR noise data acquired using a second set of parameters, for example using a different MRI pulse sequence, MR noise data collected when imaging a different type of patient anatomy, for example a knee which could be imaged using a different RF receive coil than the coil used for brain imaging; etc.). The first neural network model may then be trained using the generated training data. In a second stage, training data for training the denoising neural network model may be generated by applying the first neural network model to a plurality of noisy medical images associated with the target domain to generate a plurality of denoised medical images. The denoising neural network model may then be trained using the training data for training the denoising neural network model. After training the denoising neural network model, the denoising neural network model may be provided noisy medical images as input and may generate denoised medical images as output.

In some embodiments, the first training data comprises a first plurality of noisy medical images and a corresponding plurality of clean medical images. To generate the first training data, first noisy medical image data is generated using the clean medical image data associated with the source domain (e.g., medical image data collected using a high-field MRI device) and the first medical image noise data associated with the target domain (e.g., noise data, either simulated or collected, representative of the type of noise present in the data collected by a low-field MRI device). Thereafter, the first plurality of noisy medical images and the corresponding plurality of clean medical images are generated by applying a reconstruction procedure to the first noisy medical image data and to the clean medical image data associated with the source domain, respectively.

In some embodiments, the reconstruction procedure comprises using a machine learning model (e.g., a neural network model), using compressed sensing, or using at least one non-uniform transformation, and/or using at least one linear transformation to generate the medical images. In some embodiments, for example, where the medical imaging device is an MRI system, the reconstruction procedure generates MR images from spatial frequency data acquired by the MRI system. In such embodiments, and where the reconstruction procedure includes at least one linear transformation, the reconstruction procedure may include using one or more of a coil de-correlation transformation, a gridding transformation, and/or a coil combination transformation. It should be appreciated, however, that, in some embodiments, the reconstruction procedure may be any suitable image reconstruction procedure, as aspects of the technology described herein are not limited in this respect.

In some embodiments, the technique includes generating second training data for training a second neural network model to denoise medical images. To generate the second training data, a plurality of doubly noisy medical images is generated using (1) second noisy medical image data associated with the target domain; and (2) second medical image noise data associated with the target domain. Thereafter, the second neural network model is trained using the second training data. In some embodiments, generating the training data for training the denoising neural network model also includes applying the second neural network model to the second plurality of noisy medical images.

In some embodiments, the second training data comprises the plurality of doubly noisy medical images and the second plurality of noisy medical images. To generate the second training data, doubly noisy medical image data is generated using the second noisy medical image data associated with the target domain and the second medical image noise data associated with the target domain. Thereafter, the plurality of doubly noisy medical images and the second plurality of noisy medical images are generated by applying the reconstruction procedure to the doubly noisy medical image data and to the second noisy medical image data associated with the target domain, respectively.

In some embodiments, generating the training data for training the denoising neural network model also includes generating a plurality of augmented denoised medical images by applying a transformation to images of the plurality of denoised medical images and generating clean medical image data associated with the target domain by applying a nonuniform transformation to images of the plurality of augmented denoised medical images.

In some embodiments, the training data for training the denoising neural network model comprises a plurality of noisy medical training images and a plurality of clean medical training images. To generate the training data for training the denoising neural network model, clean medical image training data is generated by combining the clean medical image data associated with the source domain with the clean medical image data associated with the target domain. Additionally, noisy medical training data is generated using the clean medical training data and third medical image noise data associated with the target domain. The plurality of noisy medical training images and the plurality of clean medical training images are then generated by applying the reconstruction procedure to the noisy medical image training data and to the clean medical image training data, respectively.

In some embodiments, the source domain describes the source of clean medical image data used to build the training data for training the denoising neural network model. The target domain describes the source of noisy medical image data provided as input to the denoising neural network model for denoising. For example, in some embodiments, the clean medical image data associated with the source domain comprises medical image data that is collected by imaging a first portion of anatomy (e.g., the brain) while the second noisy medical image data associated with the target domain comprises medical image data that is collected by imaging a second portion of anatomy (e.g., a limb, joint, torso, pelvis, appendage, etc.) different than the first portion of the anatomy. As another example, in some embodiments, the clean medical image data associated with the source domain comprises medical image data that is collected using a first type of medical imaging device (e.g., a high-field MRI system) while the second noisy medical image data associated with the target domain comprises medical image data that is collected using a second type of medical imaging device (e.g., a low-field MRI system) different than the first type of medical imaging device. As another example, in some embodiments, the clean medical image data associated with the source domain comprises medical image data that is collected using a first imaging procedure or protocol (e.g., a first type of pulse sequence) while the second noisy medical image data associated with the target domain comprises medical image data that is collected using a second imaging procedure or protocol (e.g., a second type of pulse sequence) different than the first imaging procedure or protocol.

Figure 18A:
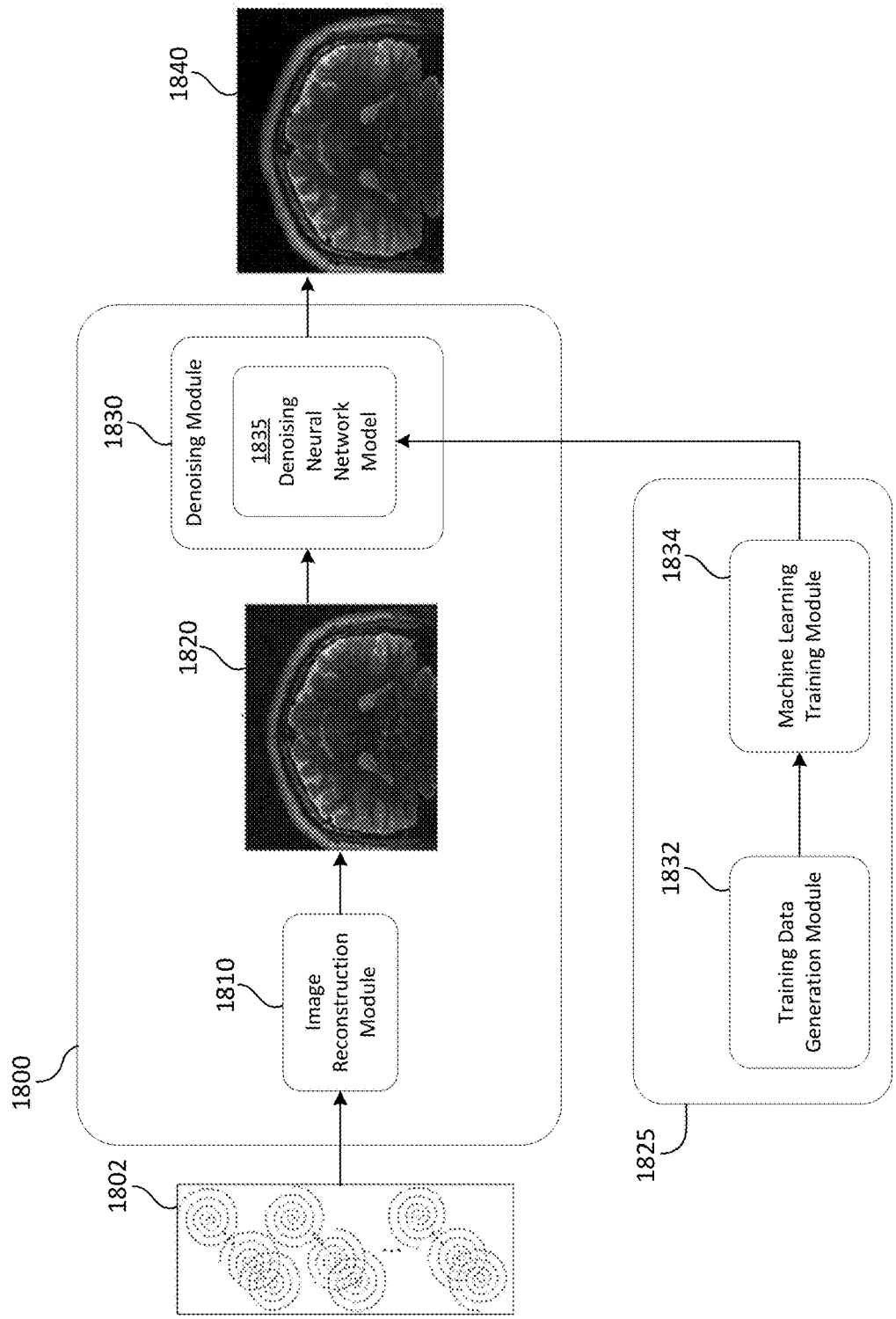
FIG. 18A is a diagram of: (1) an illustrative MR image reconstruction and denoising pipeline 1800 including an image reconstruction module and denoising module; and (2) a training pipeline 1825 for training a machine learning model to use as part of the denoising module, in accordance with some embodiments of the technology described herein.

FIG. 18A is a diagram of an illustrative pipeline 1800 of an example image reconstruction and denoising procedure, in accordance with some embodiments of the technology described herein. As shown in FIG. 18A, denoising module 1830 may be configured to accept as input a noisy medical image 1820. The denoising module 1830 may also be configured to denoise the noisy medical image 1820 and to generate a denoised medical image 1840 and/or information that can be used to generate the denoised medical image 1840.

As described in connection with FIG. 18A, the illustrative MR image reconstruction and denoising pipeline 1800 and the training pipeline 1825 include multiple program modules configured to perform various respective functions. Each module may be implemented in software and, as such, may include processor-executable instructions that, when executed by at least one computer hardware processor, cause the at least one computer hardware processor to perform the function(s) of the module. Such modules are sometimes referred to herein as "program modules."

In some embodiments, the denoising module 1830 may include a denoising neural network model 1835. The denoising neural network model 1835 may be implemented as a deep neural network model, in some embodiments. For example, the denoising neural network model 1835 may comprise a plurality of layers. The layers may include one or more convolutional layers, one or more pooling layers (e.g., average pooling, max pooling, spectral pooling), one or more unpooling layers (e.g., average unpooling, max unpooling) one or more upsampling layers, one or more downsampling layers, one or more fully connected layers, and/or any other suitable types of layers. An illustrative architecture for denoising neural network model 1835 is described in connection with FIG. 19 herein.

In some embodiments, the denoising neural network model 1835 may be trained using training pipeline 1825. The training pipeline 1825 may include a training data generation module 1832 and a machine learning training module 1834. In some embodiments, the training data generation module 1832 may generate the training data and the machine learning training module 1834 may train the denoising neural network model 1835 according to the illustrative process described in connection with FIGS. 20A-20D herein.

In some embodiments, the noisy medical image 1820 may be generated using image reconstruction module 1810. The image reconstruction module 1810 may generate the noisy medical image 1820 using medical image data 1802. The medical image data 1802 may be acquired using a medical imaging device (e.g., an MRI system or any other suitable type of medical imaging device examples of which are described herein). For example, the noisy medical image 1820 may be obtained by collecting the medical image data 1802 using the medical imaging device (e.g., by imaging a patient) and then generating the noisy medical image 1820 based on the collected data using the image reconstruction module 1810. As shown in the example of FIG. 18A, the noisy medical image 1820 may be an MR image generated using spatial frequency data 1802 acquired using an MRI system. As another example, obtaining the noisy medical image 1820 may include accessing, from storage, medical image data 1802 previously collected by the medical imaging device and generating the noisy medical image 1820 using the accessed medical image data 1802 and image reconstruction module 1810. As yet another example, the noisy medical image 1820 may be generated prior to the denoising process and accessed from storage for denoising.

In some embodiments, the image reconstruction module 1810 may be configured to generate the noisy medical image 1820 by applying a reconstruction procedure to the medical image data 1802. Such a procedure may be applied generally for medical imaging devices that capture data in a domain other than the image domain. In the context of MRI, and as shown in FIG. 18A, the reconstruction procedure is configured to generate MR images in the image domain using MR data collected in the spatial frequency domain (e.g., in k-space). In some embodiments, the image reconstruction module 1810 may be configured to generate the noisy medical image 1820 using a reconstruction procedure including compressed sensing.

In some embodiments, the image reconstruction module 1810 may be configured to generate the noisy medical image 1820 using a reconstruction procedure including a machine learning model. For example, the reconstruction procedure may include a machine learning model may be implemented as a deep neural network model. The deep neural network model may comprise a plurality of layers. The layers may include one or more convolutional layers, one or more pooling layers (e.g., average pooling, max pooling, spectral pooling), one or more unpooling layers (e.g., average unpooling, max unpooling) one or more upsampling layers, one or more downsampling layers, one or more fully connected layers, and/or any other suitable types of layers.

Figure 26A:
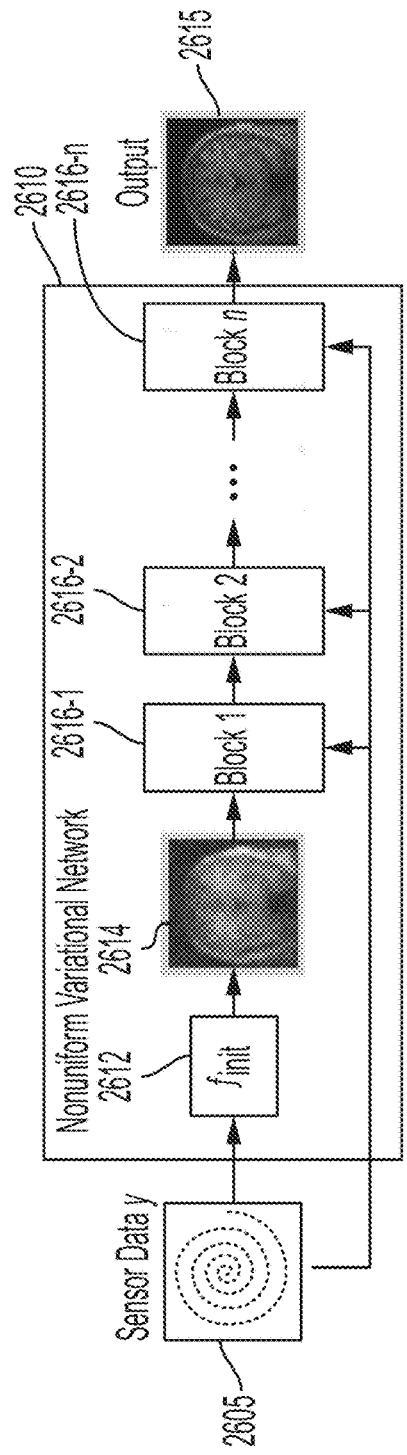
FIG. 26A is a diagram of an illustrative architecture of an example neural network model for generating MR images from input MR spatial frequency data, in accordance with some embodiments of the technology described herein.

In some embodiments, the machine learning model may be the machine learning model described in connection with FIGS. 26A-26E herein. FIG. 26A is a diagram of an illustrative architecture of an example neural network model 2610 for generating MR images from input MR spatial frequency data, in accordance with some embodiments of the technology described herein. As shown in FIG. 26A, neural network model 2610 reconstructs output MR image 2615 from input MR spatial frequency data 2605 by processing the input MR spatial frequency data in stages. First, the input MR spatial frequency data 2605 is processed using initial processing block 2612 to produce an initial image 2614, and then the initial image 2614 is processed by a series of neural network blocks 2616-1, 2616-2, . . . , 2616-n.

In some embodiments, one or more of the blocks 2616-1, 2616-2, . . . , 2616-n may operator in the image domain. In some embodiments, one or more of the blocks 2616-1, 2616-2, . . . , 2616-n may transform the input data to a different domain, including but not limited to the spatial frequency domain, perform processing (e.g., reconstruction processing) in the different domain, and subsequently transform back to the image domain.

In some embodiments, the initializer block transforms the input MR spatial frequency data to the image domain to generate an initial image for subsequent processing by the neural network model 2610. The initializer block may be implemented in any suitable way. For example, in some embodiments, the initializer block may apply the adjoint non-uniform Fourier transformation to the input MR spatial frequency data to obtain the initial image. As another example, in some embodiments, the initializer block may apply the gridding reconstruction to the input MR spatial frequency data to obtain the initial image.

Figure 26B:
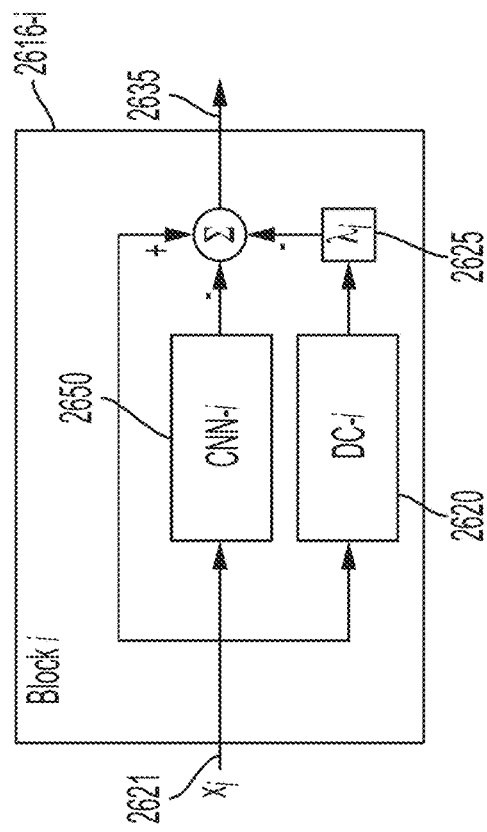
FIG. 26B is a diagram of one type of architecture of a block of the neural network model of FIG. 26A, in accordance with some embodiments of the technology described herein.
Figure 26C:
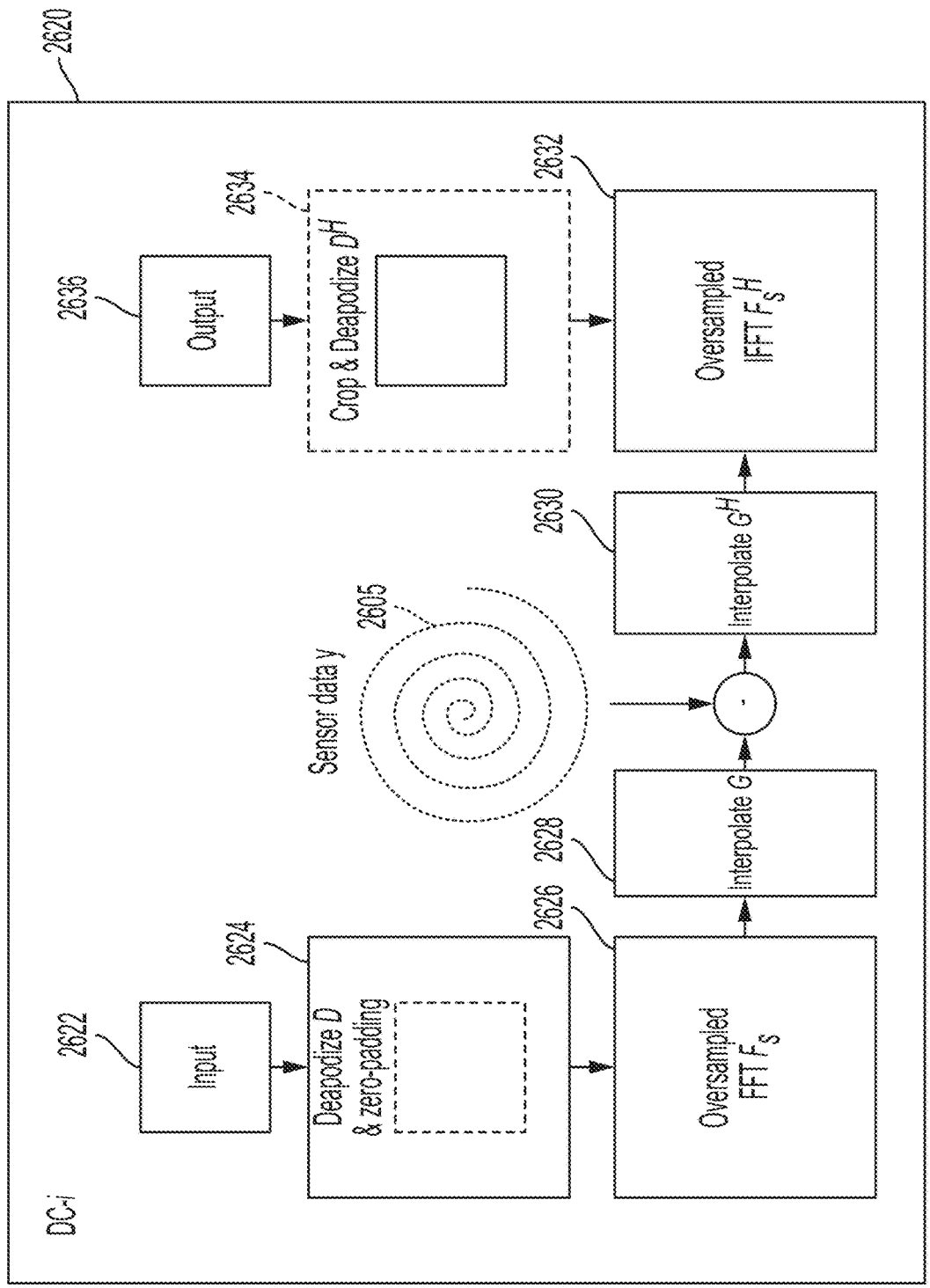
FIG. 26C is a diagram of an illustrative architecture of a data consistency block, which may be part of the block shown in FIG. 26B, in accordance with some embodiments of the technology described herein.
Figure 26D:
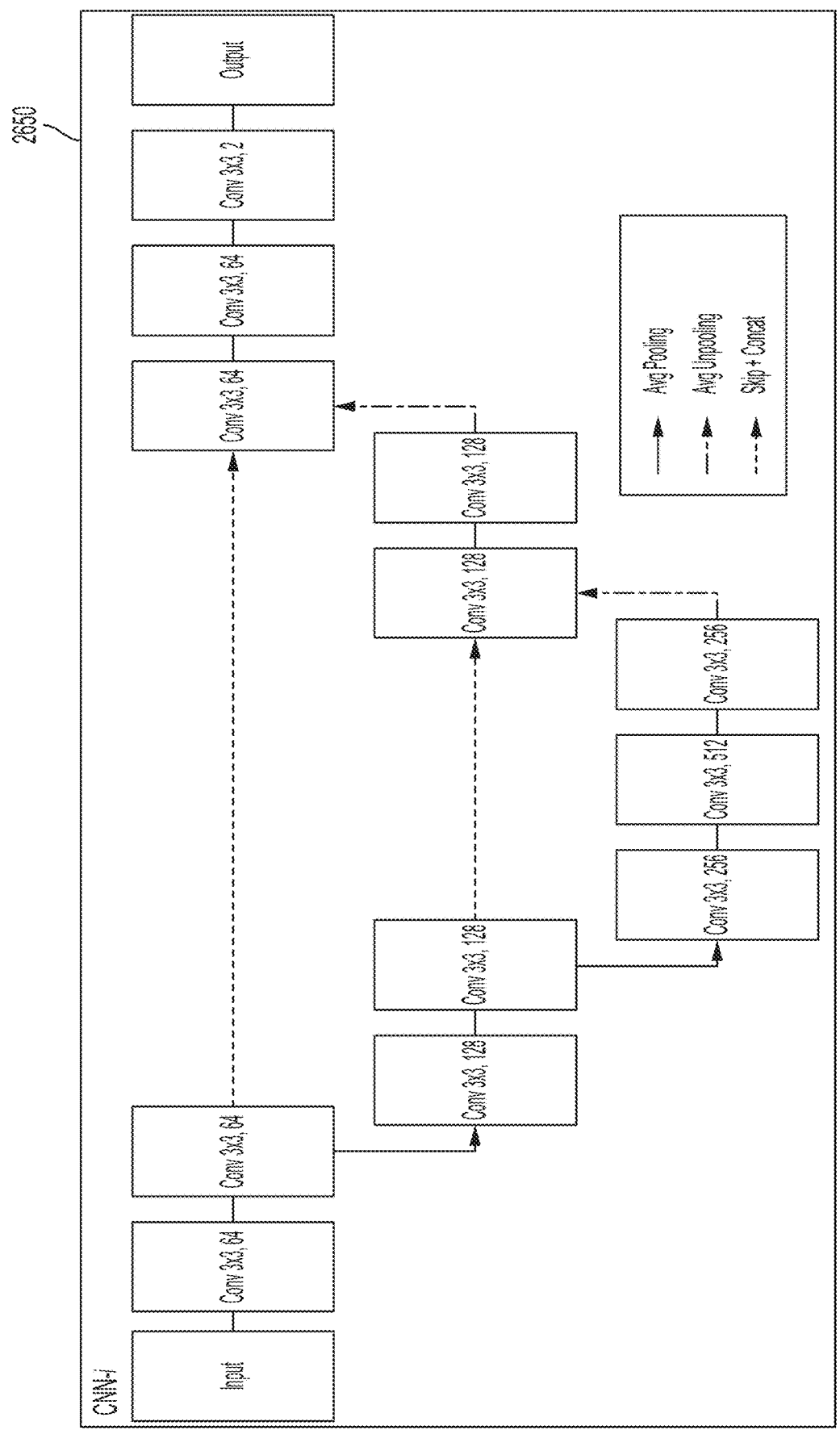
FIG. 26D is a diagram of an illustrative architecture of a convolutional neural network block, which may be part of the block shown in FIG. 26B, in accordance with some embodiments of the technology described herein.
Figure 26E:
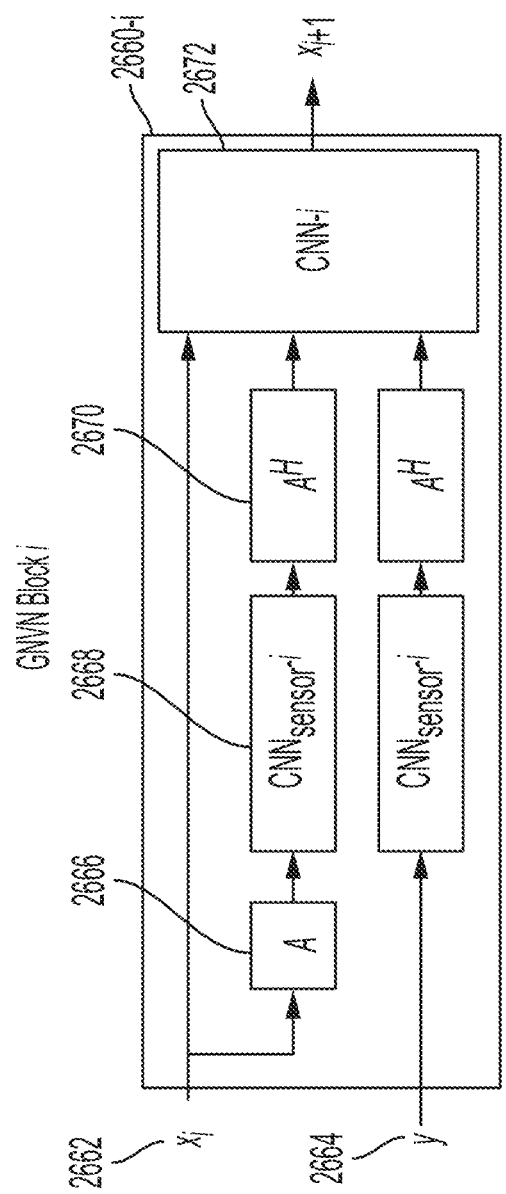
FIG. 26E is a diagram of another type of architecture of a block of the neural network model of FIG. 26A, in accordance with some embodiments of the technology described herein.

Illustrative architectures of neural network blocks 2616 are shown in FIG. 26B (corresponding to a non-uniform variational network) and FIG. 26E (corresponding to a generalized non-uniform variational network). Accordingly, in some embodiments, at least one, at least some, or all of the blocks 2616-1, 2616-2, . . . , 2616-n may have an architecture as shown for illustrative block 2616-i in FIG. 26B. As shown in FIG. 26B, neural network block 2616-i includes a data consistency block 2620, and a convolutional neural network block 2650, both of which are applied to the input $x_i$, labeled as 2621. The input $x_i$ may represent the MR image reconstruction generated by neural network model 2610 at the completion of the $(i-1)^{st}$ neural network block. In this example, the output 2635 of the block 2616-i is obtained by applying the data consistency block 2620 to the input $x_i$, to obtain a first result, applying the convolutional neural network block 2650 to $x_i$, to obtain a second result, and subtracting from $x_i$ a linear combination of the first result and the second result, where the linear combination is calculated using the block-specific weight $\lambda_i$.

The data consistency block 2620 may be implemented in any of numerous ways. In some embodiments, the data consistency block 2620 may perform data consistency processing by transforming the input image represented by $x_i$ to the spatial frequency domain using a non-uniform Fourier transformation, comparing the result with the initial MR spatial frequency data 2605, and transforming the difference between the two back to the image domain using an adjoint of the non-uniform Fourier transformation.

An illustrative implementation of data consistency block 2620 is shown in FIG. 26C. In the illustrative implementation of FIG. 26C, the image domain input 2622 (which may be the intermediate reconstruction $x_i$ 2621), is transformed to the spatial frequency domain through a series of three transformations 2624, 2626, and 2628, whose composition is used to implement a non-uniform fast Fourier transformation from the image domain to the spatial frequency domain. In particular, the transformation 2624 is a de-apodization and zero-padding transformation D, the transformation 2626 is an oversampled FFT transformation $F_s$, and the transformation 2628 is the gridding interpolation transformation G. As described herein, the non-uniform fast Fourier transformation A is represented by the composition of these transformations according to: $A=D\ F_s\ G$. Example realizations of these constituent transformations are described herein.

After the image domain input 2622 is transformed to the spatial frequency domain, it is compared with the initial MR spatial frequency data 2605, and the difference between the two is transformed back to the image domain using the transformations 2630, 2632, and 2634, in that order. The transformation 2630 is the adjoint of the gridding interpolation transformation 2628. The transformation 2632 is the adjoint of the oversampled FFT transformation 2626. The transformation 2634 is the adjoint of the deapodization transformation 2624. In this way, the composition of the transformations 2630, 2632, 2634, which may be written as $G^H F^H_s D^H = A^H$, represents the adjoint $A^H$ of the non-uniform Fourier transformation A.

The convolutional neural network block 2650 may be implemented in any of numerous ways. In some embodiments, the block 2650 may have multiple convolutional layers, including one or more convolutional layers and one or more transpose convolutional layers. In some embodiments, the block 2650 may have a U-net structure, whereby multiple convolutional layers downsample the data and subsequent transpose convolutional layers upsample the data, for example, as shown in the illustrative U-net architecture of FIG. 26D for the block 2650.

As shown in FIG. 26D, input to the convolutional network block 2650 is processing by a downsampling path followed an upsampling path. In the downsampling path, the input is processed by repeated application of two convolutions with 3×3 kernels, each followed by application of a non-linearity (e.g., a rectified linear unit or ReLU), an average 2×2 pooling operation with stride 2 for downsampling. At each downsampling step the number of feature channels is doubled from 64 to 128 to 256. In the upsampling path, the data is processed be repeated upsampling of the feature map using an average unpooling step that halves the number of feature channels, a concatenation with the corresponding feature map from the downsampling path, and two 3×3 convolutions, each followed by application of a non-linearity (e.g., a ReLU).

FIG. 26E is a diagram of another type of architecture of a block of the neural network model of FIG. 26A, in accordance with some embodiments of the technology described herein. A neural network model with blocks having the architecture like the one shown in FIG. 26E may be termed a "generalized non-uniform variational network" or "GNVN". It is "generalized" in the sense that, while data consistency blocks are not used directly, feature similar to the image features generated by such blocks may be useful to incorporate into a neural network model.

As shown in FIG. 26E, the $i^{th}$ GNVN block 2660-$i$ takes as input: (1) the image domain data $x_i$, labeled as 2662; and (2) the initial MR spatial frequency data 2664. The input $x_i$ may represent the MR image reconstruction generated by neural network model 2610 at the completion of the $(i-1)^{st}$ GNVN block (2660-($i$-1)). These inputs to the block 2660-$i$ are then used to generate inputs to the convolutional neural network block 2672 part of block 2660-$i$. In turn, from these inputs, the CNN block 2672 generates the next MR image reconstruction denoted by $x_{i+1}$.

In the embodiment of FIG. 26E, the inputs 2662 and 2664 are used to generate three inputs to the CNN block 2672: (1) the reconstruction $x_i$ itself is provided as input to the CNN block; (2) the result of applying, to the reconstruction $x_i$, the non-uniform Fourier transformation 2666 followed by a spatial frequency domain convolutional neural network 2668, followed by the adjoint non-uniform Fourier transformation 2670; and (3) the result of applying, to the initial MR spatial frequency data 2664, the spatial frequency domain convolutional neural network 2668 followed by an adjoint non-uniform Fourier transform 2670.

In some embodiments, the non-uniform Fourier transformation 2666 may be the transformation A expressed as a composition of three transformations: the de-apodization transformation D, an oversampled Fourier transformation $F_s$, and a local gridding interpolation transformation G such that $A=D\ F_s\ G$. Example realizations of these constituent transformations are described herein.

The spatial frequency domain CNN 2668 may be any suitable type of convolutional neural network. For example, the CNN 2668 may be a five layer convolutional neural network with residual connection. However, in other embodiments, the spatial frequency domain network 2668 may be any other type of neural network (e.g., a fully convolutional neural network, a recurrent neural network, and/or any other suitable type of neural network), as aspects of the technology described herein are not limited in this respect.

Additional aspects related to machine learning models for image reconstruction are described in U.S. Patent Application Publication No. 2020/0034998, filed Jul. 29, 2019, titled "Deep Learning Techniques for Magnetic Resonance Image Reconstruction," U.S. Patent Application Publication No. 2020/0058106, filed Aug. 15, 2019, titled "Deep Learning Techniques for Suppressing Artefacts in Magnetic Resonance Images," and U.S. Patent Application Publication No. 2020/0289019, filed Mar. 12, 2020, titled "Deep Learning Techniques for Generating Magnetic Resonance Images from Spatial Frequency Data," each of which is incorporated herein by reference in its entirety.

Figure 18B:
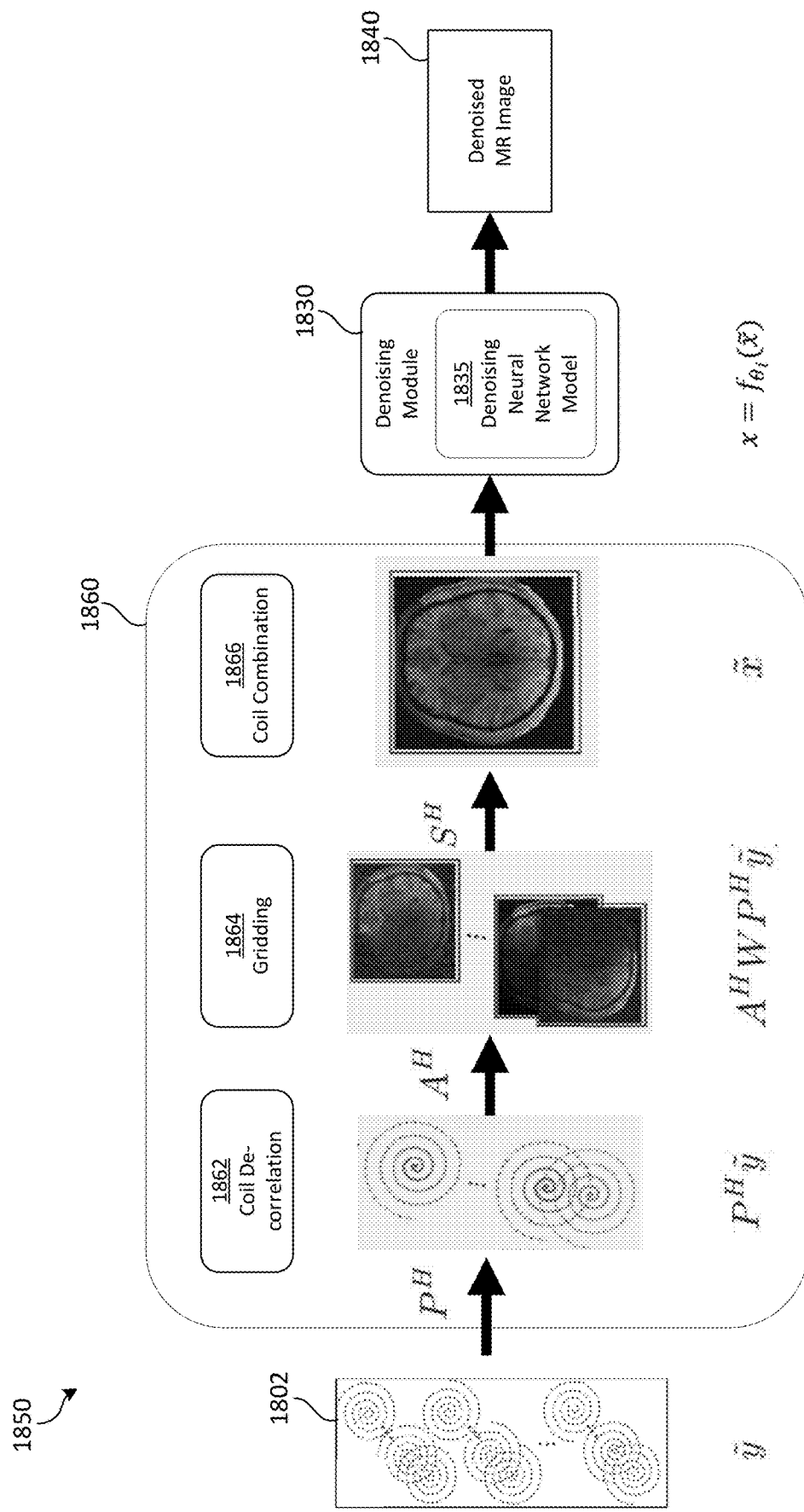
FIG. 18B is a diagram of an MR image reconstruction and denoising pipeline 1850 including an image reconstruction module and a denoising module, in accordance with some embodiments of the technology described herein.

Returning to FIG. 18A, in some embodiments, the image reconstruction module 1810 may be configured to generate the noisy medical image 1820 using a reconstruction procedure including applying at least one non-uniform transformation to the medical image data 1802. An example of a reconstruction procedure for MR images and including at least one non-uniform transformation is described in connection with FIG. 18B. FIG. 18B is a diagram of an illustrative pipeline 1850 including an example image reconstruction module 1860 including at least one non-uniform transform, in accordance with some embodiments of the technology described herein. In some embodiments, the image reconstruction module 1860 may be used to generate the noisy medical image 1820, as described in connection with FIG. 18A herein.

In some embodiments, and as shown in FIG. 18B, image reconstruction module 1860 is configured to receive medical image data 1802 acquired in the sensor domain (y∈$\mathcal{Y}$) as input. The medical image data 1802 is related to a corresponding MR image in the image domain (x∈X) by the sampling operator $\mathcal{A}$:X→$\mathcal{Y}$. For a real-world medical imaging procedure, the medical image data 1802 includes noise (denoted by a tilde accent herein: $\widetilde{(.)}$) such that the medical image data 1802 is described by:

$$\tilde{y} = y + n = \mathcal{A}(x) + n$$

where n is additive noise n~$\mathcal{N}$(0, Σ) that is correlated. For example, the noise n may be correlated along RF receive coils (e.g., RF receive coils 1426 of FIG. 14). The image reconstruction module 1860 may be configured as a reconstruction pipeline containing one or more transformations, the transformations represented as $\mathcal{M}$:X→$\mathcal{Y}$ such that: $\tilde{x} = \mathcal{M}(\tilde{y})$.

In some embodiments, the image reconstruction module 1860 includes coil de-correlation module 1862, gridding module 1864, and coil combination module 1866. Each of the coil de-correlation module 1862, gridding module 1864, and coil combination module 1866 apply a different mapping to the medical image data as it passes through the image reconstruction module 1860. For example, for multi-coil, non-Cartesian MR image acquisition, the transformations $\mathcal{A}$ and $\mathcal{M}$ may be expressed as:

$$y = \mathcal{A}(x) = PASx$$

$$\tilde{x} = \mathcal{M}(\tilde{y}) = abs(S^H A^H W P^H \tilde{y})$$

where S is a multi-channel coil sensitivity matrix, A is a Fourier sampling matrix, P is a prewhitening matrix for de-correlating the MR signals along the RF receive coil dimension, W is a sample density compensation matrix for the nonuniform coverage of k-space by the non-Cartesian MR image acquisition, and abs takes the magnitude value element-wise.

In some embodiments, the coil de-correlation module 1862 may be configured to de-correlate the MR signals of input medical image data 1802 along the RF receive coil dimension. To perform this de-correlation, the coil de-correlation module 1862 may be configured to apply the transformation, $P^H$, which is the Hermitian adjoint or conjugate transpose of the prewhitening matrix P, to the input medical image data 1802, denoted by $\tilde{y}$. The coil de-correlation module 1862 may then output decorrelated medical image data, $P^H \tilde{y}$, to the next module of image reconstruction module 1860.

In some embodiments, the gridding module 1864 may be configured to receive the decorrelated medical image data, $P^H \tilde{y}$, and to apply gridding to the instances of decorrelated medical image data to transform the decorrelated medical image data from the spatial frequency domain to the image domain. The gridding module 1864 may be configured to apply the transformation $A^H W$ to the decorrelated medical image data, $P^H \tilde{y}$. The transformation $A^H W$ may be configured to compensate for sampling density due to the non-Cartesian acquisition of the medical image data 1802 and to resample the decorrelated medical image data, $P^H \tilde{y}$, for image reconstruction from the spatial frequency domain to the image domain. The gridding module 1864 may be configured to output a series of medical images, $A^H W P^H \tilde{y}$, where each image of the series of medical images corresponds to a set of MR signal acquired by a receive RF coil.

In some embodiments, the coil combination module 1866 may be configured to receive the series of medical images, $A^H W P^H \tilde{y}$, and to combine the series of medical images into a single noisy medical image, $\tilde{x}$. The coil combination module 1866 may be configured to apply the transformation $S^H$ to the series of medical images, $A^H W P^H \tilde{y}$, to combine the MR signal responses of the multiple receive RF coils into a single noisy medical image. The coil combination module 1866 may also be configured to apply a magnitude operation, abs(.), such that $\tilde{x} = abs(S^H A^H W P^H \tilde{y})$.

In some embodiments, the image reconstruction module 1860 may be configured to output the noisy medical image, $\tilde{x}$, for further processing. The output noisy medical image, $\tilde{x}$, may have spatially correlated, inhomogeneous noise present in the image. The denoising module 1830 may be configured to denoise the output noisy medical image, $\tilde{x}$, and generate a denoised medical image 1840, $x = f_{\theta_i}(\tilde{x})$, as described in connection with FIG. 18A herein.

Figure 19:
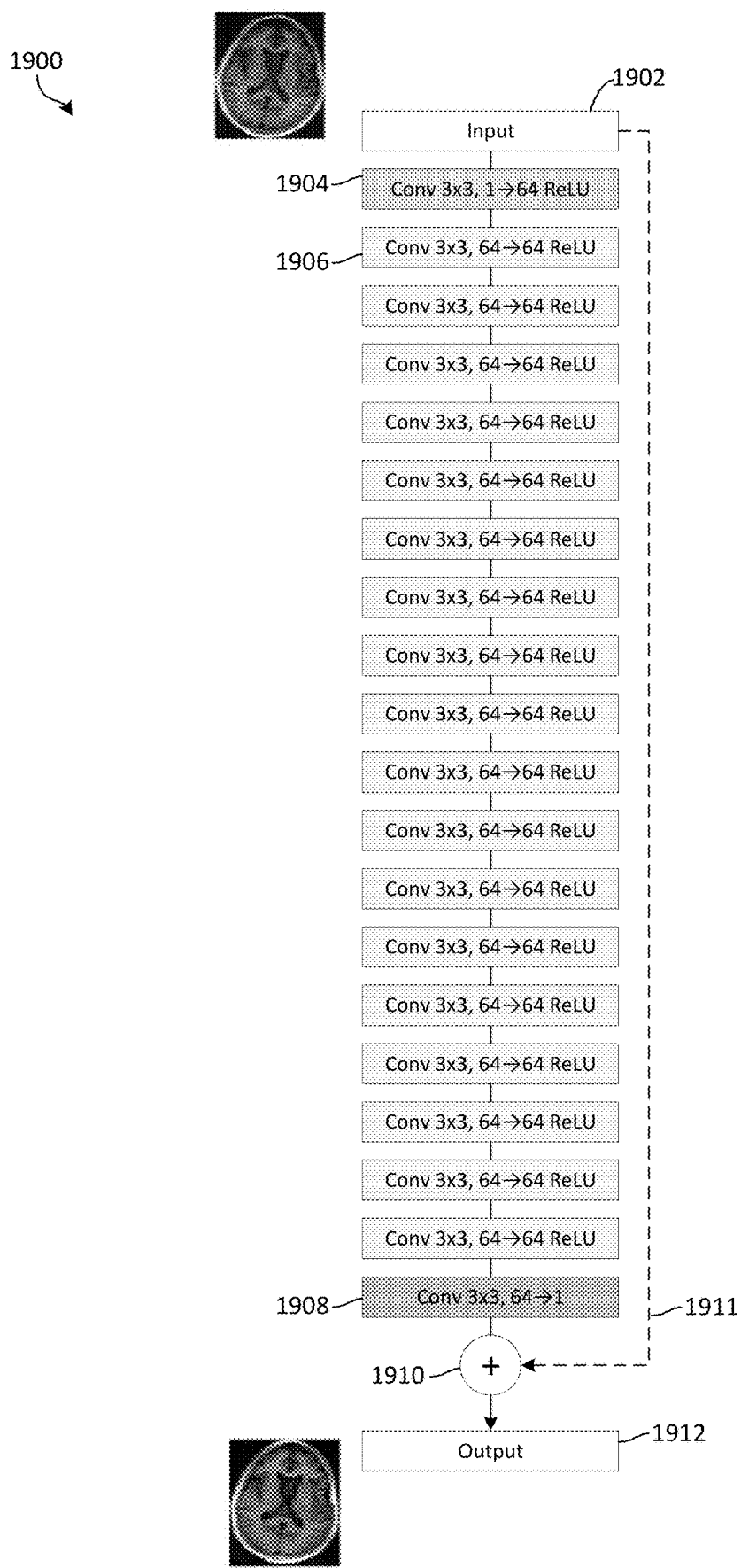
FIG. 19 is a diagram of an illustrative architecture of an example denoising neural network model for generating denoised MR images from input noisy MR images, in accordance with some embodiments of the technology described herein.

FIG. 19 is a diagram of an illustrative architecture of an example denoising neural network model 1900 for generating denoised MR images from input noisy MR images, in accordance with some embodiments of the technology described herein. In some embodiments, the denoising neural network model 1900 may be used to implement the denoising neural network model 1835 of FIGS. 18A and 18B, though it should be appreciated that any suitable neural network model may be used to implement the denoising module 1830, as aspects of the technology described herein are not so limited.

In some embodiments, the denoising neural network model 1900 may be implemented as a deep convolutional neural network having multiple layers. The deep convolutional neural network may include convolution layers to perform domain transforms and rectifier linear units (ReLUs) for noise reduction after one or more of the convolutional layers. It should be appreciated that the convolution layers may be two-dimensional convolution layers (e.g., for processing two-dimensional images) or three-dimensional convolution layers (e.g., for processing three-dimensional volumes), as aspects of the technology described herein are not so limited.

In some embodiments, and as shown in FIG. 19, the denoising neural network model 1900 includes an input 1902, a first convolution layer 1904, second convolution layers 1906, a third convolution layer 1908, a sum layer 1910, and an output 1912. The sum layer 1910 may sum the input 1902 with the output of third convolution layer 1908 by a skip connection 1911. The denoising neural network model 1900 has the following architecture:

1. Input: ($n_x$, $n_y$, 1)
2. Convolution (kernel size = 3 × 3, 64 filters, stride 1, with bias term) followed by ReLU
3. Convolution (kernel size = 3 × 3, 64 filters, stride 1, with bias term) followed by ReLU
4. Convolution (kernel size = 3 × 3, 64 filters, stride 1, with bias term) followed by ReLU
5. Convolution (kernel size = 3 × 3, 64 filters, stride 1, with bias term) followed by ReLU
6. Convolution (kernel size = 3 × 3, 64 filters, stride 1, with bias term) followed by ReLU
7. Convolution (kernel size = 3 × 3, 64 filters, stride 1, with bias term) followed by ReLU
8. Convolution (kernel size = 3 × 3, 64 filters, stride 1, with bias term) followed by ReLU
9. Convolution (kernel size = 3 × 3, 64 filters, stride 1, with bias term) followed by ReLU -continued 10. Convolution (kernel size = 3 × 3, 64 filters, stride 1, with bias term) followed by ReLU
11. Convolution (kernel size = 3 × 3, 64 filters, stride 1, with bias term) followed by ReLU
12. Convolution (kernel size = 3 × 3, 64 filters, stride 1, with bias term) followed by ReLU
13. Convolution (kernel size = 3 × 3, 64 filters, stride 1, with bias term) followed by ReLU
14. Convolution (kernel size = 3 × 3, 64 filters, stride 1, with bias term) followed by ReLU
15. Convolution (kernel size = 3 × 3, 64 filters, stride 1, with bias term) followed by ReLU
16. Convolution (kernel size = 3 × 3, 64 filters, stride 1, with bias term) followed by ReLU
17. Convolution (kernel size = 3 × 3, 64 filters, stride 1, with bias term) followed by ReLU
18. Convolution (kernel size = 3 × 3, 64 filters, stride 1, with bias term) followed by ReLU
19. Convolution (kernel size = 3 × 3, 64 filters, stride 1, with bias term) followed by ReLU
20. Convolution (kernel size = 3 × 3, 64 filters, stride 1, with bias term) followed by ReLU
21. Convolution (kernel size = 3 × 3, 1 filter, stride 1, with bias term)
22. Sum layer (Summation of layer (1) and layer (21))
23. Output: ($n_x$, $n_y$, 1)

FIGS. 20A-20D are illustrative diagrams of a process to generate training data to train a denoising neural network model, in accordance with some embodiments of the technology described herein. The examples of FIGS. 20A-20D are described herein in the context of MR imaging, but it should be appreciated that the examples of FIGS. 20A-20D could be applied to other medical imaging techniques as described herein.

The goal of denoising medical images is to recover an underlying clean image $x_{GT} = \mathcal{M}(\mathcal{A}(x))$ from the noisy medical image, $\tilde{x}$. If clean medical image data for the target domain is available, then a denoising neural network model $f_\theta$ can be learned through an empirical risk minimization framework:

$$R(\theta) = \mathbb{E}_{y \sim y} \mathbb{E}_{n \sim \mathcal{N}} \mathcal{L}(\mathcal{M}(y), f_\theta(\mathcal{M}(y+n)))$$

for some loss function, $\mathcal{L}$.

In some instances, however, one may need to train a denoising neural network model $f_\theta$ on a target domain, $X_T$, but only have access to clean data on a source domain, $X_S$, and noisy data on the target domain, $X_T$. Noisy data and images are denoted by $\widetilde{(.)}$ herein (e.g., $\tilde{X}_T \in \tilde{X}_T$). To address the lack of clean training data in the target domain, the inventors have developed a two-stage process to generate approximate training data in the target domain and to train the denoising neural network model using the generated training data. FIGS. 20A-20D illustrate this two-stage process. The first stage may be performed in various ways including using the process 2010 shown in FIG. 20A, using the process 2020 shown in FIG. 20B, or using both of the processes 2010 and 2020. The second stage may be performed in various ways including using the processes 2030 and 2040 shown in FIGS. 20C and 20D, respectively.

Figure 20A:
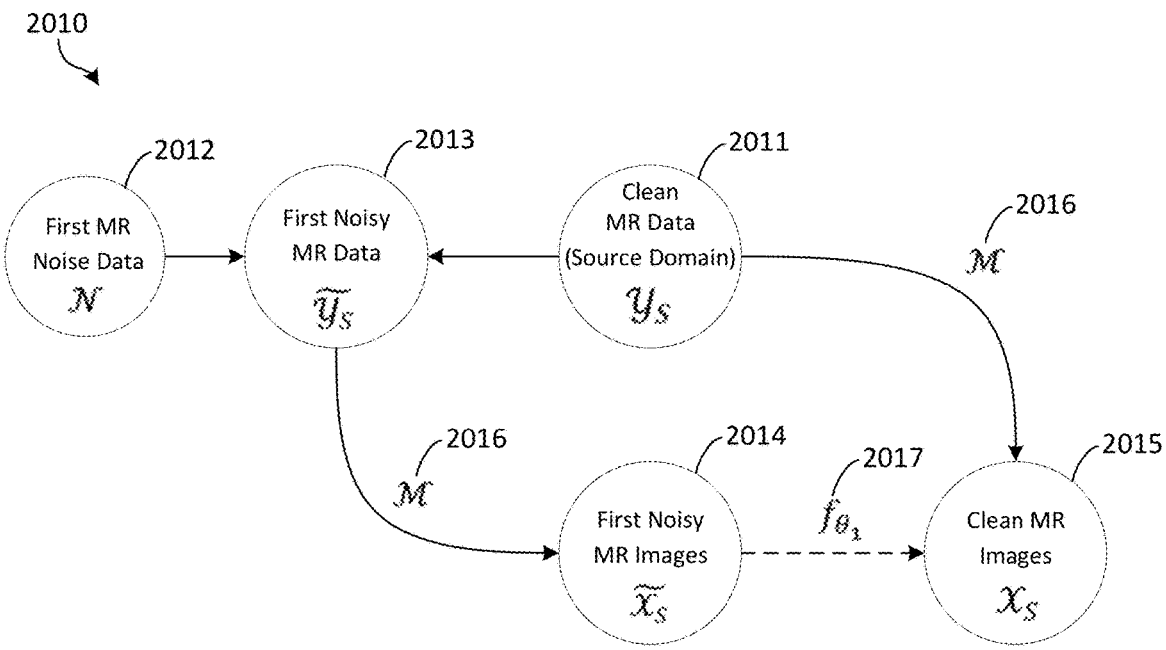
FIG. 20A is a diagram of an illustrative process 2010 to generate first training data to train a first neural network for denoising MR images, in accordance with some embodiments of the technology described herein.

FIG. 20A is a diagram of an illustrative process 2010 to generate first training data to train a first neural network for denoising medical images and to train the first neural network using the generated first training data, in accordance with some embodiments of the technology described herein. In process 2010, first training data is generated to train a first neural network model 2017, $f_{\theta_1}$, to denoise data in the source domain ($\tilde{X} \rightarrow X$).

In some embodiments, the first training data includes a first plurality of noisy MR images 2014, $\tilde{X}_S$, and a plurality of clean MR images 2015, $X_S$. The first training data may be generated using clean MR data associated with the source domain 2011, $Y_S$, and first MR noise data associated with the target domain 2012, $\mathcal{N}$. The clean MR data associated with the source domain 2011, $Y_S$, may be obtained, for example, from publicly-available research databases (e.g., of high-field MR images) or from other clinical acquisition of MR data in the source domain (e.g., using a source type of MRI system (e.g., a high-field MRI system), imaging a source portion of anatomy (e.g., a brain), using a source pulse sequence to acquire the MR data, etc.).

In some embodiments, the process 2010 may begin by generating first noisy MR data 2013, $\tilde{Y}_S$, using the clean MR data associated with the source domain 2011, $Y_S$, and the first MR noise data associated with the target domain 2012, $\mathcal{N}$. For example, data of the clean MR data associated with the source domain 2011, $\tilde{X}_S$, may be combined with data of the first MR noise data associated with the target domain 2012, $\mathcal{N}$, to generate the first noisy MR data 2013, $\tilde{Y}_S$.

In some embodiments, the first MR noise data associated with the target domain 2012, $\mathcal{N}$, may be generated in a similar manner as noise image 104 of FIGS. 1A and 1B. For example, the first MR noise data associated with the target domain 2012, $\mathcal{N}$, may be generated based on empirical measurements (e.g., by using the MRI system to measure noise within the MRI system without a patient present). For example, the first MR noise data associated with the target domain 2012, $\mathcal{N}$, may be generated by using the MRI system to measure noise within the MRI system without a patient present and by using a same pulse sequence (e.g., a diffusion weighted imaging (DWI) pulse sequence) as used to acquire the noisy MR data for denoising. Alternatively or additionally, the first MR noise data associated with the target domain 2012, $\mathcal{N}$, may be generated by simulating noise, as described herein. In some embodiments, the first MR noise data associated with the target domain 2012, $\mathcal{N}$, may be generated prior to imaging the subject (e.g., prior to acquiring the noisy MR data 1802).

In some embodiments, after generating the first noisy MR data 2013, $\tilde{Y}_S$, the plurality of clean MR images 2015, $X_S$, and the first plurality of noisy MR images 2014, $\tilde{X}_S$, may be generated. For example, and as shown in FIG. 20A, the plurality of clean MR images 2015, $X_S$, may be generated by applying a reconstruction procedure 2016, $\mathcal{M}$, to the clean MR data associated with the source domain 2011, $Y_S$. Similarly, the first plurality of noisy MR images 2014, $\tilde{X}_S$, may be generated by applying the reconstruction procedure 2016, $\mathcal{M}$, to the first noisy MR data 2013, $\tilde{Y}_S$. The reconstruction procedure 2016, $\mathcal{M}$, may be any suitable type of reconstruction procedure configured to transform the MR data from the spatial frequency domain to the image domain (e.g., as described in connection with FIGS. 18A and 18B herein).

In some embodiments, after generating the first plurality of noisy MR images 2014, $\tilde{X}_S$, and the plurality of clean MR images 2015, $X_S$, the first neural network model 2017, $f_{\theta_1}$, may be trained. For example, the first neural network model 2017, $f_{\theta_1}$, may be trained by providing, as input, correlated pairs of images of the first plurality of noisy MR images 2014, $\tilde{X}_S$, and the plurality of clean MR images 2015, $X_S$, so that the first neural network model 2017, $f_{\theta_1}$, may be trained in a supervised fashion.

Figure 20B:
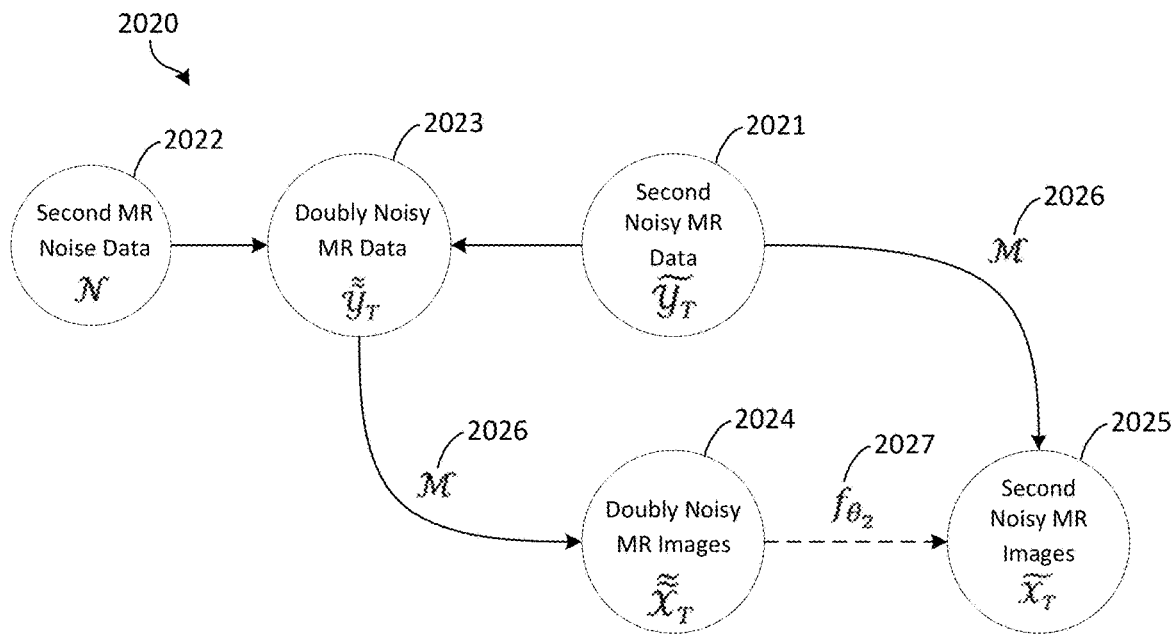
FIG. 20B is a diagram of an illustrative process 2020 to generate second training data to train a second neural network for denoising MR images, in accordance with some embodiments of the technology described herein.

FIG. 20B is a diagram of an illustrative process 2020 to generate second training data to train a second neural network for denoising MR images, in accordance with some embodiments of the technology described herein. In process 2020, second training data is generated to train a second neural network model 2027, $f_{\theta_2}$, to denoise doubly noisy data in the target domain ($\tilde{\tilde{\mathcal{X}}} \to \tilde{X}$). It should be appreciated that illustrative process 2020 is optional and may not be implemented in some embodiments.

In some embodiments, the second training data includes a plurality of doubly noisy MR images 2024, $\tilde{\tilde{\mathcal{X}}}_T$, and a second plurality of noisy MR images 2025, $\tilde{X}_T$. The second training data may be generated using second noisy MR data associated with the target domain 2021, $\tilde{Y}_T$, and second MR noise data associated with the target domain 2022, $\mathcal{N}$. The second noisy MR data associated with the target domain 2021, $\tilde{Y}_T$, may be obtained, for example, by clinical acquisition of MR data in the target domain (e.g., using a target type of MRI system (e.g., a low-field MRI system), imaging a target portion of anatomy (e.g., a limb, joint, appendage, etc.), using a target pulse sequence to acquire the MR data, etc.).

In some embodiments, the process 2020 may begin by generating doubly noisy MR data 2023, $\tilde{\tilde{y}}_T$, using the second noisy MR data associated with the target domain 2021, $\tilde{Y}_T$, and the second MR noise data associated with the target domain 2022, $\mathcal{N}$. For example, data of the second noisy MR data associated with the target domain 2021, $\tilde{Y}_T$, may be combined with data of the second MR noise data associated with the target domain 2022, $\mathcal{N}$, to generate the doubly noisy MR data 2023, $\tilde{\tilde{y}}_T$.

In some embodiments, the second MR noise data associated with the target domain 2022, $\mathcal{N}$, may be generated in a same manner or may be the same noise data as the first MR noise data associated with the target domain 2012, $\mathcal{N}$, of FIG. 20A. In some embodiments, the second MR noise data associated with the target domain 2022, $\mathcal{N}$, may be generated in a different manner or may comprise different data than the first MR noise data associated with the target domain 2012, $\mathcal{N}$. In some embodiments, the second MR noise data associated with the target domain 2022, $\mathcal{N}$, may be generated prior to imaging the subject (e.g., prior to acquiring the noisy MR data 1802).

In some embodiments, after generating the doubly noisy MR data 2023, $\tilde{\tilde{y}}_T$, the second plurality of noisy MR images 2025, $\tilde{X}_T$, and the plurality of doubly noisy MR images 2024, $\tilde{\tilde{\mathcal{X}}}_T$, may be generated. For example, and as shown in FIG. 20B, the second plurality of noisy MR images 2025, $\tilde{X}_T$, may be generated by applying a reconstruction procedure 2026, $\mathcal{M}$, to the second noisy MR data associated with the target domain 2021, $\tilde{Y}_T$. Similarly, the plurality of doubly noisy MR images 2024, $\tilde{\tilde{\mathcal{X}}}_T$, may be generated by applying the reconstruction procedure 2026, $\mathcal{M}$, to the doubly noisy MR data 2023, $\tilde{\tilde{y}}_T$. The reconstruction procedure 2026, $\mathcal{M}$, may be any suitable type of reconstruction procedure configured to transform the MR data from the spatial frequency domain to the image domain (e.g., as described in connection with FIGS. 18A and 18B herein).

In some embodiments, after generating the plurality of doubly noisy MR images 2024, $\tilde{\tilde{\mathcal{X}}}_T$, and the second plurality of noisy MR images 2025, $\tilde{X}_T$, the second neural network model 2027, $f_{\theta_2}$, may be trained. For example, the second neural network model 2027, $f_{\theta_2}$, may be trained by providing, as input, correlated pairs of images of the plurality of doubly noisy MR images 2024, $\tilde{\tilde{\mathcal{X}}}_T$, and the second plurality of noisy MR images 2025, $\tilde{X}_T$.

Figure 20C:
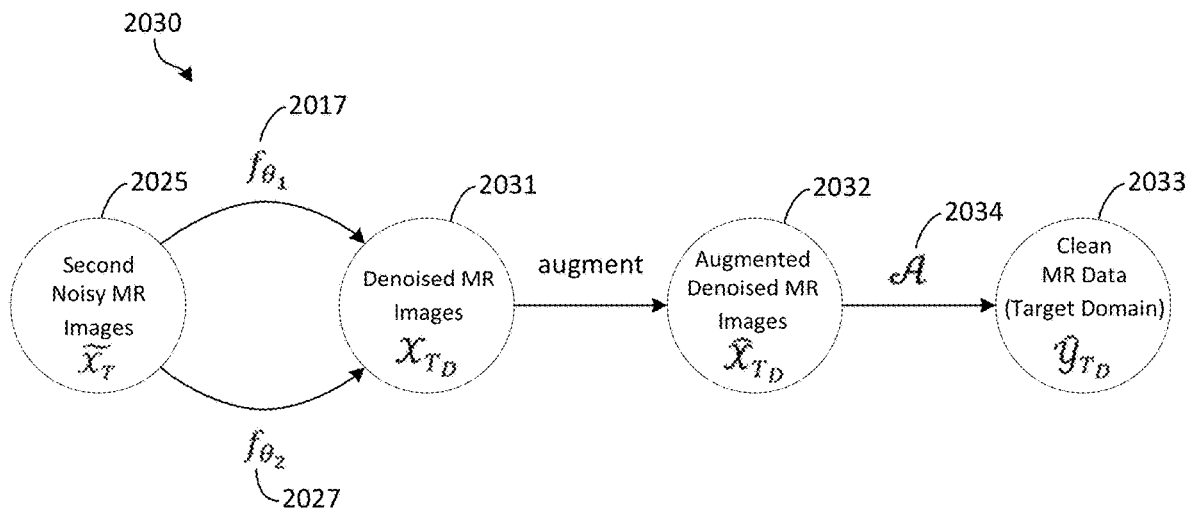
FIG. 20C is a diagram of an illustrative process to generate clean MR data associated with the target domain, in accordance with some embodiments of the technology described herein.

FIG. 20C is a diagram of an illustrative process 2030 to generate clean MR data associated with the target domain, in accordance with some embodiments of the technology described herein. After the first neural network model 2017, $f_{\theta_1}$, and optionally the second neural network model 2027, $f_{\theta_2}$, are trained as described in connection with FIGS. 20A and 20B, the process 2030 applies the first neural network model 2017, $f_{\theta_1}$, and optionally the second neural network model 2027, $f_{\theta_2}$, to noisy MR images associated with the target domain (e.g., to the second plurality of noisy MR images 2025, $\tilde{X}_T$) to generate corresponding denoised MR images and data.

In some embodiments, generating the training data for training the denoising neural network model comprises applying the first neural network model 2017, $f_{\theta_1}$, to the second plurality of noisy MR images 2025, $\tilde{X}_T$, to generate a plurality of denoised MR images 2031, $X_{T_D}$. Optionally, in some embodiments, generating the training data for training the denoising neural network model further comprises applying the second neural network model 2027, $f_{\theta_2}$, to the second plurality of noisy MR images 2025, $\tilde{X}_{T_D}$. In such embodiments, generating the plurality of denoised MR images 2031, $X_{T_D}$, may comprise combining the outputs of the first neural network model 2017, $f_{\theta_1}$, and of the second neural network model 2027, $f_{\theta_2}$. For example, the plurality of denoised MR images 2031, $X_{T_D}$, may be expressed as a union of the denoised MR images output by the first neural network model 2017, $f_{\theta_1}$, and the denoised MR images output by the second neural network model 2027, $f_{\theta_2}$: $X_{T_D} = f_{\theta_1}(\tilde{X}_T) \cup f_{\theta_2}(\tilde{X}_T)$.

In some embodiments, after generating the plurality of denoised MR images 2031, $X_{T_D}$, the process 2030 may next include transforming the plurality of denoised MR images 2031, $X_{T_D}$, to generate a plurality of augmented denoised MR images 2032, $\hat{X}_{T_D}$, to ensure that there is a sufficient number of images in the generated training data for training the denoising neural network model. For example, a transformation configured to sharpen the denoised MR images 2031, $X_{T_D}$, may be applied to the plurality of denoised MR images 2031, $X_{T_D}$, to generate sharpened MR images. Thereafter, the sharpened MR images may be added to the plurality of denoised MR images 2031, $X_{T_D}$, to generate the plurality of augmented denoised MR images 2032, $\hat{X}_{T_D}$. Alternatively or additionally, transformations such as a rotation, cropping, horizontal and/or vertical flipping, or any other suitable transformation may be applied to the denoised MR images 2031, $X_{T_D}$, to generate the plurality of augmented denoised MR images 2032, $\hat{X}_{T_D}$. As another example, the brightness and/or contrast of an image may be changes to generate new images for the plurality of augmented denoised MR images 2032, $\hat{X}_{T_D}$. Additionally, and as another example, a complex conjugate transformation may be applied to the spatial frequency data to symmetrize the matrices or replace one or more matrix with its complex conjugate transpose in the spatial frequency domain to generate new images for the plurality of augmented denoised MR images 2032, $\hat{X}_{T_D}$. Some of these transformations may be used alone or in combination with other transformations including the ones described above and/or any other suitable transformations.

In some embodiments, the process 2030 may next include applying a transformation 2034, $\mathcal{A}$, to the plurality of augmented denoised MR images 2032, $\hat{X}_{T_D}$, to transform the augmented denoised MR images 2032, $\hat{X}_{T_D}$, from the image domain to the spatial frequency domain and to generate clean MR data associated with the target domain 2033, $\hat{Y}_{T_D}$. The transformation 2034, $\mathcal{A}$, may be, for example, a nonuniform transform configured to transform the augmented denoised MR images 2032, $\hat{X}_{T_D}$, from the image domain to the spatial frequency domain. It should be appreciated that the transformation 2034, $\mathcal{A}$, may be any other suitable transformation configured to transform the augmented denoised MR images 2032, $\hat{X}_{T_D}$, from the image domain to the spatial frequency domain, as aspects of the technology described herein are not limited in this respect.

Figure 20D:
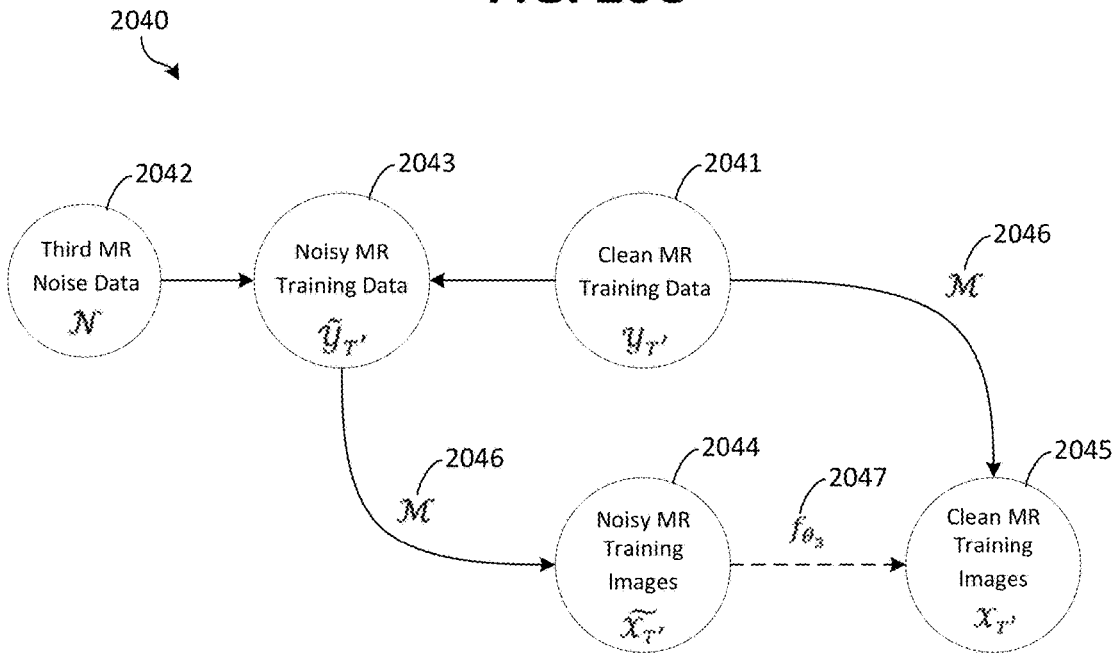
FIG. 20D is a diagram of an illustrative process to generate training data for training the denoising neural network model, in accordance with some embodiments of the technology described herein.

FIG. 20D is a diagram of an illustrative process 2040 to generate training data for training the denoising neural network model, in accordance with some embodiments of the technology described herein. Process 2040 may begin by generating clean MR training data 2041, $\tilde{X}_{T'}$, from the clean MR data associated with the target domain 2033, $\hat{Y}_{T_D}$. For example, the clean MR data associated with the target domain 2033, $\hat{Y}_{T_D}$, may be combined with the clean MR data associated with the source domain 2011, $\tilde{X}_S$, to generate the clean MR training data 2041, $\tilde{X}_{T'}$. In some embodiments, the clean MR data associated with the target domain 2033, $\hat{Y}_{T_D}$, may be combined with the clean MR data associated with the source domain 2011, $\tilde{X}_S$, through a union of the two datasets: $\tilde{X}_{T'} = \tilde{X}_S \cup \hat{Y}_{T_D}$.

In some embodiments, the training data for training the denoising neural network model 2047, $f_{\theta_3}$, includes a plurality of noisy MR training images 2044, $\tilde{Y}_{T'}$, and a plurality of clean MR training images 2045, $X_{T'}$. The training data for training the denoising neural network model 2047, $f_{\theta_3}$, may be generated using the clean MR training data 2041, $\tilde{X}_{T'}$, and third MR noise data associated with the target domain 2042, $\mathcal{N}$.

In some embodiments, the process 2040 may begin by generating noisy MR training data 2043, $\tilde{Y}^{T'}$, using the clean MR training data 2041, $\tilde{X}_{T'}$, and the third MR noise data associated with the target domain 2042, $\mathcal{N}$. For example, data of the clean MR training data 2041, $\tilde{X}_{T'}$, may be combined with data of the third MR noise data associated with the target domain 2042, $\mathcal{N}$, to generate the noisy MR training data 2043, $\tilde{Y}_{T'}$.

In some embodiments, the third MR noise data associated with the target domain 2042, $\mathcal{N}$, may be generated in a same manner or may be the same noise data as the first MR noise data associated with the target domain 2012, $\mathcal{N}$, of FIG. 20A, or in a same manner or may be the same noise data as the second MR noise data associated with the target domain 2022, $\mathcal{N}$, of FIG. 20B. In some embodiments, the third MR noise data associated with the target domain 2042, $\mathcal{N}$, may be generated in a different manner or may comprise different data than the first MR noise data associated with the target domain 2012, $\mathcal{N}$, or in a different manner or may comprise different data than the second MR noise data associated with the target domain 2022, $\mathcal{N}$. In some embodiments, the third MR noise data associated with the target domain 2042, $\mathcal{N}$, may be generated prior to imaging the subject (e.g., prior to acquiring the noisy MR data 1802).

In some embodiments, after generating the noisy MR training data 2043, $\tilde{Y}_{T'}$, the plurality of clean MR training images 2045, $X_{T'}$, and plurality of noisy MR training images 2044, $\tilde{X}_{T'}$, may be generated. For example, and as shown in FIG. 20D, the plurality of clean MR training images 2045, $X_{T'}$, may be generated by applying a reconstruction procedure 2046, $\mathcal{M}$, to the clean MR training data 2041, $\tilde{X}_{T'}$. Similarly, the plurality of noisy MR training images 2044, $\tilde{X}_{T'}$, may be generated by applying the reconstruction procedure 2046, $\mathcal{M}$, to the noisy MR training data 2043, $\tilde{Y}_{T'}$. The reconstruction procedure 2046, $\mathcal{M}$, may be any suitable type of reconstruction procedure configured to transform the MR data from the spatial frequency domain to the image domain (e.g., as described in connection with FIGS. 18A and 18B herein).

In some embodiments, after generating the plurality of noisy MR training images 2044, $\tilde{X}_{T'}$, and the plurality of clean MR training images 2045, $X_{T'}$, the denoising neural network model 2047, $f_{\theta_3}$, may be trained using the training data for training the denoising neural network model 2047, $f_{\theta_3}$. For example, the denoising neural network model 2047, $f_{\theta_3}$, may be trained by providing, as input, correlated pairs of images of the plurality of noisy MR training images 2044, $\tilde{X}_{T'}$, and the plurality of clean MR training images 2045, $X_{T'}$.

Figure 21:
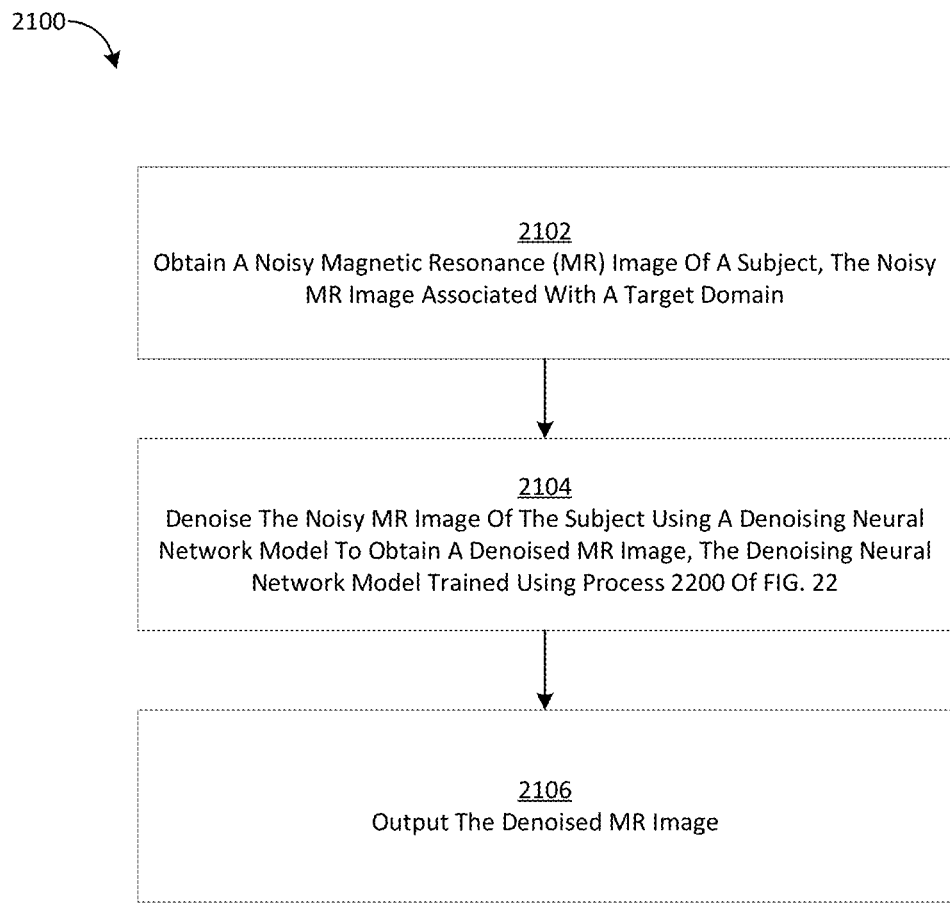
FIG. 21 is a flowchart of an illustrative process 2100 for generating a denoised MR image of a subject using a denoising neural network model, in accordance with some embodiments of the technology described herein.

FIG. 21 is a flowchart of an illustrative process 2100 for generating a denoised MR image of a subject using a denoising neural network model, in accordance with some embodiments of the technology described herein. Process 2100 may be executed using any suitable computing device. For example, in some embodiments, the process 2100 may be performed by a computing device co-located (e.g., in the same room) as the medical imaging device. As another example, in some embodiments, the process 2100 may be performed by one or more processors located remotely from the medical imaging device (e.g., as part of a cloud computing environment). It should be appreciated that while process 2100 is described in connection with MR images and MRI systems, process 2100 is applicable to any suitable type of medical image and medical imaging device, as aspects of the technology described herein are not limited in this respect.

Process 2100 may begin with act 2102, in some embodiments. In act 2102, a noisy MR image of a subject associated with a target domain may be obtained. The noisy MR image of the subject may be obtained from an MRI system (e.g., any MRI system as described herein). For example, the noisy MR image of the subject may be obtained by collecting noisy MR data using the MRI system (e.g., by imaging the subject) and then generating the noisy MR image of the subject based on the collected noisy MR data (e.g., as described in connection with FIGS. 18A and 18B herein). In some embodiments, wherein the noisy MR data may be collected by an MRI system using a DWI pulse sequence. It should be appreciated that the noisy MR image may be of any suitable subject anatomy (e.g., brain, neck, spine, knee, etc.), as aspects of the technology described herein are not limited in this respect.

Alternatively, in some embodiments, obtaining the noisy MR image of the subject may include accessing, from computer storage, data collected by the MRI system and generating the noisy MR image of the subject using the accessed data. Alternatively, the noisy MR image of the subject may be generated prior to the start of process 2100 and accessed from computer storage.

In some embodiments, the noisy MR image of the subject may be associated with a suitable target domain. The target domain may describe the source of noisy MR image data provided as input to the denoising neural network model for denoising, whereas the source domain may describe the source of MR image data used to generate the training data for training the denoising neural network model. For example, the clean MR image data associated with the source domain may comprise MR data that is collected by imaging a first portion of anatomy (e.g., the brain) while the noisy MR image data associated with the target domain may comprise MR data that is collected by imaging a second portion of anatomy (e.g., a limb, joint, torso, pelvis, appendage, etc.) different than the first portion of the anatomy. As another example, the clean MR image data associated with the source domain may comprise MR data that is collected using a first type of MRI system (e.g., a high-field MRI system) while the noisy MR data associated with the target domain may comprise MR data that is collected using a second type of MRI system (e.g., a low-field MRI system) different than the first type of MRI system. As another example, the clean MR data associated with the source domain may comprise MR data that is collected using a first pulse sequence (e.g., a fast spin echo (FSE) pulse sequence, a fluid-attenuated inversion recovery (FLAIR) pulse sequency, a diffusion-weighted imaging (DWI) pulse sequence, a steady-state free precession (SSFP) pulse sequence, or any other suitable pulse sequence) while the noisy MR data associated with the target domain may comprise MR data that is collected using a second pulse sequence different than the first imaging pulse sequence.

After act 2102, process 2100 may proceed to act 2104 in some embodiments. In act 2104, the noisy MR image of the subject may be denoised using a denoising neural network model to obtain a denoised MR image. The denoising neural network model may comprise a plurality of layers (e.g., convolutional layers, in some embodiments). The denoising neural network model may be trained, for example, as described in connection with FIGS. 20A-20D and/or FIG. 22 herein.

In some embodiments, denoising the noisy MR image using the denoising neural network model may comprise the denoising neural network model generating the denoised MR image directly. Alternatively, in some embodiments, the denoising neural network model may generate denoising information that may be used to generate the denoised MR image. For example, the denoising information may indicate which noise is to be removed from the noisy MR image such that generating the denoised MR image may be performed by subtracting the denoising information from the noisy MR image.

After performing act 2104, the process 2100 may proceed to act 2106 in some embodiments. In act 2106, the denoised MR image may be output. The denoised MR image may be output using any suitable method. For example, the denoised MR image may be output by being saved for subsequent access, transmitted to a recipient over a network, and/or displayed to a user of the MRI system.

Figure 22:
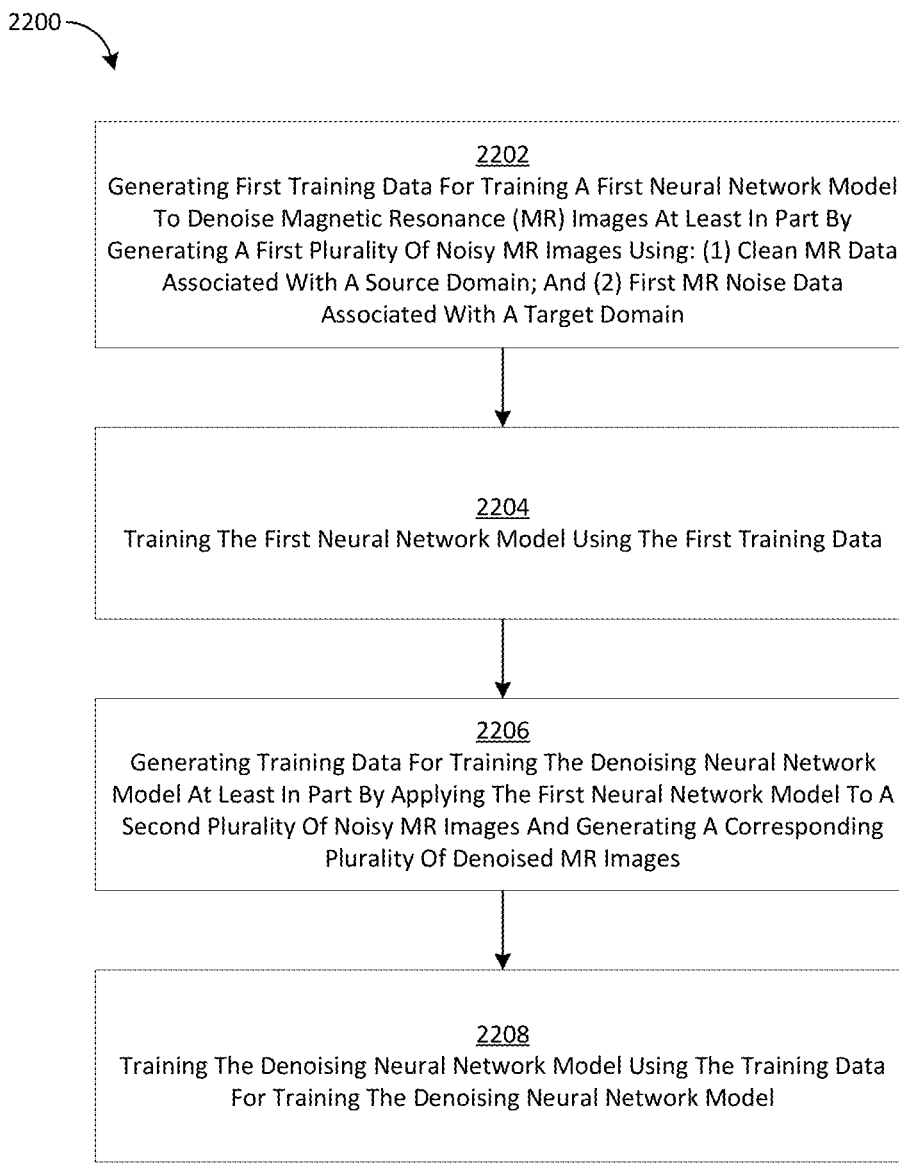
FIG. 22 is a flowchart of an illustrative process 2200 for training a denoising neural network model, in accordance with some embodiments of the technology described herein.

FIG. 22 is a flowchart of an illustrative process 2200 for training a denoising neural network model, in accordance with some embodiments of the technology described herein. Process 2200 may be executed using any suitable computing device. For example, in some embodiments, the process 2200 may be performed by a computing device co-located (e.g., in the same room) as the medical imaging device. As another example, in some embodiments, the process 2200 may be performed by one or more processors located remotely from the medical imaging device (e.g., as part of a cloud computing environment). It should be appreciated that while process 2200 is described in connection with MR images and MRI systems, process 2200 is applicable to any suitable type of medical image and medical imaging device, as aspects of the technology described herein are not limited in this respect.

In some embodiments, process 2200 begins with act 2202. In act 2202, first training data for training a first neural network model to denoise MR images may be generated. The first training data may comprise a first plurality of noisy MR images and a corresponding plurality of clean MR images. The first training data may be generated at least in part by generating a first plurality of noisy MR images using: (1) clean MR data associated with a source domain and (2) first MR noise data associated with a target domain.

For example, in some embodiments, generating the first training data may comprise generating first noisy MR data using clean MR data associated with the source domain and first MR noise data associated with the target domain. Thereafter, the first plurality of noisy MR images and the plurality of clean MR images may be generated by applying a reconstruction procedure to the first noisy MR data and to the clean MR data associated with the source domain, respectively. The reconstruction procedure may be any suitable reconstruction procedure configured to transform the MR data from the spatial frequency domain to the image domain. For example, the reconstruction procedure may be any reconstruction procedure as described in connection with FIGS. 18A and 18B herein.

After act 2202, process 2200 may proceed to act 2204 in some embodiments. In act 2204, the first neural network model may be trained using the first training data. For example, the first neural network model may be trained in a supervised manner by providing the first neural network model with corresponding pairs of MR images of the first training data (e.g., pairs of images of the first plurality of noisy MR images and the plurality of clean MR images).

In some embodiments, acts 2202 and 2204 may optionally include generating second training data to train a second neural network model and training the second neural network model, respectively. The second training data may include a second plurality of noisy MR images and a plurality of doubly noisy MR images. The second training data may be generated by generating the plurality of doubly noisy MR images using: (1) second noisy MR data associated with the target domain and (2) second MR noise data associated with the target domain.

For example, in some embodiments, generating the second training data may be performed by first generating doubly noisy MR data using the second noisy MR data associated with the target domain and the second MR noise data associated with the target domain. Thereafter, the plurality of doubly noisy MR images and the second plurality of noisy MR images may be generated by applying a reconstruction procedure to the doubly noisy MR data and to the second noisy MR data associated with the target domain, respectively.

After generating the second training data, the process 2200 may optionally proceed to train the second neural network model using the second training data. For example, the second neural network model may be trained by providing the second neural network model with corresponding pairs of MR images of the second training data (e.g., pairs of images of the second plurality of noisy MR images and the plurality of doubly noisy MR images).

After act 2204, process 2200 may proceed to act 2206 in some embodiments. In act 2206, training data for training the denoising neural network model may be generated. The training data for training the denoising neural network model may be generated by applying the first neural network model to a second plurality of noisy MR images and generating a corresponding plurality of denoised MR images.

In some embodiments where the second training data is optionally generated and the second neural network model is optionally trained, the training data for training the denoising neural network model may be further generated by applying the second neural network model to the second plurality of noisy MR images. Applying the second neural network model to the second plurality of noisy MR images may generate another corresponding plurality of denoised MR images. In such embodiments, the training data for training the denoising neural network model may be generated by combining the plurality of denoised MR images generated by the first neural network model with the plurality of denoised MR images generated by the second neural network model. For example, the training data for training the denoising neural network model may be generated as a union of the plurality of denoised MR images generated by the first neural network model with the plurality of denoised MR images generated by the second neural network model.

After act 2206, process 2200 may proceed to act 2208 in some embodiments. In act 2208, the denoising neural network model may be trained using the training data for training the denoising neural network model. For example, the denoising neural network model may be trained by providing the denoising neural network model with corresponding pairs of MR images of the training data for training the denoising neural network model.

To test the efficacy of the training methods described herein in FIGS. 18A-22, simulation-based studies were performed. Three-dimensional brain MR images were randomly selected from the Human Connectome Project, 505 of which were T1-weighted and 125 of which were T2-weighted. The selected images were resampled to 1.5× 1.5×5 mm³ to simulate the resolution found in clinical settings. A two-dimensional, non-Cartesian multi-coil data acquisition was considered. Coil sensitivity profiles S were analytically generated, the coil correlation matrix P was randomly generated, and the variable density sampling pattern was used for the sampling matrix A. Additive Gaussian noise (n~$\mathcal{N}$ (0, σI)) was added to each of the images such that the standard deviation of the noise in k-space was set to σ after the prewhitening step.

In a first experiment, a scenario in which a large number of source images, but only a small number of noisy target images, is available was designed. Five hundred T1-weighted MR volumes were used for the source domain and 20 noisy T2-weighted MR volumes were used for the target domain. Five cases were used for the validation set and 100 T2-weighted volumes were reserved for testing. A value of σ=0.05 was used for training, and the denoising neural network model was evaluated at σ=0.05, 0.1.

In a second experiment, the training methods described herein with reference to FIGS. 18A-22 were applied to denoising diffusion-weighted MR images acquired at 64 mT using the MRI system described in connection with FIGS. 14-17 herein. The diffusion-weighted images (b=860) were acquired using an eight-channel RF receive coil array, three-dimensional Cartesian sampling, and variable density for two phase encoding directions. The resolution of the acquired images was 2.2×2.2×6 mm³. The source domain dataset was acquired from the Human Connectome Project and included 400 T1-weighted and T2-weighted images. The target domain dataset included 400 T1-weighted, T2-weighted, and FLAIR images acquired at 64 mT using an MRI system as described in connection with FIGS. 14-17.

For comparison, denoising neural network models were prepared using the following training methods: Noise2Self (N2S), Noisier2Noise (Nr2N), supervised learning using T1-weighted images (Sup-T1), supervised learning using T2-weighted images (Sup-T2). For the Nr2N, the denoising neural network model was trained to predict images at σ=0.05 from an input with a noise level of σ=0.1. A bias-free U-net was used for all denoising neural network models, and for the supervised models, $\ell_1$ loss was used. All models were trained using a batch size of 32 and Adam with α=3×10' for 150,000 iterations.

For the training methods described herein with reference to FIGS. 18A-22, two training data generation approaches were implemented. A first model (Sup-FT-S) was trained using a training dataset generated using the trained Sup-T1 model. The Sup-T1 model was used to generate 20 available noisy T2-weighted images, which were added to the training dataset. For data augmentation, image sharpening with random Gaussian kernels was used. A second model (Sup-FT-N) was trained in the same manner as Sup-FT-S but using the output of Nr2N. Each training took approximately 17 hours, and all methods were implemented in Tensorflow.

The mean squared error (MSE), peak signal-to-noise ratio (PSNR), and structured similarity index measure (SSIM) in the foreground of the test images is reported in Table 1 for Noise2Self (N2S), Noisier2Noise (Nr2N), supervised learning using T1-weighted images (Sup-T1), supervised learning using T2-weighted images (Sup-T2), two-stage learning with training images generated by Sup-T1 (Sup-FT-S), and two-stage learning with training images generated by Nr2N (Sup-FT-N).

TABLE 1

Quantitative results for 100 T2-weighted test images with realistic MRI noise. MSEs are scaled by $10^6$. All losses are computed in the foreground of the images.

| Methods | σ = 0.05 | | | σ = 0.1 | | |
|---|---|---|---|---|---|---|
| | MSE | SSIM | PSNR | MSE | SSIM | PSNR |
| N2S | 5.088 | 0.881 | 29.062 | 5.087 | 0.882 | 28.518 |
| Nr2N | 1.447 | 0.956 | 34.879 | 3.501 | 0.900 | 33.499 |
| Sup-T1 | 1.486 | 0.956 | 39.124 | 3.636 | 0.898 | 33.256 |
| Sup-FT-S | 1.402 | 0.957 | 39.428 | 3.4598 | 0.904 | 33.497 |
| Sup-FT-N | 1.356 | 0.959 | 38.910 | 3.343 | 0.909 | 33.633 |
| Sup-T2 | 1.286 | 0.961 | 39.568 | 3.361 | 0.905 | 33.585 |

Figure 23:
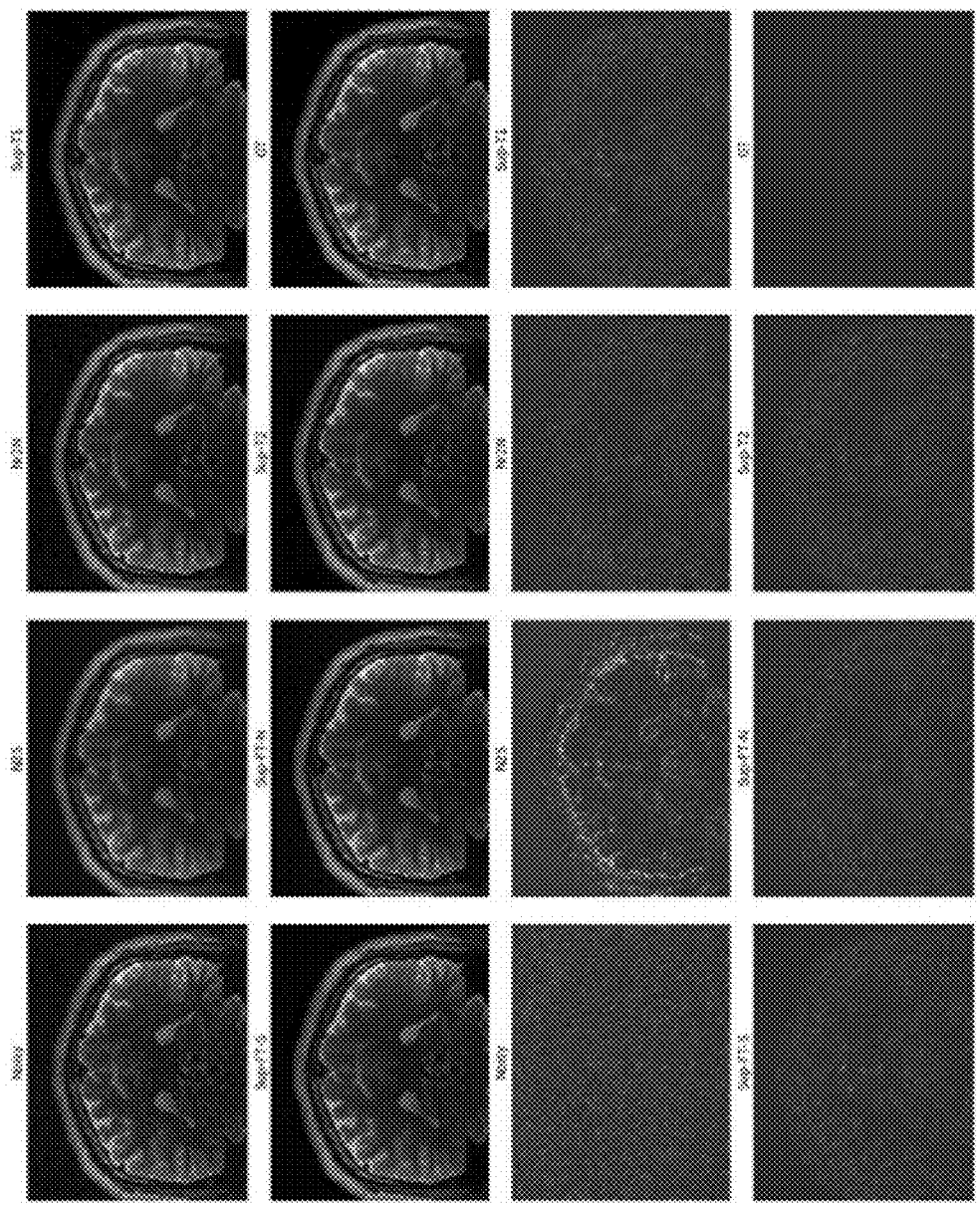
FIG. 23 shows examples of denoised MR images and corresponding noise maps for MR images denoised using different denoising techniques, in accordance with some embodiments of the technology described herein.
Figure 24A:
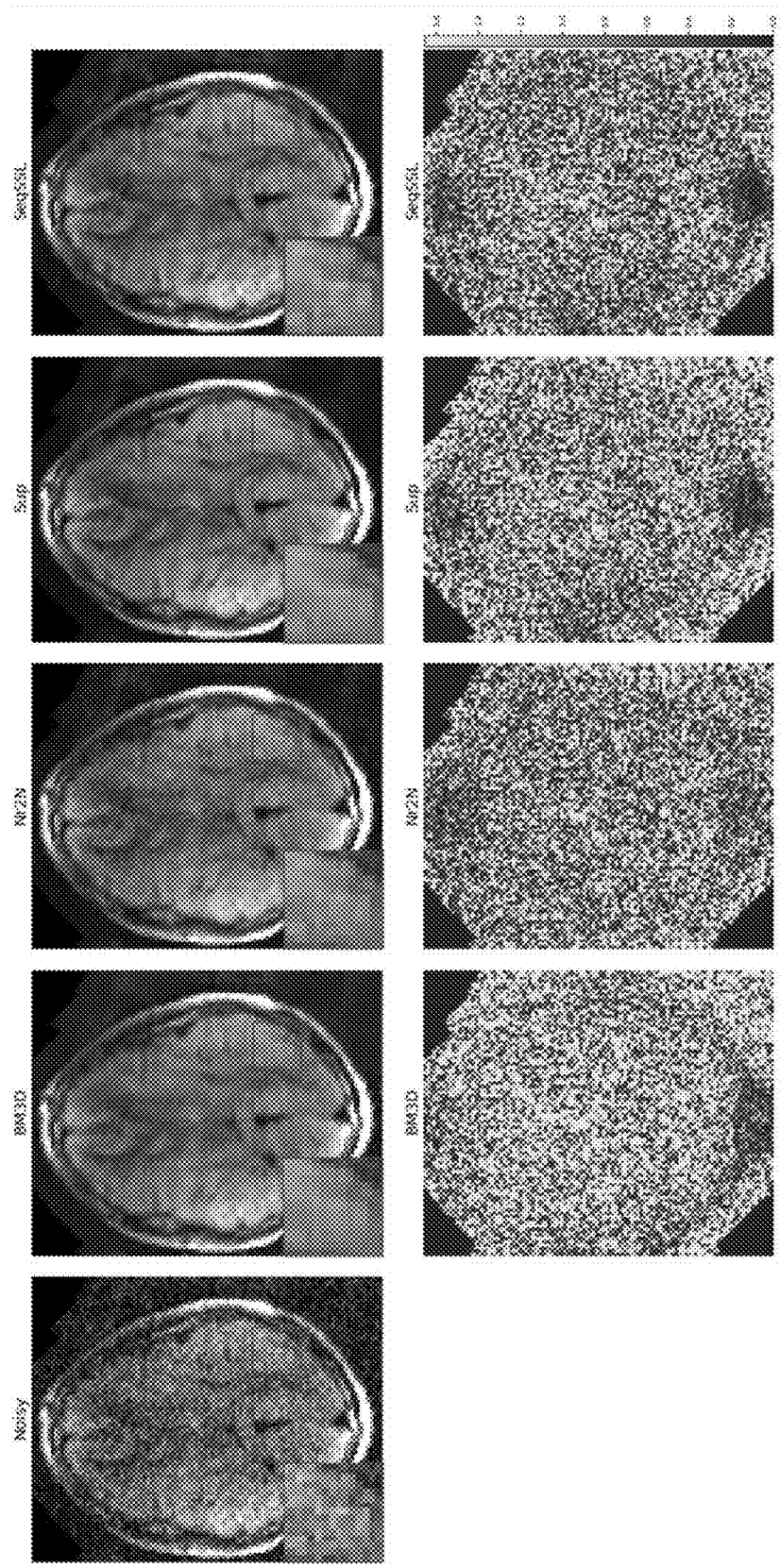
FIGS. 24A-24D show examples of denoised MRI images acquired using a diffusion weighted imaging (DWI) pulse sequence and corresponding noise maps for MR images denoised using different denoising techniques, in accordance with some embodiments of the technology described herein.
Figure 24B:
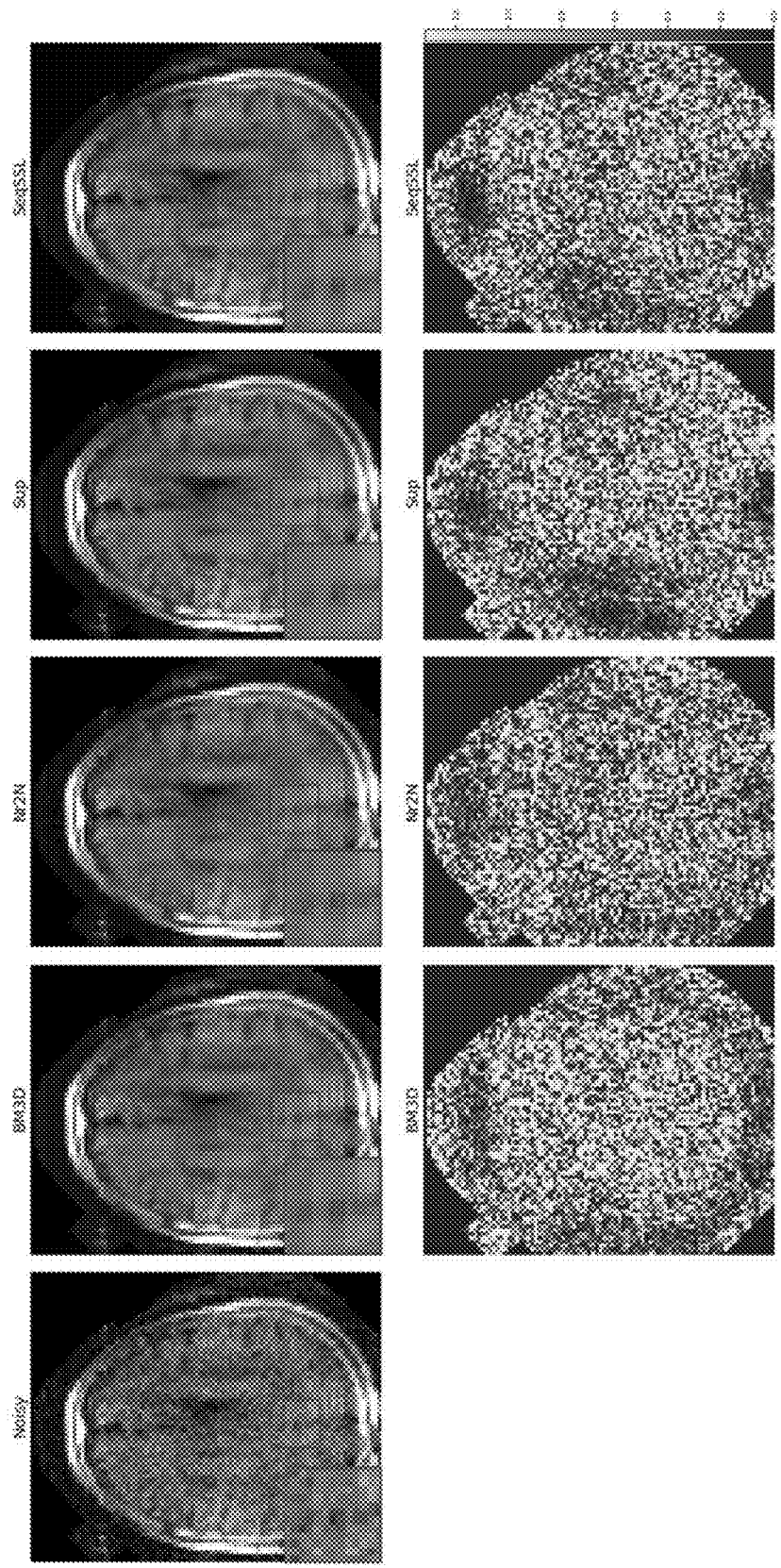
Figure 24C:
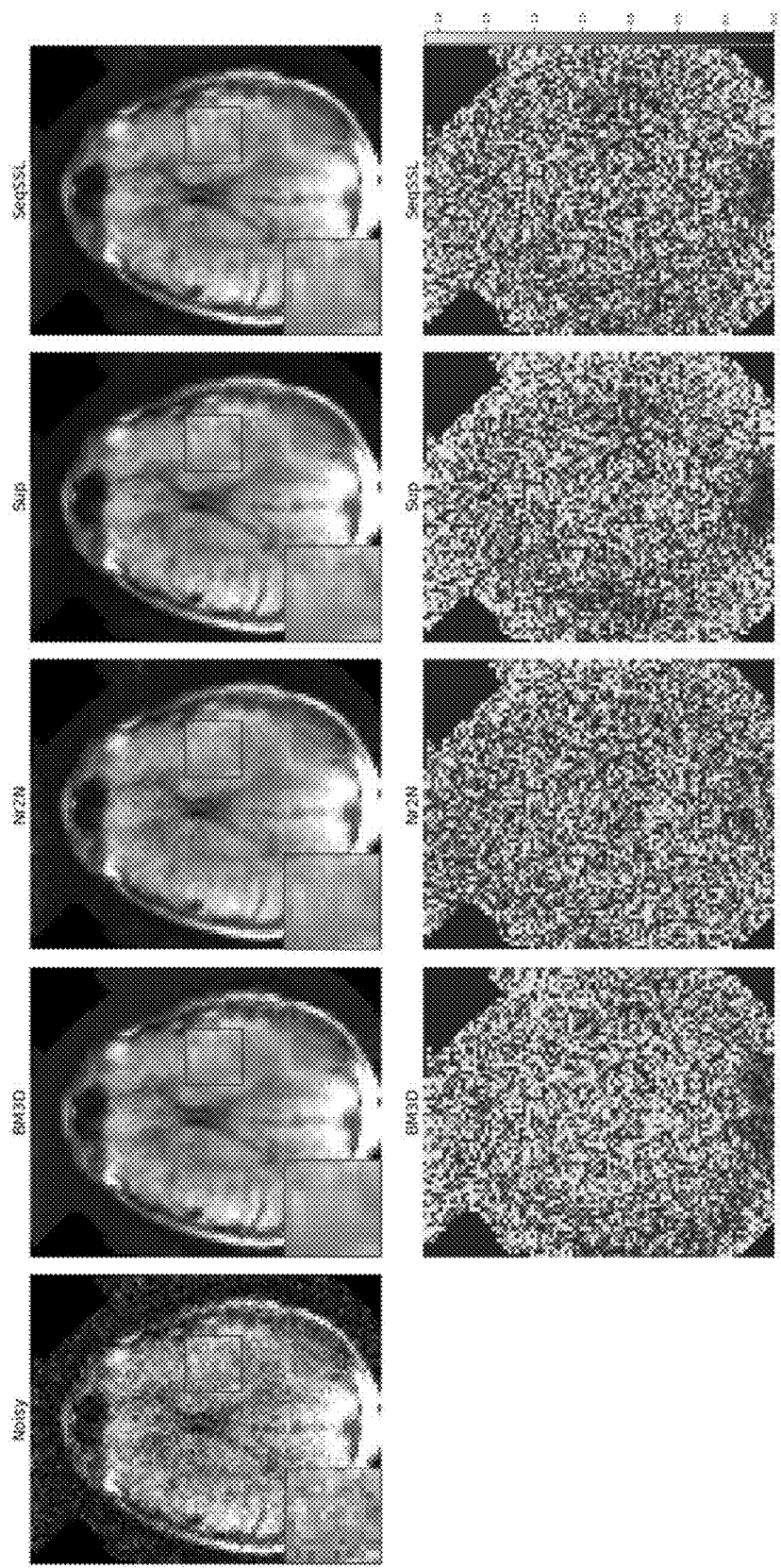
Figure 24D:
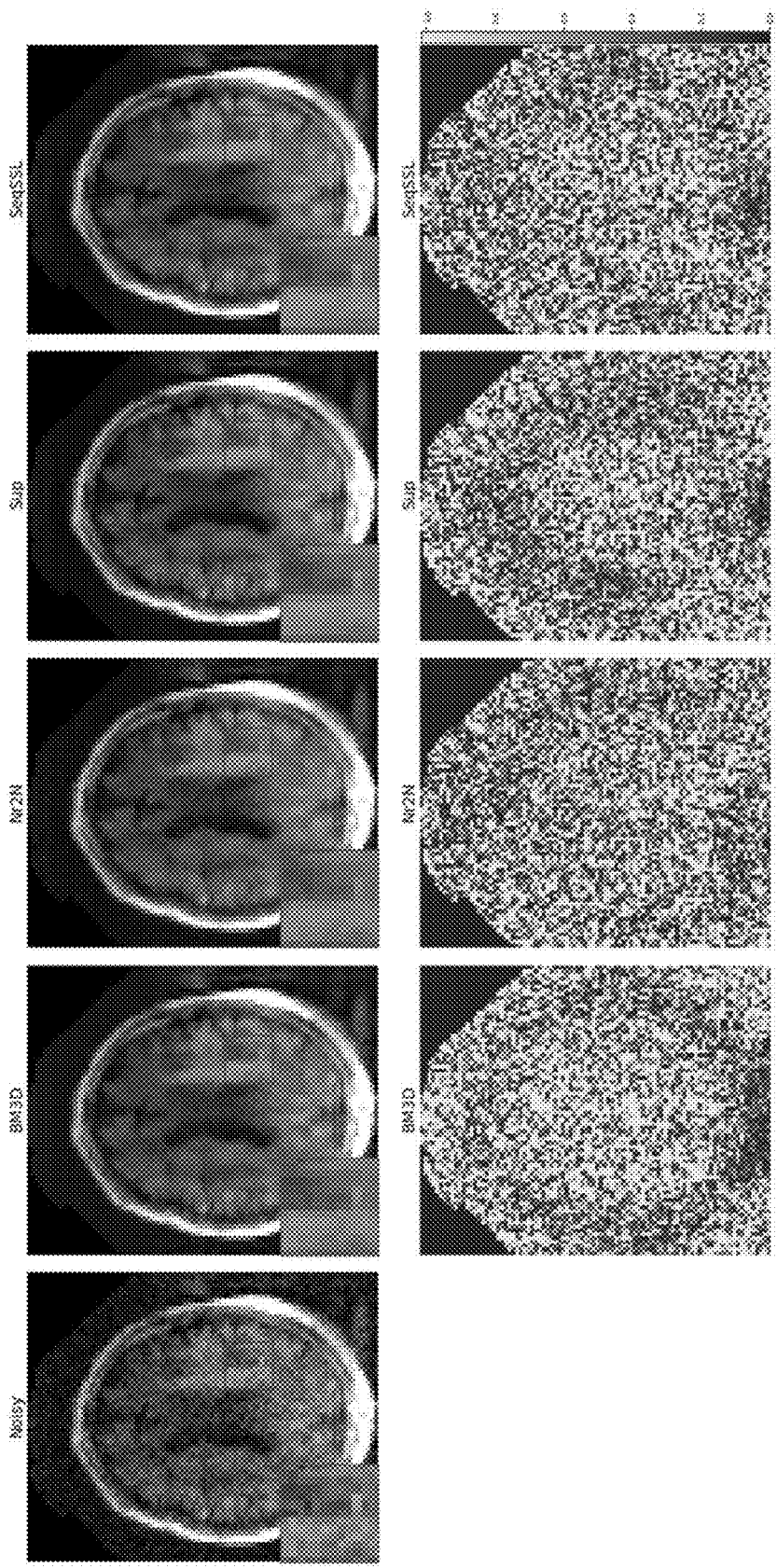

Examples of denoised MR images and corresponding noise maps for each of these models are shown in FIG. 23. The MR images are T2-weighted images that were generated with σ=0.05. The upper two rows show the MR images including the noise-corrupted image ("Noisy") provided to each of the models for denoising and the ground truth image ("GT") used to generate the noise-corrupted image. The MR images output by the N2S, Nr2N, Sup-T1, Sup-FT-S, Sup-FT-N, and Sup-T2-trained denoising neural network models are provided. Corresponding noise maps for each of the MR images are provided in the bottom two rows of FIG. 23. Qualitatively, a checkerboard pattern can be observed in the MR image generated by the N2S-trained model, and the Nr2N-trained model amplified background noise. Artefacts were considerably reduced in Sup-FT-S and Sup-Ft-N FIGS. 24A-24D show examples of denoised MRI images acquired using a DWI pulse sequence and generated using different denoising techniques along with their corresponding noise maps. Each of FIGS. 24A-24D shows a noisy MR image ("Noisy") generated from MR data acquired using a DWI pulse sequence and a set of four denoised MR images generated from the noisy MR image using denoising neural network model trained in four different ways. The inset in each MR image shows a zoomed-in version of a portion of the brain. The four training methods include Block-Matching and 3D filtering, aspects of which are described in "Image Denoising by Sparse 3D Transform-Domain Collaborative Filtering," by K. Dabov, et. al., in *IEEE Transactions on Image Processing*, vol. 16, no. 8, pp. 2080-2095, August 2007, which is incorporated by reference herein in its entirety. The four training methods also include Nr2N, as described above, and supervised learning (Sup) based on pairs of training images. The four training methods further include and sequential semi-supervised learning (SeqSSL) which is the two-stage training process as described in connection with FIGS. 20A-20D herein. Qualitatively, the Nr2N-trained model produced blurrier images, while the Sup-trained model resulted in images with over-smoothing. The proposed training method offered the best compromise and improved the excessive over-smoothing seen in the Sup-trained model.

As an alternative to the training process described in connection with FIGS. 18A-22 herein, the inventors have recognized and appreciated that approximate training data may additionally be generated to train a reconstruction neural network model to perform image reconstruction and denoising of noisy images. FIGS. 25A-25D are illustrative diagrams of a two-stage process to generate training data to train a single reconstruction neural network model to perform image reconstruction and denoising of noisy images, in accordance with some embodiments of the technology described herein. The examples of FIGS. 25A-25D are described herein in the context of MR imaging, but it should be appreciated that the examples of FIGS. 25A-25D could be applied to other medical imaging techniques as described herein.

Figure 25A:
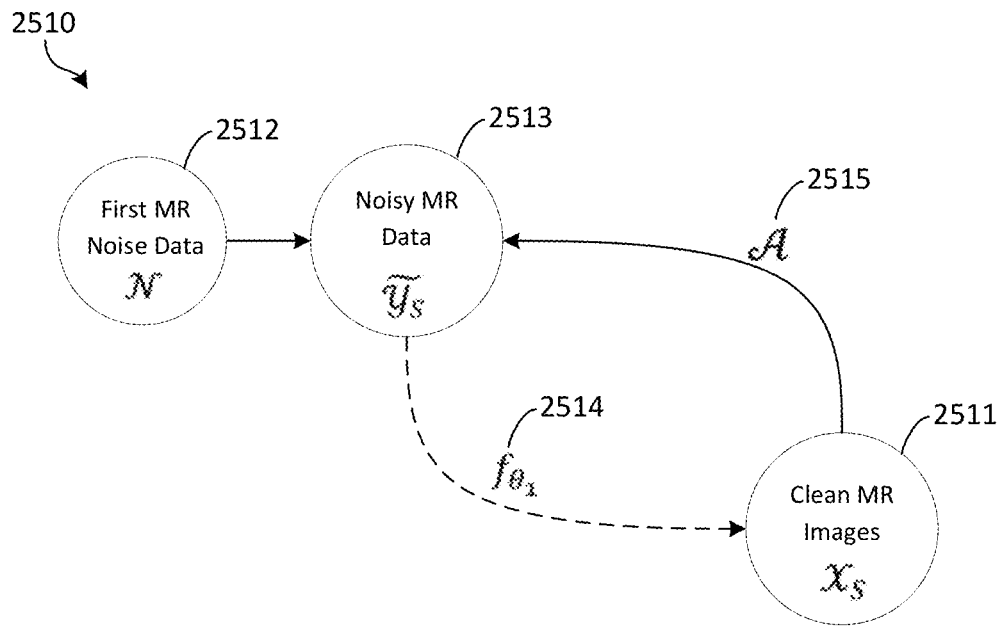
FIG. 25A is a diagram of illustrative transformations to generate first training data to train a first neural network for reconstructing and denoising MR images, in accordance with some embodiments of the technology described herein.

FIG. 25A is a diagram of an illustrative process 2510 to generate first training data to train a first neural network for reconstructing and denoising MR images, in accordance with some embodiments of the technology described herein. In process 2510, first training data is generated to train a first neural network model 2514, $f_{\theta_1}$, to reconstruct images from data in the source domain ($\tilde{y} \rightarrow X$).

In some embodiments, the first training data includes a plurality of clean MR images associated with the source domain 2511, $X_S$, and noisy MR data 2513, $\tilde{y}_S$. The plurality of clean MR images associated with the source domain 2511, $X_S$, may be obtained, for example, from publicly-available research databases (e.g., of high-field MR images) or from other clinical acquisition of MR data in the source domain (e.g., using a source type of MRI system (e.g., a high-field MRI system), imaging a source portion of anatomy (e.g., a brain, knee, neck, etc.), using a source pulse sequence to acquire the MR data, etc.).

In some embodiments, the noisy MR data 2513, $\tilde{Y}_S$, may be generated using the plurality of clean MR images associated with the source domain 2511, $X_S$, and first MR noise data associated with the target domain 2512, $\mathcal{N}$. For example, images of the plurality of clean MR images associated with the source domain 2511, $X_S$, may be transformed from the spatial frequency domain to the image domain using transformation 2515, $\mathcal{A}$. Thereafter, the transformed image data may be combined with data of the first MR noise data associated with the target domain 2512, $\mathcal{N}$, to generate the noisy MR data 2513, $\tilde{X}_S$.

In some embodiments, the first MR noise data associated with the target domain 2512, $\mathcal{N}$, may be generated in a similar manner as noise image 104 of FIGS. 1A and 1B. For example, the first MR noise data associated with the target domain 2512, $\mathcal{N}$, may be generated based on empirical measurements (e.g., by using the MRI system to measure noise within the MRI system without a patient present). As another example, the first MR noise data associated with the target domain 2512, $\mathcal{N}$, may be generated by using the MRI system to measure noise within the MRI system without a patient present and by using a same pulse sequence (e.g., a diffusion weighted imaging (DWI) pulse sequence) as used to acquire the noisy MR data for denoising. Alternatively or additionally, the first MR noise data associated with the target domain 2512, $\mathcal{N}$, may be generated by simulating noise, as described herein. In some embodiments, the first MR noise data associated with the target domain 2512, $\mathcal{N}$, may be generated prior to imaging the subject (e.g., prior to acquiring the noisy MR data 1802).

In some embodiments, after generating the noisy MR data 2513, $\tilde{Y}_S$, the first neural network model 2514, $f_{\theta_1}$, may be trained. For example, the first neural network model 2514, $f_{\theta_1}$, may be trained by providing, as input, pairs of images and corresponding data of the plurality of clean MR images associated with the source domain 2511, $X_S$, and the noisy MR data 2513, $\tilde{Y}_S$, so that the first neural network model 2514, $f_{\theta_1}$, may be trained in a supervised fashion.

Figure 25B:
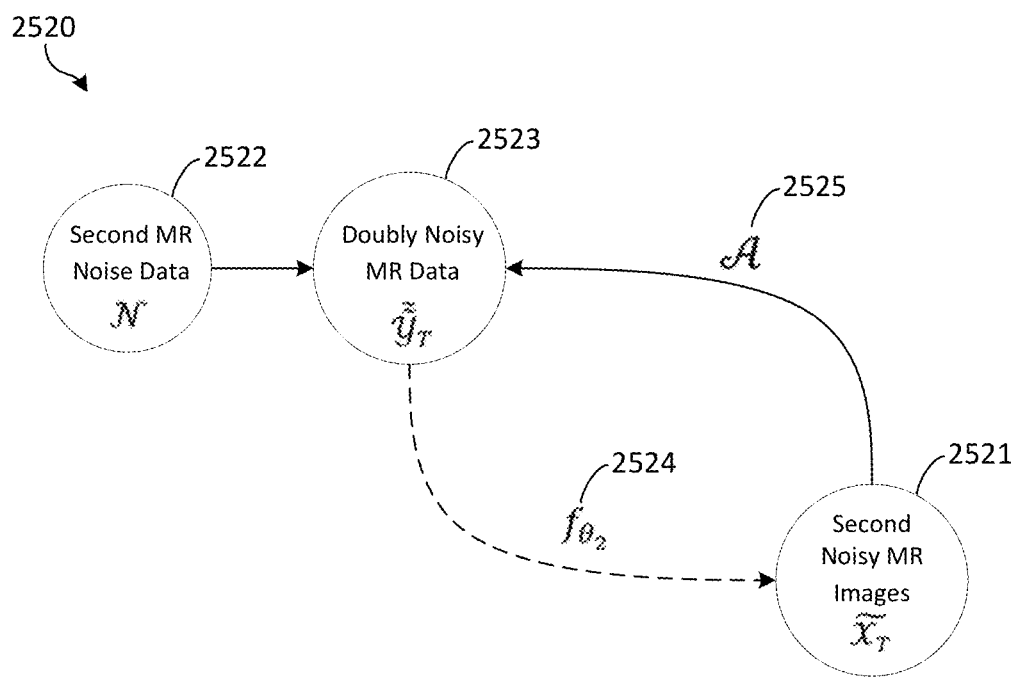
FIG. 25B is a diagram of illustrative transformations to generate second training data to train a second neural network for reconstructing and denoising MR images, in accordance with some embodiments of the technology described herein.

FIG. 25B is a diagram of an illustrative process 2520 to generate second training data to train a second neural network for reconstructing and denoising MR images, in accordance with some embodiments of the technology described herein. In process 2520, second training data is generated to train a second neural network model 2524, $f_{\theta_2}$, to reconstruct images from data in the target domain ($\tilde{\tilde{y}} \rightarrow \tilde{X}$). It should be appreciated that illustrative process 2520 is optional and may not be implemented in some embodiments.

In some embodiments, the second training data includes a plurality of second noisy MR images 2521, $\tilde{X}_T$, and doubly noisy MR data 2523, $\tilde{\tilde{y}}_T$. The plurality of second noisy MR images 2521, $\tilde{X}_T$, may be obtained, for example, by clinical acquisition of MR data in the target domain (e.g., using a target type of MRI system (e.g., a low-field MRI system), imaging a target portion of anatomy (e.g., a limb, joint, appendage, etc.), using a target pulse sequence to acquire the MR data, etc.).

In some embodiments, the doubly noisy MR data 2523, $\tilde{\tilde{y}}_T$, may be generated using the plurality of second noisy MR images 2521, $\tilde{X}_T$, and second MR noise data associated with the target domain 2522, $\mathcal{N}$. For example, images of the plurality of second noisy MR images 2521, $\tilde{X}_T$, may be transformed from the spatial frequency domain to the image domain using transformation 2525, $\mathcal{A}$. Thereafter, the transformed image data may be combined with data of the second MR noise data associated with the target domain 2522, $\mathcal{N}$, to generate the doubly noisy MR data 2523, $\tilde{\tilde{y}}_T$.

In some embodiments, the second MR noise data associated with the target domain 2522, $\mathcal{N}$, may be generated in a same manner or may be the same noise data as the first MR noise data associated with the target domain 2512, $\mathcal{N}$, of FIG. 25A. In some embodiments, the second MR noise data associated with the target domain 2522, $\mathcal{N}$, may be generated in a different manner or may comprise different data than the first MR noise data associated with the target domain 2512, $\mathcal{N}$. In some embodiments, the second MR noise data associated with the target domain 2522, $\mathcal{N}$, may be generated prior to imaging the subject (e.g., prior to acquiring the noisy MR data 1802).

In some embodiments, after generating the doubly noisy MR data 2523, $\tilde{\tilde{Y}}_T$, the second neural network model 2524, $f_{\theta_2}$, may be trained. For example, the second neural network model 2524, $f_{\theta_2}$, may be trained by providing, as input, pairs of images and corresponding data of the plurality of second noisy MR images 2521, $\tilde{X}_T$, and the doubly noisy MR data 2523, $\tilde{\tilde{Y}}_T$.

Figure 25C:
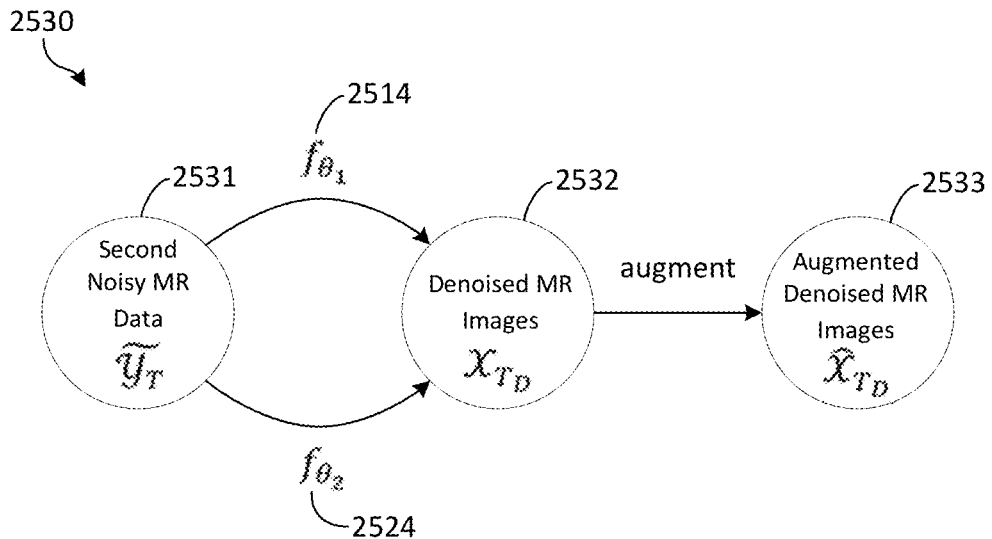
FIG. 25C is a diagram of illustrative transformations to generate clean MR training images associated with the target domain, in accordance with some embodiments of the technology described herein.

FIG. 25C is a diagram of an illustrative process 2530 to generate clean MR training images associated with the target domain, in accordance with some embodiments of the technology described herein. After the first neural network model 2514, $f_{\theta_1}$, and optionally the second neural network model 2524, $f_{\theta_2}$, are trained as described in connection with FIGS. 25A and 25B, the process 2530 applies the first neural network model 2514, $f_{\theta_1}$, and/or the second neural network model 2524, $f_{\theta_2}$, to noisy MR data associated with the target domain (e.g., to the second noisy MR data 2531, $\tilde{Y}_T$) to generate corresponding denoised MR images.

In some embodiments, generating the training data for training the reconstruction neural network model comprises applying the first neural network model 2514, $f_{\theta_1}$, to the second noisy MR data 2531, $\tilde{Y}_T$, to generate a plurality of denoised MR images 2532, $X_{T_D}$. Optionally, in some embodiments, generating the training data for training the reconstruction neural network model further comprises applying the second neural network model 2524, $f_{\theta_2}$, to second noisy MR data 2531, $\tilde{Y}_T$. In such embodiments, generating the plurality of denoised MR images 2532, $X_{T_D}$, may comprise combining the outputs of the first neural network model 2514, $f_{\theta_1}$, and of the second neural network model 2524, $f_{\theta_2}$. For example, the plurality of denoised MR images 2532, $X_{T_D}$, may be expressed as a union of the denoised MR images output by the first neural network model 2514, $f_{\theta_1}$, and the denoised MR images output by the second neural network model 2524, $f_{\theta_2}$: $X_{T_D} = f_{\theta_1}(\tilde{Y}_T) \cup f_{\theta_2}(\tilde{Y}_T)$.

In some embodiments, after generating the plurality of denoised MR images 2532, $X_{T_D}$, the process 2530 may next include transforming the plurality of denoised MR images 2532, $X_{T_D}$ to generate a plurality of augmented denoised MR images 2533, $\hat{Y}_{T_D}$, to ensure that there is a sufficient number of images in the generated training data for training the reconstruction neural network model. For example, a transformation configured to sharpen the denoised MR images 2532, $X_{T_D}$, may be applied to generate a plurality of sharpened MR images. Thereafter, the plurality of sharpened MR images may be added to the plurality of denoised MR images 2532, $X_{T_D}$, to generate the plurality of augmented denoised MR images 2533, $\hat{Y}_{T_D}$. Alternatively or additionally, transformations such as a rotation, cropping, horizontal and/or vertical flipping, and/or any other suitable augmentation may be applied to the denoised MR images 2031, $X_{T_D}$, to generate the plurality of augmented denoised MR images 2533, $\hat{Y}_{T_D}$. As another example, the brightness and/or contrast of an image may be changes to generate new images for the plurality of augmented denoised MR images 2533, $\hat{Y}_{T_D}$. Additionally, and as another example, a complex conjugate transformation may be applied to the spatial frequency data to symmetrize the matrices or replace one or more matrices with its complex conjugate transpose in the spatial frequency domain to generate new images for the plurality of augmented denoised MR images 2533, $\hat{Y}_{T_D}$. Some of these transformations may be used alone or in combination with other transformations including the ones described above and/or any other suitable transformations.

Figure 25D:
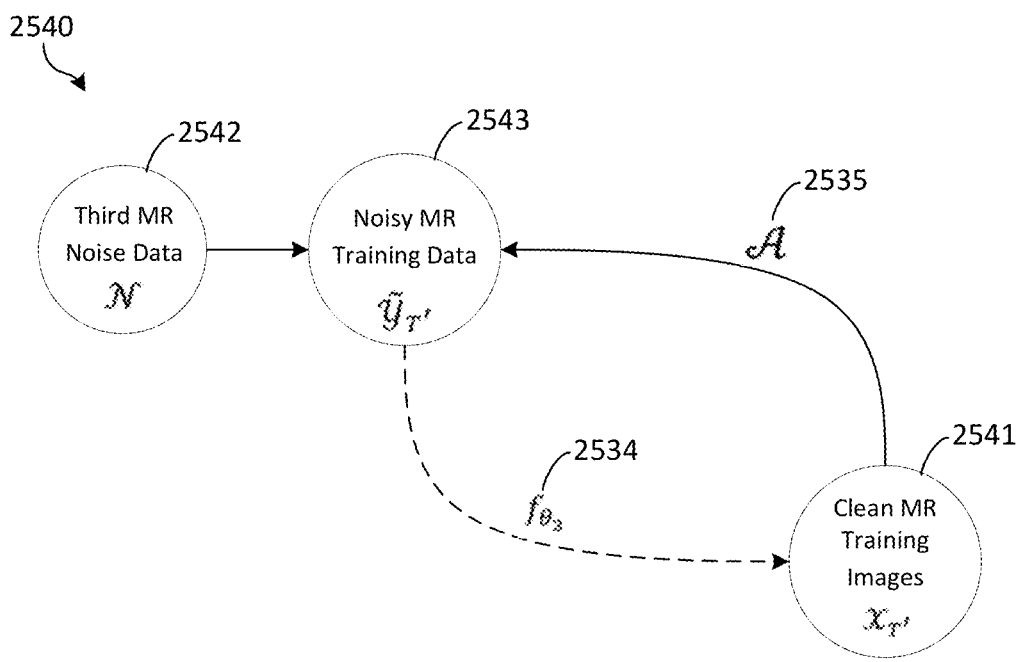
FIG. 25D is a diagram of illustrative transformations to generate training data for training the reconstruction and denoising neural network model, in accordance with some embodiments of the technology described herein.

FIG. 25D is a diagram of an illustrative process 2540 to generate training data for training the reconstruction neural network model, in accordance with some embodiments of the technology described herein. The reconstruction neural network model 2534, $f_{\theta_3}$, may be any suitable neural network model configured to perform a reconstruction and/or a denoising procedure. For example, the reconstruction neural network model 2534, $f_{\theta_3}$, may be any suitable neural network model as described in connection with FIG. 18A and/or FIGS. 26A-26E herein.

Process 2540 may begin by generating a plurality of clean MR training images 2541, $X_{T'}$, from the plurality of augmented denoised MR images 2533, $\hat{Y}_{T_D}$. For example, the plurality of augmented denoised MR images 2533, $\hat{Y}_{T_D}$, may be combined with the plurality of clean MR images associated with the source domain 2511, $X_S$, to generate the plurality of clean MR training images 2541, $X_{T'}$. In some embodiments, the plurality of augmented denoised MR images 2533, $\hat{Y}_{T_D}$, may be combined with the plurality of clean MR images associated with the source domain 2511, $X_S$, through a union of the two datasets: $X_{T'} = X_S \cup \hat{Y}_{T_D}$.

In some embodiments, the training data for training the reconstruction neural network model 2534, $f_{\theta_3}$, includes a plurality of clean MR training images 2541, $X_{T'}$, and noisy MR training data 2543, $\tilde{Y}_{T'}$. The noisy MR training data 2543, $\tilde{Y}_{T'}$, may be generated using the plurality of clean MR training images 2541, $X_{T'}$, and third MR noise data associated with the target domain 2542, $\mathcal{N}$. For example, images of the plurality of clean MR training images 2541, $X_{T'}$, may be transformed from the spatial frequency domain to the image domain using transformation 2535, $\mathcal{A}$. Thereafter, the transformed image data may be combined with data of the third MR noise data associated with the target domain 2542, $\mathcal{N}$, to generate the noisy MR training data 2543, $\tilde{Y}_{T'}$.

In some embodiments, the third MR noise data associated with the target domain 2542, $\mathcal{N}$, may be generated in a same manner or may be the same noise data as the first MR noise data associated with the target domain 2512, $\mathcal{N}$, of FIG. 25A, or in a same manner or may be the same noise data as the second MR noise data associated with the target domain 2522, $\mathcal{N}$, of FIG. 25B. In some embodiments, the third MR noise data associated with the target domain 2542, $\mathcal{N}$, may be generated in a different manner or may comprise different data than the first MR noise data associated with the target domain 2512, $\mathcal{N}$, or in a different manner or may comprise different data than the second MR noise data associated with the target domain 2522, $\mathcal{N}$. In some embodiments, the third MR noise data associated with the target domain 2542, $\mathcal{N}$, may be generated prior to imaging the subject (e.g., prior to acquiring the noisy MR data 1802).

In some embodiments, after generating the noisy MR training data 2543, $\tilde{Y}_{T'}$, the reconstruction neural network model 2534, $f_{\theta_3}$, may be trained using the training data for training the reconstruction neural network model 2534, $f_{\theta_3}$. For example, the reconstruction neural network model 2534, $f_{\theta_3}$, may be trained by providing, as input, correlated pairs of images and data of the plurality of clean MR training images 2541, $X_{T'}$, and the noisy MR training data 2543, $\tilde{Y}_{T'}$.

It should also be appreciated that while FIGS. 25A-25D are described herein as being used to train a single reconstruction neural network model to perform both image reconstruction and denoising, aspects of the technology described herein are not limited in this respect. For example, the two-stage training process of FIGS. 25A-25D may be adapted in some embodiments to train only a reconstruction neural network model to perform only image reconstruction by setting all MR noise data associated with the target domain to zero (e.g., $\mathcal{N}$=0). As another example, the two-stage training process of FIGS. 25A-25D may be adapted to sequentially train a reconstruction neural network model to perform image reconstruction and a separate denoising neural network model to perform denoising of noise images by using the two-stage training process of FIGS. 25A-25D to train the reconstruction neural network model and thereafter using the two-stage training process of FIGS. 20A-20D to train the denoising neural network model using the reconstruction neural network model as the reconstruction, $\mathcal{M}$.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

What is claimed is:

1. A method of denoising magnetic resonance (MR) images, the method comprising:
    using at least one computer hardware processor to perform:
        obtaining a noisy MR image of a subject, the noisy MR image associated with a target domain;
        denoising the noisy MR image of the subject using a denoising neural network model to obtain a denoised MR image, the denoising neural network model trained by:
            generating first training data for training a first neural network model to denoise MR images at least in part by generating a first plurality of noisy MR images using: (1) clean MR data associated with a source domain, wherein the clean MR data associated with the source domain comprises MR data that is collected using a magnetic resonance imaging (MRI) system having a main magnetic field strength of 0.5 T or greater; and (2) first MR noise data associated with the target domain;
            training the first neural network model using the first training data;
            generating training data for training the denoising neural network model at least in part by applying the first neural network model to a second plurality of noisy MR images and generating a corresponding plurality of denoised MR images, wherein the second plurality of noisy MR images is generated using second noisy MR data associated with the target domain, and wherein the second noisy MR data associated with the target domain comprises MR data that is collected using an MRI system having a main magnetic field strength greater than or equal to 20 mT and less than or equal to 0.2 T; and
            training the denoising neural network model using the training data for training the denoising neural network model; and
        outputting the denoised MR image.

2. The method of claim 1, wherein the first training data comprises the first plurality of noisy MR images and a corresponding plurality of clean MR images, and wherein generating the first training data comprises:
    generating first noisy MR data using the clean MR data associated with the source domain and the first MR noise data associated with the target domain;
    generating the first plurality of noisy MR images by applying a reconstruction procedure to the first noisy MR data; and
    generating the plurality of clean MR images by applying the reconstruction procedure to the clean MR data associated with the source domain.

3. The method of claim 1, further comprising:
    generating second training data for training a second neural network model to denoise MR images at least in part by generating a plurality of doubly noisy MR images using:
        (1) second noisy MR data associated with the target domain; and
        (2) second MR noise data associated with the target domain; and
    training the second neural network model using the second training data.

4. The method of claim 3, wherein the second training data comprises the plurality of doubly noisy MR images and the second plurality of noisy MR images, wherein generating the second training data comprises:
    generating doubly noisy MR data using the second noisy MR data associated with the target domain and the second MR noise data associated with the target domain;

generating the plurality of doubly noisy MR images by applying a reconstruction procedure to the doubly noisy MR data; and generating the second plurality of noisy MR images by applying the reconstruction procedure to the second noisy MR data associated with the target domain.

5. The method of claim 4, wherein generating the training data for training the denoising neural network model further comprises applying the second neural network model to the second plurality of noisy MR images.

6. The method of claim 1, wherein generating the training data for training the denoising neural network model further comprises:
  generating a plurality of augmented denoised MR images by:
    applying one or more transformations to images of the plurality of denoised MR images to generate a plurality of transformed MR images; and
    combining the plurality of transformed MR images with the plurality of denoised MR images to generate the plurality of augmented denoised MR images; and
  generating clean MR data associated with the target domain by applying a nonuniform transformation to images of the plurality of augmented denoised MR images.

7. The method of claim 6, wherein the training data for training the denoising neural network model comprises a plurality of noisy MR training images and a plurality of clean MR training images, wherein generating the training data for training the denoising neural network model further comprises:
  generating clean MR training data by combining the clean MR data associated with the source domain with the clean MR data associated with the target domain;
  generating noisy MR training data using the clean MR training data and third MR noise data associated with the target domain;
  generating the plurality of noisy MR training images by applying a reconstruction procedure to the noisy MR training data; and
  generating the plurality of clean MR training images by applying the reconstruction procedure to the clean MR training data associated with the target domain.

8. The method of claim 1, wherein obtaining the noisy MR image of the subject comprises:
  collecting first noisy MR data by using a magnetic resonance imaging (MRI) system to image the subject; and
  generating the noisy MR image of the subject using the collected first noisy MR data.

9. The method of claim 8, wherein the first noisy MR data was previously collected using the MRI system, and wherein obtaining the noisy MR image of the subject comprises:
  accessing the first noisy MR data; and
  generating the noisy MR image using the accessed first noisy MR data.

10. The method of claim 8, wherein the first noisy MR data is collected by the MRI system using a diffusion weighted imaging (DWI) pulse sequence.

11. The method of claim 10, wherein the first MR noise data is generated by performing an empirical measurement of noise within the MRI system while the MRI system is operated using the DWI pulse sequence.

12. The method of claim 1, wherein:
  the clean MR data associated with the source domain comprises MR data that is collected by imaging a first portion of anatomy of the subject;
  the second plurality of noisy MR images is generated using second noisy MR data associated with the target domain; and
  the second noisy MR data associated with the target domain comprises MR data that is collected by imaging a second portion of anatomy different than the first portion of anatomy of the subject.

13. The method of claim 1, wherein:
  the clean MR data associated with the source domain comprises MR data that is collected using a first pulse sequence;
  the second plurality of noisy MR images is generated using second noisy MR data associated with the target domain; and
  the second noisy MR data associated with the target domain comprises MR data that is collected using a second pulse sequence different than the first pulse sequence.

14. At least one non-transitory computer readable storage medium storing processor-executable instructions that, when executed by at least one processor, cause the at least one processor to perform a method of denoising magnetic resonance (MR) images, the method comprising:
  obtaining a noisy MR image of a subject, the noisy MR image associated with a target domain;
  denoising the noisy MR image of the subject using a denoising neural network model to obtain a denoised MR image, the denoising neural network model trained by:
    generating first training data for training a first neural network model to denoise MR images at least in part by generating a first plurality of noisy MR images using: (1) clean MR data associated with a source domain, wherein the clean MR data associated with the source domain comprises MR data that is collected using a magnetic resonance imaging (MRI) system having a main magnetic field strength of 0.5 T or greater; and (2) first MR noise data associated with the target domain;
    training the first neural network model using the first training data;
    generating training data for training the denoising neural network model at least in part by applying the first neural network model to a second plurality of noisy MR images and generating a corresponding plurality of denoised MR images, wherein the second plurality of noisy MR images is generated using second noisy MR data associated with the target domain, and wherein the second noisy MR data associated with the target domain comprises MR data that is collected using an MRI system having a main magnetic field strength greater than or equal to 20 mT and less than or equal to 0.2 T; and
    training the denoising neural network model using the training data for training the denoising neural network model; and
  outputting the denoised MR image.

15. The at least one non-transitory computer readable storage medium of claim 14, wherein the first training data comprises the first plurality of noisy MR images and a corresponding plurality of clean MR images, and wherein generating the first training data comprises:
  generating first noisy MR data using the clean MR data associated with the source domain and the first MR noise data associated with the target domain;

generating the first plurality of noisy MR images by applying a reconstruction procedure to the first noisy MR data; and generating the plurality of clean MR images by applying the reconstruction procedure to the clean MR data associated with the source domain.

16. The at least one non-transitory computer readable storage medium of claim 14, further comprising training the denoising neural network model by:

generating the first training data for training a first neural network model to denoise MR images at least in part by generating the first plurality of noisy MR images using: (1) the clean MR data associated with a source domain; and (2) the first MR noise data associated with a target domain;

training the first neural network model using the first training data;

generating the training data for training the denoising neural network model at least in part by applying the first neural network model to the second plurality of noisy MR images and generating the corresponding plurality of denoised MR images; and training the denoising neural network model using the training data for training the denoising neural network model.

17. A magnetic resonance imaging (MRI) system, comprising:

a magnetics system having a plurality of magnetics components to produce magnetic fields for performing MRI; and at least one processor configured to perform:

obtaining a noisy MR image of a subject, the noisy MR image associated with a target domain;

denoising the noisy MR image of the subject using a denoising neural network model to obtain a denoised MR image, the denoising neural network model trained by:

generating first training data for training a first neural network model to denoise MR images at least in part by generating a first plurality of noisy MR images using: (1) clean MR data associated with a source domain, wherein the clean MR data associated with the source domain comprises MR data that is collected using a magnetic resonance imaging (MRI) system having a main magnetic field strength of 0.5 T or greater; and (2) first MR noise data associated with the target domain;

training the first neural network model using the first training data;

generating training data for training the denoising neural network model at least in part by applying the first neural network model to a second plurality of noisy MR images and generating a corresponding plurality of denoised MR images, wherein the second plurality of noisy MR images is generated using second noisy MR data associated with the target domain, and wherein the second noisy MR data associated with the target domain comprises MR data that is collected using an MRI system having a main magnetic field strength greater than or equal to 20 mT and less than or equal to 0.2 T; and training the denoising neural network model using the training data for training the denoising neural network model; and outputting the denoised MR image.

* * * * *